US012334178B2

(12) United States Patent
Chung et al.

(10) Patent No.: US 12,334,178 B2
(45) Date of Patent: Jun. 17, 2025

(54) INTEGRATED CIRCUIT, SYSTEM AND METHOD OF FORMING THE SAME

(71) Applicant: TAIWAN SEMICONDUCTOR MANUFACTURING COMPANY, LTD., Hsinchu (TW)

(72) Inventors: Yen Lin Chung, Hsinchu (TW); Kao-Cheng Lin, Hsinchu (TW); Wei Min Chan, Hsinchu (TW); Yen-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 102 days.

(21) Appl. No.: 18/330,049

(22) Filed: Jun. 6, 2023

(65) Prior Publication Data

US 2024/0257840 A1     Aug. 1, 2024

Related U.S. Application Data

(60) Provisional application No. 63/481,909, filed on Jan. 27, 2023.

(51) Int. Cl.
| | | |
|---|---|---|
| *G11C 5/06* | (2006.01) | |
| *H01L 23/522* | (2006.01) | |
| *H01L 23/528* | (2006.01) | |
| *H10B 10/00* | (2023.01) | |
| *G11C 11/419* | (2006.01) | |

(52) U.S. Cl.
CPC .......... *G11C 5/063* (2013.01); *H01L 23/5226* (2013.01); *H01L 23/5283* (2013.01); *H10B 10/125* (2023.02); *G11C 11/419* (2013.01)

(58) Field of Classification Search
CPC ..... G11C 5/063; G11C 11/419; G11C 11/412; H01L 23/5226; H01L 23/5283; H10B 10/125; H10B 10/12; H10D 89/10
USPC ....................................................... 365/63
See application file for complete search history.

(56) References Cited

U.S. PATENT DOCUMENTS

| | | | |
|---|---|---|---|
| 2004/0018725 | A1 | 1/2004 | Cho et al. |
| 2004/0252548 | A1 | 12/2004 | Tsukamoto et al. |
| 2008/0111174 | A1* | 5/2008 | Baars .................... H10B 12/09 438/243 |
| 2009/0091970 | A1 | 4/2009 | Nii |
| 2022/0336474 | A1 | 10/2022 | Liaw |

(Continued)

FOREIGN PATENT DOCUMENTS

| | | |
|---|---|---|
| TW | 202238591 | 10/2022 |
| WO | 2015019411 | 2/2015 |

*Primary Examiner* — Fernando Hidalgo
(74) *Attorney, Agent, or Firm* — Hauptman Ham, LLP

(57) ABSTRACT

A memory cell includes a first, second, third, and fourth transistor, a first and a second inverter, and a first and second word line. The first inverter is coupled to the first and third transistor. The second inverter is coupled to the first inverter and the first and third transistor. The first word line is configured to supply a first word line signal, is on a first metal layer above a front-side of a substrate, and is coupled to the first and third transistor. The second word line is configured to supply a second word line signal, and is on a second metal layer below a back-side of the substrate opposite from the front-side of the substrate, and is coupled to the second and fourth transistor. At least the first, second, third or fourth transistor are on the front-side of the substrate.

20 Claims, 28 Drawing Sheets

(56) References Cited

U.S. PATENT DOCUMENTS

2023/0354570 A1\* 11/2023 Hwang .................. H10D 89/10
2025/0014995 A1\* 1/2025 Lee ...................... H10D 62/121

\* cited by examiner

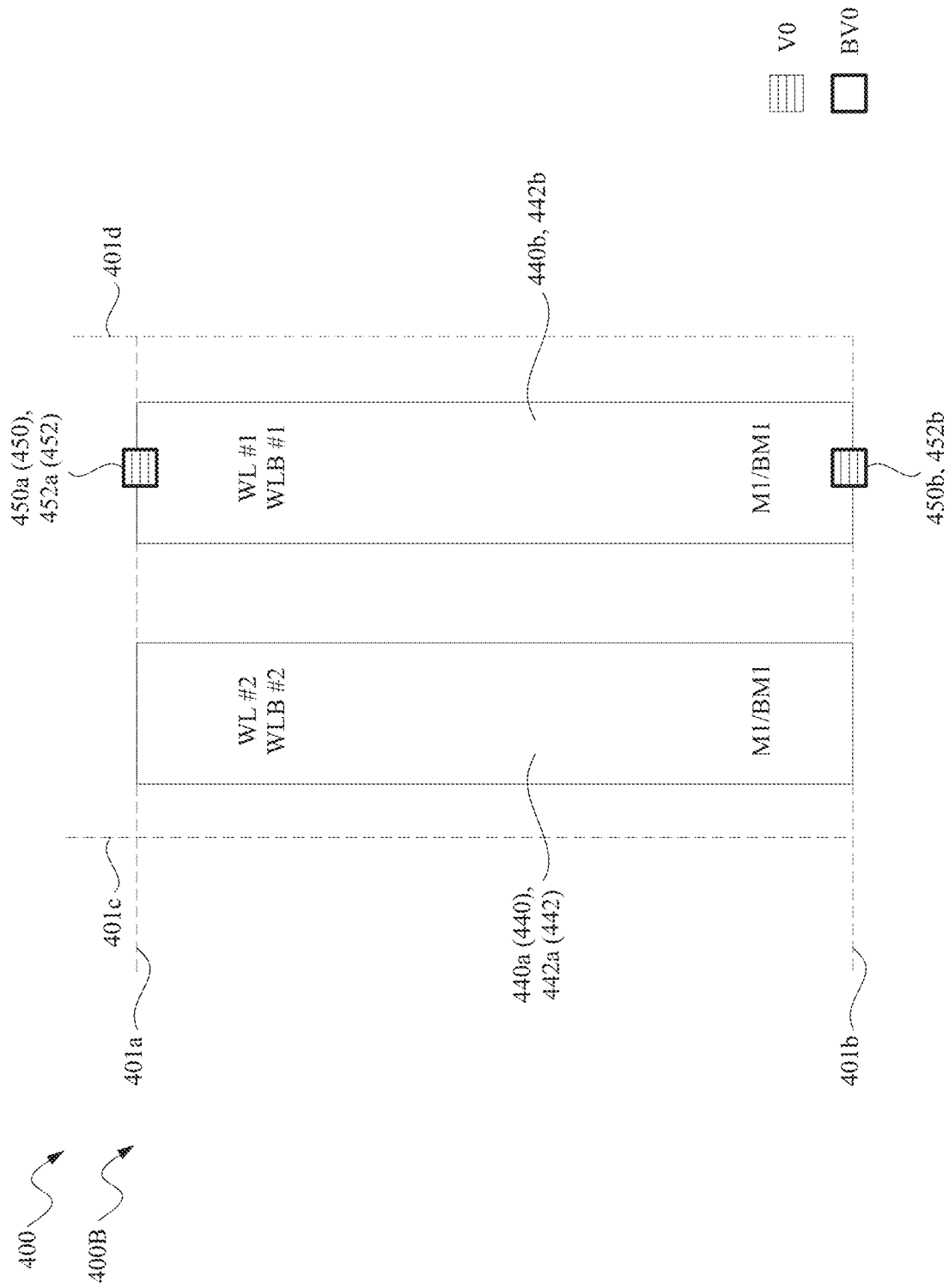

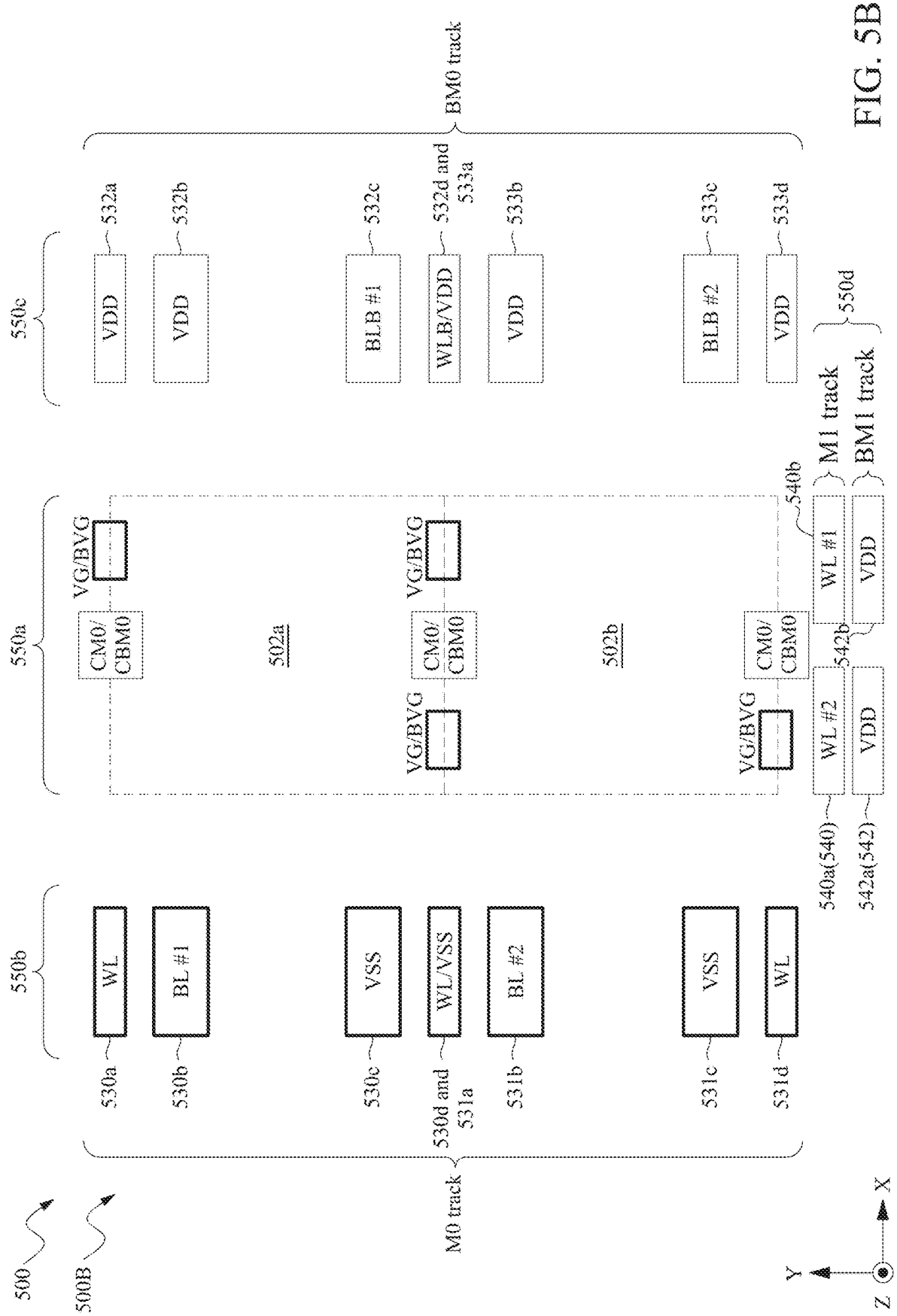

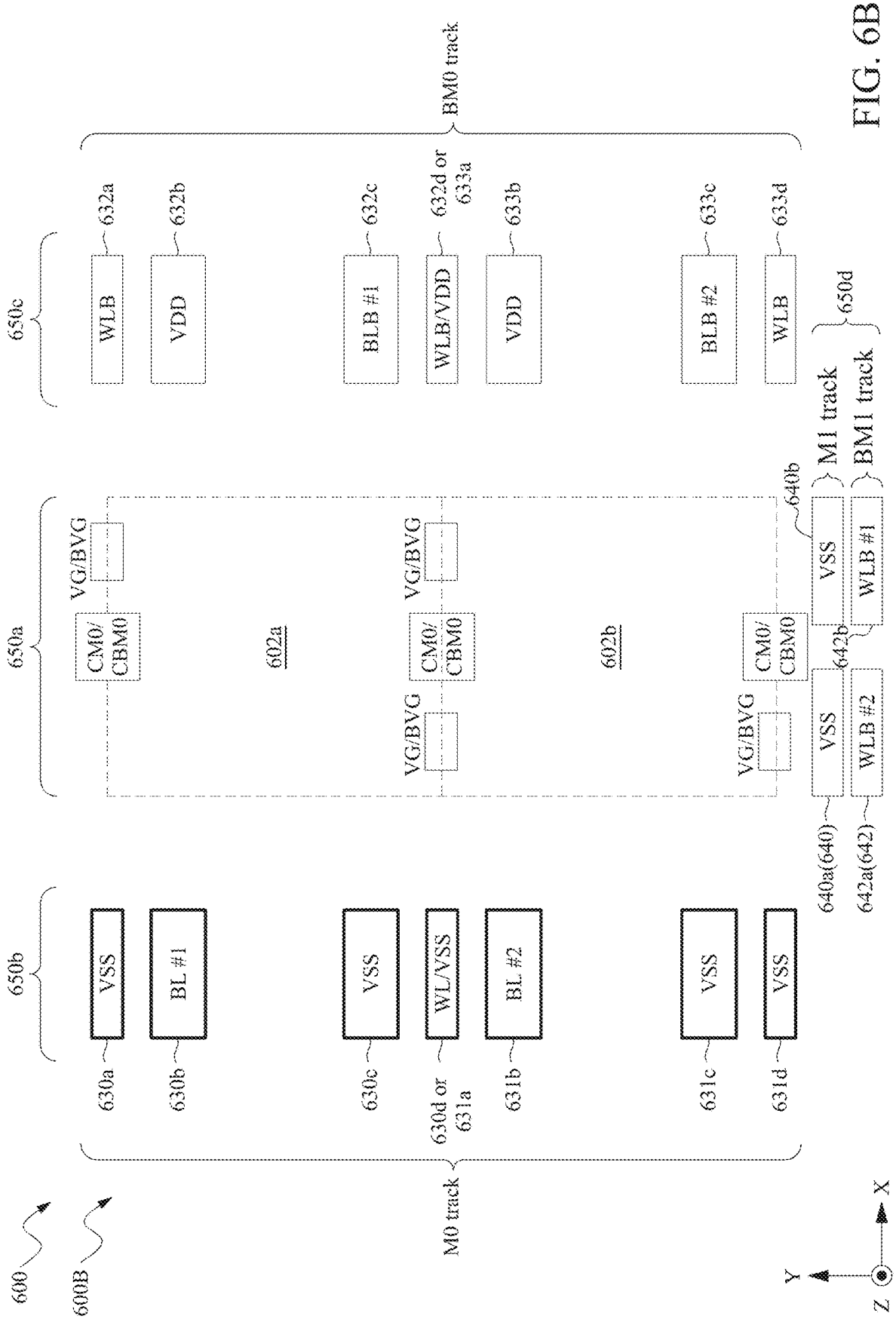

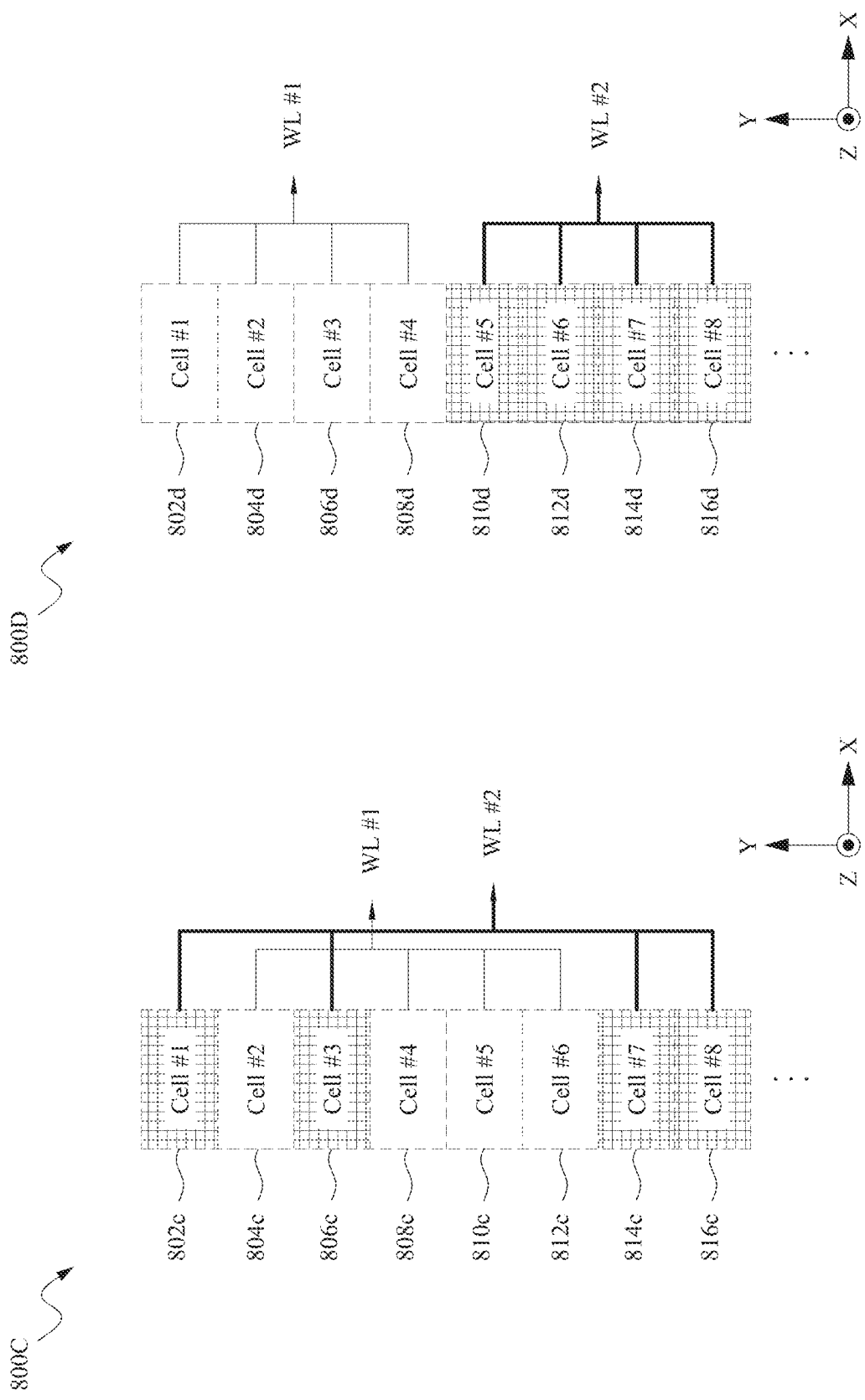

ered. Other components,
INTEGRATED CIRCUIT, SYSTEM AND METHOD OF FORMING THE SAME

PRIORITY CLAIM

This application claims the benefit of U.S. Provisional Application No. 63/481,909, filed Jan. 27, 2023, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices is also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4I are diagrams of an integrated circuit, in accordance with some embodiments.

FIGS. 5A-5C are corresponding diagrams of corresponding portions of an integrated circuit 500, simplified for ease of illustration.

FIGS. 6A-6B are diagrams of an integrated circuit, in accordance with some embodiments.

FIGS. 8A-8D are corresponding diagrams of corresponding integrated circuit, in accordance with some embodiments.

DETAILED DESCRIPTION

Figure 1:
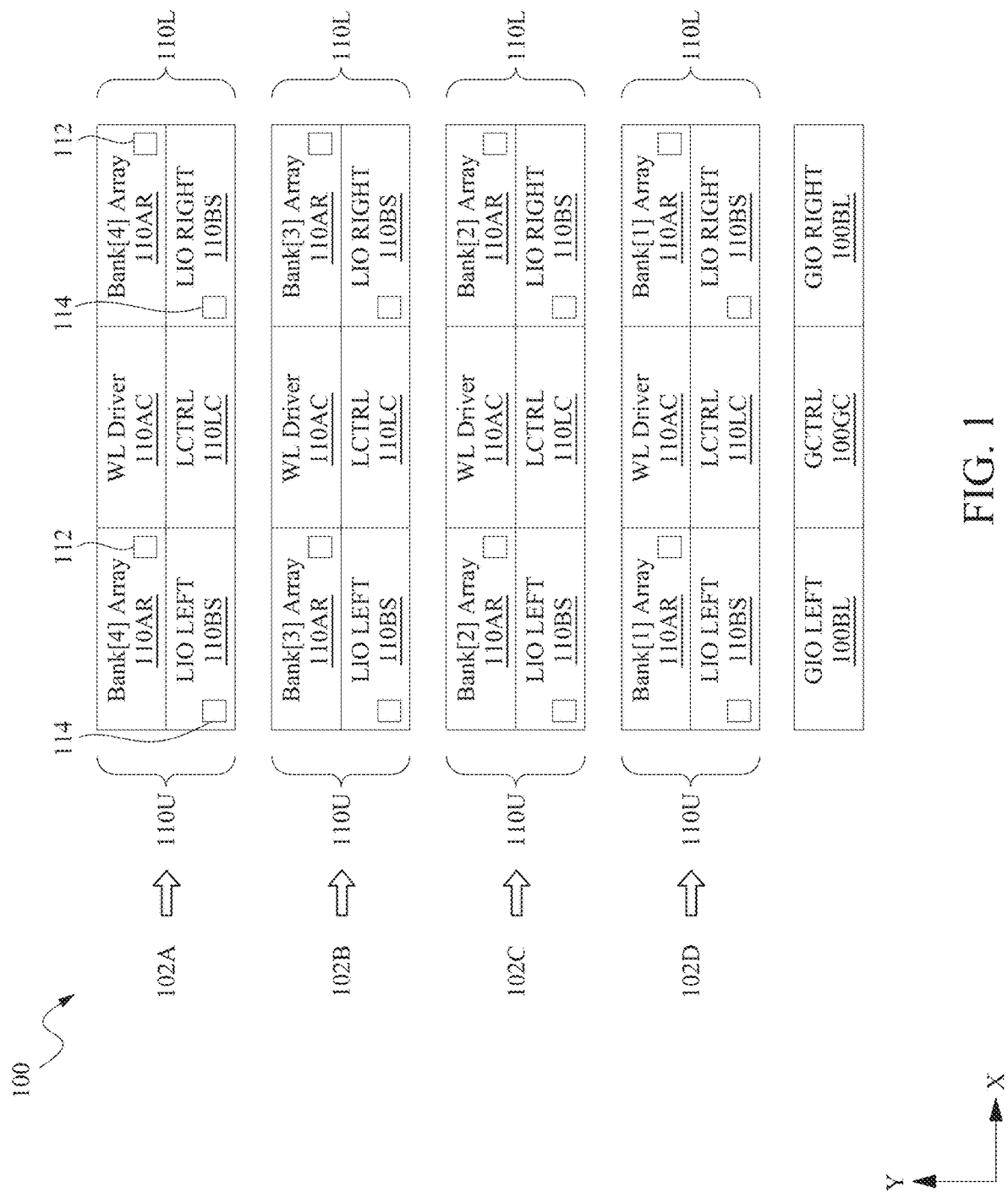
FIG. 1 is a block diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory cell includes a first transistor of a first type. In some embodiments, the first transistor is configured as a first pass-gate transistor.

In some embodiments, the memory cell further includes a second transistor of a second type different from the first type. In some embodiments, the second transistor is positioned below the first transistor.

In some embodiments, the memory cell further includes a third transistor of the first type. In some embodiments, the third transistor is configured as a second pass-gate transistor.

In some embodiments, the memory cell further includes a fourth transistor of the second type.

In some embodiments, the fourth transistor is positioned below the third transistor.

In some embodiments, at least the first transistor, the second transistor, the third transistor or the fourth transistor are on a front-side of a substrate.

In some embodiments, the memory cell further includes a first inverter coupled to the first transistor and the third transistor.

In some embodiments, the memory cell further includes a second inverter coupled to the first transistor, the third transistor and the first inverter.

In some embodiments, the memory cell further includes a first word line extending in a first direction. In some embodiments, the first word line is configured to supply a first word line signal. In some embodiments, the first word line is on a first metal layer above the front-side of the substrate. In some embodiments, the first word line is coupled to the first transistor and the third transistor.

In some embodiments, the memory cell further includes a second word line extending in the first direction. In some embodiments, the second word line is on a second metal layer different from the first metal layer. In some embodiments, the second metal layer is below a back-side of the substrate opposite from the front-side of the substrate. In some embodiments, the second word line is coupled to the second transistor and the fourth transistor.

In some embodiments, the first word line is configured to supply a first word line signal from the front-side of the substrate. In some embodiments, the second word line is configured to supply a second word line signal from the back-side of the substrate.

In some embodiments, by configuring the first word line to supply the first word line signal from the front-side of the substrate, the configuring the second word line to supply the second word line signal from the back-side of the substrate causes the memory cell to have reduced resistance capacitance (RC) loading compared to other approaches thereby causing the memory cell to have increased speed and reduced power consumption than other approaches.

FIG. 1 is a block diagram of a memory circuit 100, in accordance with some embodiments.

FIG. 1 is simplified for the purpose of illustration. In some embodiments, memory circuit 100 includes various elements in addition to those depicted in FIG. 1 or is otherwise arranged to perform the operations discussed below.

Memory circuit 100 is an IC that includes memory partitions 102A-102D, a global control circuit 100GC and global input output (GIO) circuits 100BL.

Each memory partition 102A-102D includes memory banks 110U and 110L adjacent to a word line (WL) driver circuit 110AC and a local control circuit 110LC. Each memory bank 110U and 110L includes a memory cell array 110AR and a local input output (LIO) circuit 110BS.

A memory partition, e.g., a memory partition 102A-102D, is a portion of memory circuit 100 that includes a subset of memory devices (not shown in FIG. 1) and adjacent circuits configured to selectively access the subset of memory devices in program and read operations. In the FIG. 1 embodiment, memory circuit 100 includes a total of four partitions. In some embodiments, memory circuit 100 includes a total number of partitions greater or fewer than four.

GIO circuit 100BL is configured to control access to one or more electrical paths, e.g., bit lines, to each memory device of the corresponding memory bank 110U or 110L of each memory partition 102A-102D, e.g., by generating one or more bit line signals. In some embodiments, GIO circuit 100BL includes a global bit line driver circuit. In some embodiments, GIO circuit 100BL is coupled to each memory bank 110U and 110L by a corresponding global bit line (not shown).

Global control circuit 100GC is configured to control some or all of program and read operations on each memory partition 102A-102D, e.g., by generating and/or outputting one or more control and/or enable signals.

In some embodiments, global control circuit 100GC includes one or more analog circuits configured to interface with memory partitions 102A-102D, cause data to be programmed in one or more memory devices, and/or use data received from one or more memory devices in one or more circuit operations. In some embodiments, global control circuit 100GC includes one or more global address decoder or pre-decoder circuits configured to output one or more address signals to the WL driver circuit 110AC of each memory partition 102A-102D.

Each WL driver circuit 110AC is configured to generate word line signals on corresponding word lines WL. In some embodiments, each WL driver circuit 110AC is configured to output word line signals on corresponding word lines WL to the adjacent memory banks 110U and 110L of the corresponding memory partition 102A-102D.

Each local control circuit 110LC is an electronic circuit configured to receive one or more address signals. Each local control circuit 110LC is configured to generate signals corresponding to adjacent subsets of memory devices identified by the one or more address signals. In some embodiments, the adjacent subsets of memory devices correspond to columns of memory devices. In some embodiments, each local control circuit 110LC is configured to generate each signal as a complementary pair of signals. In some embodiments, each local control circuit 110LC is configured to output the signals to corresponding word line driver circuits within the adjacent WL driver circuit 110AC of the corresponding memory partition 102A-102D. In some embodiments, the local control circuit 110LC includes a bank decoder circuit.

Each LIO circuit 110BS is configured to selectively access one or more bit lines (shown in FIGS. 2A-2B) coupled to adjacent subsets of memory devices of the corresponding memory cell array 110AR responsive to GIO circuit 100BL, e.g., based on one or more BL control signals. In some embodiments, the adjacent subsets of memory devices correspond to rows of memory devices. In some embodiments, the LIO circuit 110BS includes a bit line selection circuit.

Each LIO circuit 110BS includes one or more circuits 114. For case of illustration, circuit 114 is not shown in memory bank 110U and 110L of memory partitions 102B, 102C and 102D. In some embodiments, each circuit 114 includes at least a sense amplifier circuit. In some embodiments, during a read operation, the sense amplifier circuit is configured to read data from at least one memory cell 112 in a corresponding column of memory cells in the corresponding memory cell array 110AR, in accordance with some embodiments. In some embodiments, each circuit 114 in LIO circuit 110BS is coupled to a corresponding column of memory devices 112 in memory cell array 110AR.

Each memory bank 110U and 110L includes the corresponding memory cell array 110AR including memory cells or memory devices 112 configured to be accessed in program and read operations by the adjacent LIO circuit 110BS and the adjacent WL driver circuit 110AC.

Each memory cell array 110AR includes an array of memory devices 112 having N rows and M columns, where M and N are positive integers. The rows of cells in memory cell array 102 are arranged in a first direction X. The columns of cells in memory cell array 102 are arranged in a second direction Y. The second direction Y is different from the first direction X. In some embodiments, the second direction Y is perpendicular to the first direction X. In some embodiments, each memory cell array 110AR is divided into an upper region and a lower region (not shown). In some embodiments, each column of memory devices 112 in memory cell array 110AR is coupled to a corresponding circuit 114 in LIO circuit 110BS.

Memory device 112 is shown in memory bank 110U and 110L of memory partition 102A. For case of illustration, memory device 112 is not shown in memory bank 110U and 110L of memory partitions 102B, 102C and 102D.

Memory device 112 is an electrical, electromechanical, electromagnetic, or other device configured to store bit data represented by logical states. At least one logical state of memory device 112 is capable of being programmed in a write operation and detected in a read operation. In some embodiments, a logical state corresponds to a voltage level of an electrical charge stored in a given memory device 112. In some embodiments, a logical state corresponds to a physical property, e.g., a voltage, a current, a resistance or a magnetic orientation, of a component of a given memory device 112.

In some embodiments, memory device 112 includes one or more single port (SP) static random access memory (SRAM) cells. In some embodiments, memory device 112 includes one or more dual port (DP) SRAM cells. In some embodiments, memory device 112 includes one or more multi-port SRAM cells. Different types of memory cells in memory device 112 are within the contemplated scope of the present disclosure. In some embodiments, memory device 112 includes one or more dynamic random access memory (DRAM) cells. In some embodiments, memory device 112 includes one or more one-time programmable (OTP) memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, memory device 112 is an OTP memory device including one or more OTP memory cells.

Other configurations of memory circuit 100 are within the scope of the present disclosure.

Figures 2A, 2B:
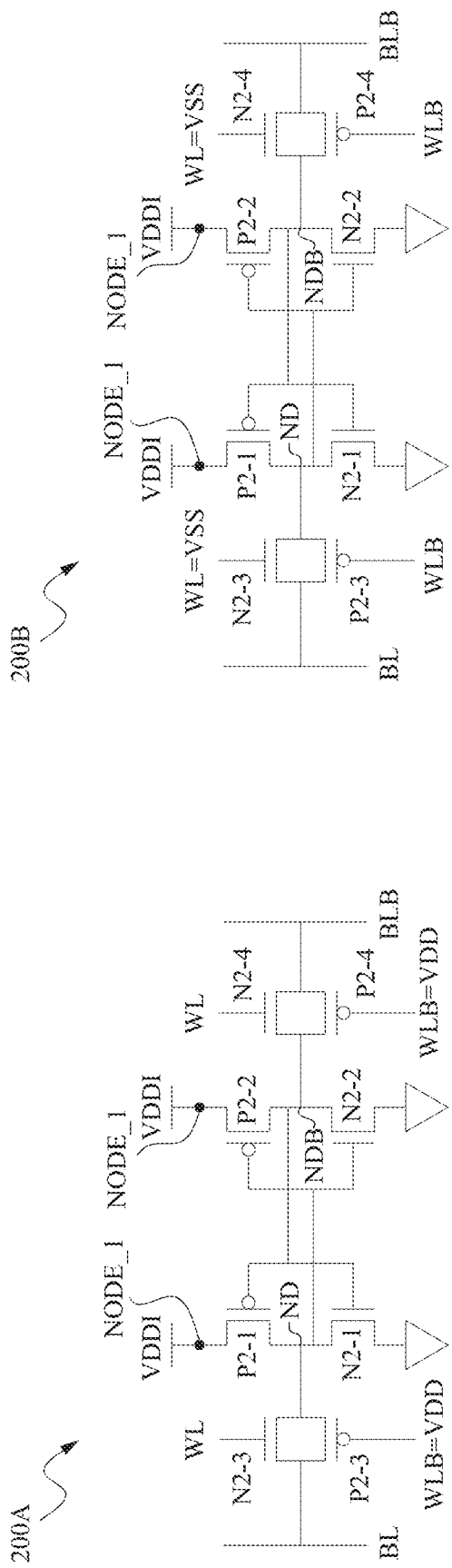
FIGS. 2A-2B are corresponding circuit diagrams of corresponding memory cells usable in FIG. 1, in accordance with some embodiments.

FIGS. 2A-2B are corresponding circuit diagrams of corresponding memory cells 200A and 200B usable in FIG. 1, in accordance with some embodiments.

FIG. 2A is a circuit diagram of a memory cell 200A usable in FIG. 1, in accordance with some embodiments.

At least one of memory cell 200A or 200B is usable as one or more memory cells MCB in at least one of memory cell array 110AR of FIG. 1 or memory device 112 of FIG. 1.

At least one of memory cell 200A or 200B is an eight transistor (8T) single port (SP) SRAM memory cell used for illustration. In some embodiments, at least one of memory cell 200A or 200B employs a number of transistors other than eight. Other types of memory are within the scope of various embodiments.

Memory cell 200A comprises four PMOS transistors P2-1, P2-2, P2-3 and P2-4, and four NMOS transistors N2-1, N2-2, N2-3, and N2-4. Transistors P2-1, P2-2, N2-1, and N2-2 form a cross latch or a pair of cross-coupled inverters. For example, PMOS transistor P2-1 and NMOS transistor N2-1 form a first inverter while PMOS transistor P2-2 and NMOS transistor N2-2 form a second inverter.

A source terminal of each of PMOS transistors P2-1 and P2-2 is configured as a voltage supply node NODE_1. Each voltage supply node NODE_1 is coupled to a first voltage supply VDDI.

Each of a drain terminal of PMOS transistor P2-1, a drain terminal of NMOS transistor N2-1, a gate terminal of PMOS transistor P2-2, a gate terminal of NMOS transistor N2-2, and a source terminal of NMOS transistor N2-3, and a source terminal of PMOS transistor P2-3 are coupled together, and are configured as a storage node ND.

Each of a drain terminal of PMOS transistor P2-2, a drain terminal of NMOS transistor N2-2, a gate terminal of PMOS transistor P2-1, a gate terminal of NMOS transistor N2-1, a source terminal of NMOS transistor N2-4, and a source terminal of PMOS transistor P2-4 are coupled together, and are configured as a storage node NDB.

A source terminal of each of NMOS transistors N2-1 and N2-2 is configured as a supply reference voltage node (not labelled) having a supply reference voltage VSS. The source terminal of each of NMOS transistors N2-1 and N2-2 is also coupled to reference voltage supply VSS.

A word line WL is coupled with a gate terminal of each of NMOS transistors N2-3 and N2-4. Word line WL is also called a write control line because NMOS transistors N2-3 and N2-4 are configured to be controlled by a signal on word line WL in order to transfer data between bit lines BL, BLB and corresponding nodes ND, NDB.

A word line bar WLB is coupled with a gate terminal of each of PMOS transistors P2-3 and P2-4. Word line bar WLB is also called a write control line because PMOS transistors P2-3 and P2-4 are configured to be controlled by a signal on word line bar WLB in order to transfer data between bit lines BL, BLB and corresponding nodes ND, NDB.

In some embodiments, the signal of the word line bar WLB is equal to a voltage supply VDD. In some embodiments, when the signal of the word line bar WLB is equal to the voltage supply VDD, the PMOS transistors P2-3 and P2-4 are turned off.

A drain terminal of NMOS transistor N2-3 is coupled to a bit line BL. A drain terminal of NMOS transistor N2-4 is coupled to a bit line BLB. A drain terminal of PMOS transistor P2-3 is coupled to the bit line BL. A drain terminal of PMOS transistor P2-4 is coupled to the bit line BLB.

Bit lines BL and BLB are configured as both data input and output for memory cell 200A-200B. In some embodiments, in a write operation, applying a logical value to a bit line BL and the opposite logical value to the other bit line BLB enables writing the logical values on the bit lines to memory cell 200A-200B. Each of bit lines BL and BLB is called a data line because the data carried on bit lines BL and BLB are written to and read from corresponding nodes ND and NDB.

Other configurations of memory cell 200A are within the scope of the present disclosure.

FIG. 2B is a circuit diagram of a memory cell 200B usable in FIG. 1, in accordance with some embodiments.

Memory cell 200B is a variation of memory cell 200A of FIG. 2A, and similar detailed description is therefore omitted. In comparison with memory cell 200A of FIG. 2A, the signal of the word line WL in FIG. 2B is equal to the reference voltage supply VSS, and similar detailed description is therefore omitted.

In some embodiments, when the signal of the word line WL is equal to the reference voltage supply VSS, the NMOS transistors N2-3 and N2-4 are turned off.

Other configurations of memory cell 200B are within the scope of the present disclosure.

FIGS. 3A-3D are corresponding diagrams of corresponding portions 300A-300D of a layout design 300, of a corresponding integrated circuit, in accordance with some embodiments.

Layout design 300 is a layout of an integrated circuit 400 of FIGS. 4A-4I or memory cell 200A or 200B. Layout design 300 is a layout of memory cell 200A of FIG. 2A or 200B of FIG. 2B.

Portion 300A includes one or more features of layout design 300 of an active level or an oxide diffusion (OD) level, a gate (POLY) level, a metal over diffusion (MD) level, a backside metal over diffusion (BMD) level, a metal 0 (M0) level, a backside metal 0 (BM0), a via over gate (VG) level, a backside via over gate (BVG) level, a via over diffusion (VD) level, and a backside via over diffusion (BVD) level.

Portion 300B includes one or more features of layout design 300 of a metal 1 (M1) level, a backside metal 1 (BM1) level, a via over M0 (V0) level and a via on backside M0 (BV0) level.

Portion 300C and portion 300D include one or more features of layout design 300 of the OD level, the POLY level, the MD level, the M0 level, the VG level, the VD level, the BMD level, the BM0 level, the BVG level, and the BVD level.

FIGS. 3A-3D are corresponding diagrams of corresponding portions 300A-300D of layout design 300, simplified for ease of illustration.

For ease of illustration, some of the labeled elements of one or more of FIGS. 1-8D are not labelled in one or more of FIGS. 1-8D. In some embodiments, layout design 300 includes additional elements not shown in FIGS. 3A-3D.

Layout design 300 includes one or more features of the OD level, the POLY level, the MD level, the M0 level, the VG level, the VD level, the M1 level, the V0 level, the BMD level, the BM0 level, the BVG level, the BVD level, the BM1 level and the BV0 level. In some embodiments, at least layout design 300, or integrated circuit 400, 500, 600, 700, 800A, 800B, 800C or 800D includes additional elements not shown in FIG. 3A-3D, 4A-4I, 5A-5C, 6A-6B, 7A-7B or 8A-8D.

Layout design 300 is usable to manufacture integrated circuit 400 of FIGS. 4A-4I.

Figure 4A:
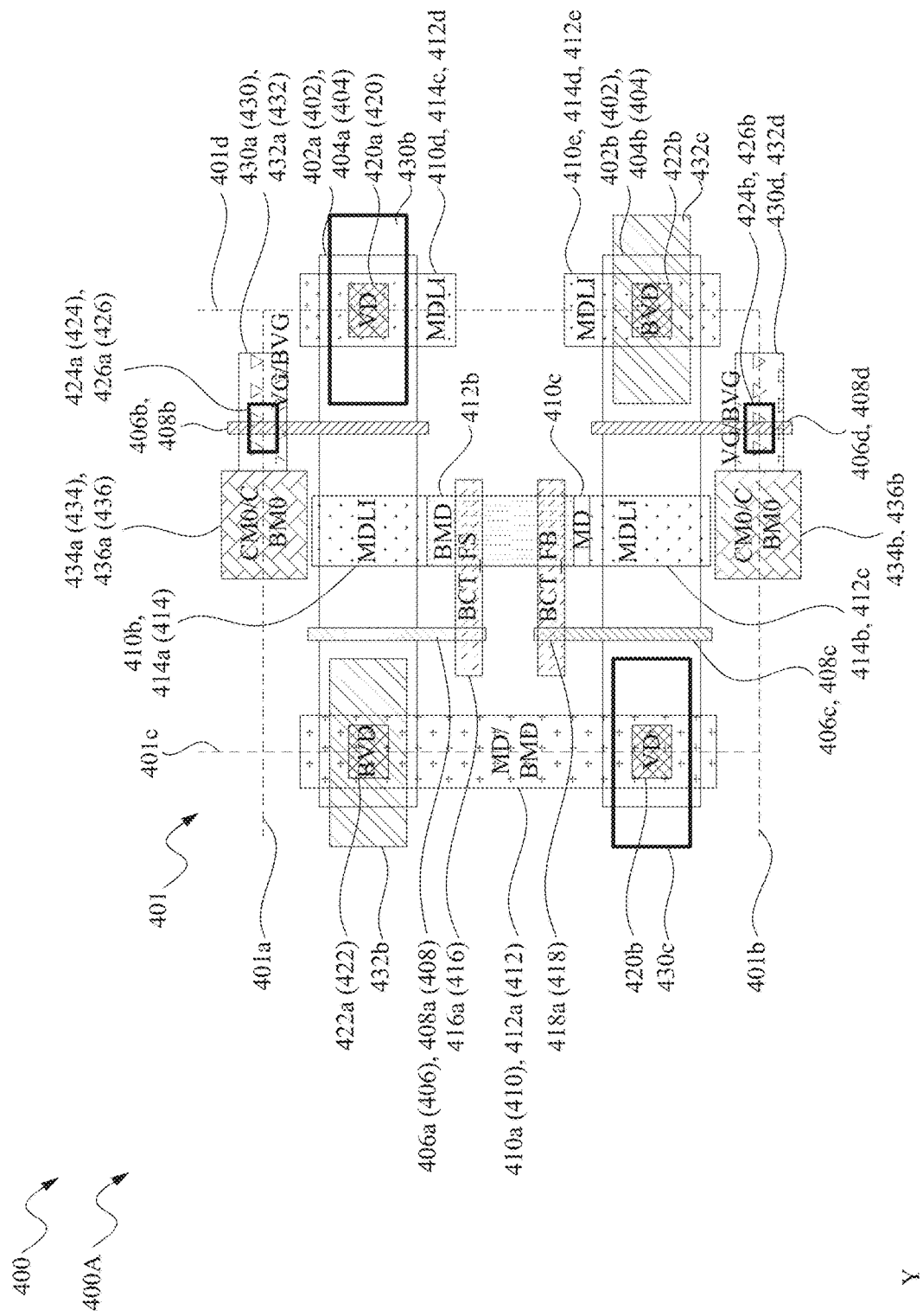

Portion 300A is a layout of portion 400A of integrated circuit 400 of FIG. 4A, portion 300B is a layout of portion 400B of integrated circuit 400 of FIG. 4A, portion 300C is a layout of portion 400C of integrated circuit 400 of FIG. 4A, and portion 300D is a layout of portion 400D of integrated circuit 400 of FIG. 4A, and similar detailed description is omitted for brevity.

Layout design 300 includes a cell 301. The cell 301 has cell boundaries 301a and 301b that extend in a first direction X, and cell boundaries 301c and 301d that extend in a second direction Y. In some embodiments, at least one of the first direction X, the second direction Y or a third direction Z is different from another of the first direction X, the second direction Y or the third direction Z. In some embodiments, layout design 300 abuts other cell layout designs (not shown) along cell boundaries 301c and 301d. In some embodiments, layout design 300 abuts other cell layout designs (not shown) along cell boundaries 301a and 301b that extend in the first direction X. In some embodiments, layout design 300 is a single height standard cell. In some embodiments, cell 301 is useable to manufacture a cell 401.

In some embodiments, cell 301 is a standard cell, and layout design 300 corresponds to a layout of a standard cell defined by cell boundaries 301a, 301b, 301c and 301d. In some embodiments, a cell 301 is a predefined portion of layout design 300 including one or more transistors and electrical connections configured to perform one or more circuit functions. In some embodiments, cell 301 is bounded by cell boundaries 301a, 301b, 301c and 301d, and thus corresponds to a region of functional circuit components or devices that are part of a standard cell. In some embodiments, layout design 300 is a layout design of a memory cell, such as memory cell 200A of FIG. 2A or 200B of FIG. 2B.

Layout design 300 includes one or more active region layout patterns 302a or 302b (collectively referred to as a "set of active region patterns 302") or one or more active region layout patterns 304a or 304b (collectively referred to as a "set of active region patterns 304") extending in the first direction X.

Embodiments of the present disclosure use the term "layout pattern" which is hereinafter also referred to as "patterns" in the remainder of the present disclosure for brevity.

The set of active region patterns 302 is above the set of active region patterns 304.

Active region patterns 302a and 302b of the set of active region patterns 302 are separated from one another in the second direction Y. Active region patterns 304a and 304b of the set of active region patterns 304 are separated from one another in the second direction Y.

Active region patterns 302a and 304a are separated from one another in a third direction Z. Active region patterns 302b and 304b are separated from one another in the third direction Z.

The set of active region patterns 302 is usable to manufacture a corresponding set of active regions 402 of integrated circuit 100, 300, 400, 500, 600, 700, 800A, 800B, 800C or 800D. The set of active region patterns 304 is usable to manufacture a corresponding set of active regions 404 of integrated circuit 100, 300, 400, 500, 600, 700, 800A, 800B, 800C or 800D.

In some embodiments, at least one of the set of active regions 402 or 404 are located on the front-side 403a of integrated circuit 100, 300, 400, 500, 600, 700, 800A, 800B, 800C or 800D. In some embodiments, at least one of the set of active regions 402 or 404 corresponds to source and drain regions of one or more complementary FET (CFET) transistors. In some embodiments, at least one of the set of active regions 402 or 404 correspond to source and drain regions of one or more nanosheet transistors or nanowire transistors. Other transistor types are within the scope of the present disclosure. In some embodiments, at least one of the set of active regions 402 or 404 corresponds to source and drain regions of one or more finFET transistors.

In some embodiments, active region patterns 302a, 302b are usable to manufacture corresponding active regions 402a, 402b of the set of active regions 402 of integrated circuit 100, 300, 400, 500, 600, 700, 800A, 800B, 800C or 800D. In some embodiments, active region patterns 304a, 304b are usable to manufacture corresponding active regions 404a, 404b of the set of active regions 404 of integrated circuit 100, 300, 400, 500, 600, 700, 800A, 800B, 800C or 800D.

In some embodiments, the set of active region patterns 302 and 304 are referred to as an oxide diffusion (OD) region which defines the source or drain diffusion regions of at least integrated circuit 100, 300, 400, 500, 600, 700, 800A, 800B, 800C or 800D or layout design 300.

In some embodiments, active region patterns 302a and 302b are usable to manufacture source and drain regions of NMOS transistors of integrated circuits 100, 300, 400, 500, 600, 700, 800A, 800B, 800C or 800D, and active region patterns 304a and 304b are usable to manufacture source and drain regions of PMOS transistors of integrated circuits 100, 300, 400, 500, 600, 700, 800A, 800B, 800C or 800D.

In some embodiments, active region patterns 302a and 302b are usable to manufacture source and drain regions of PMOS transistors of integrated circuits 100, 300, 400, 500, 600, 700, 800A, 800B, 800C or 800D, and active region patterns 304a and 304b are usable to manufacture source and drain regions of NMOS transistors of integrated circuits 100, 300, 400, 500, 600, 700, 800A, 800B, 800C or 800D.

In some embodiments, the set of active region patterns 302 or 304 is located on a first layout level. In some embodiments, the first layout level corresponds to an active level or an OD level of one or more of layout design 300 or integrated circuits 100, 300, 400, 500, 600, 700, 800A, 800B, 800C or 800D. In some embodiments, the OD level is above the BM0 and the BM1 level.

Other configurations, arrangements on other layout levels or quantities of patterns in the set of active region patterns 302 or 304 are within the scope of the present disclosure.

Layout design 300 further includes one or more gate patterns 306a, 306b, 306c or 306d (collectively referred to as a "set of gate patterns 306"), one or more gate patterns 308a, 308b, 308c or 308d (collectively referred to as a "set of gate patterns 308") extending in the second direction Y. The set of gate patterns 306 is above the set of gate patterns 308.

Gate patterns 306a and 306c are separated from one another in the second direction Y. Gate patterns 308a and 308c are separated from one another in the second direction Y.

Gate patterns 306b and 306d are separated from one another in the second direction Y. Gate patterns 308b and 308d are separated from one another in the second direction Y.

Gate patterns 306a and 306b are separated from one another in the first direction X. Gate patterns 308a and 308b are separated from one another in the first direction X.

Gate patterns 306c and 306d are separated from one another in the first direction X. Gate patterns 308c and 308d are separated from one another in the first direction X.

In some embodiments, gate patterns 306b and 308b are separated from one another in the third direction Z. In some embodiments, gate patterns 306d and 308d are separated from one another in the third direction Z.

The set of gate patterns 306 is usable to manufacture a corresponding set of gates 406 of integrated circuit 100, 300, 400, 500, 600, 700, 800A, 800B, 800C or 800D. The set of gate patterns 308 is usable to manufacture a corresponding set of gates 408 of integrated circuit 100, 300, 400, 500, 600, 700, 800A, 800B, 800C or 800D.

In some embodiments, gate patterns 306a, 306b, 306c or 306d are usable to manufacture corresponding gates 406a, 406b, 406c or 406d of the set of gates 406 of integrated circuit 100, 300, 400, 500, 600, 700, 800A, 800B, 800C or 800D. In some embodiments, gate patterns 308a, 308b, 308c or 308d are usable to manufacture corresponding gates 408a, 408b, 408c or 408d of the set of gates 408 of integrated circuit 100, 300, 400, 500, 600, 700, 800A, 800B, 800C or 800D.

In some embodiments, at least one of the set of gates 406 or 408 are located on the front-side 403a of integrated circuit 100, 300, 400, 500, 600, 700, 800A, 800B, 800C or 800D.

Figure 3A:
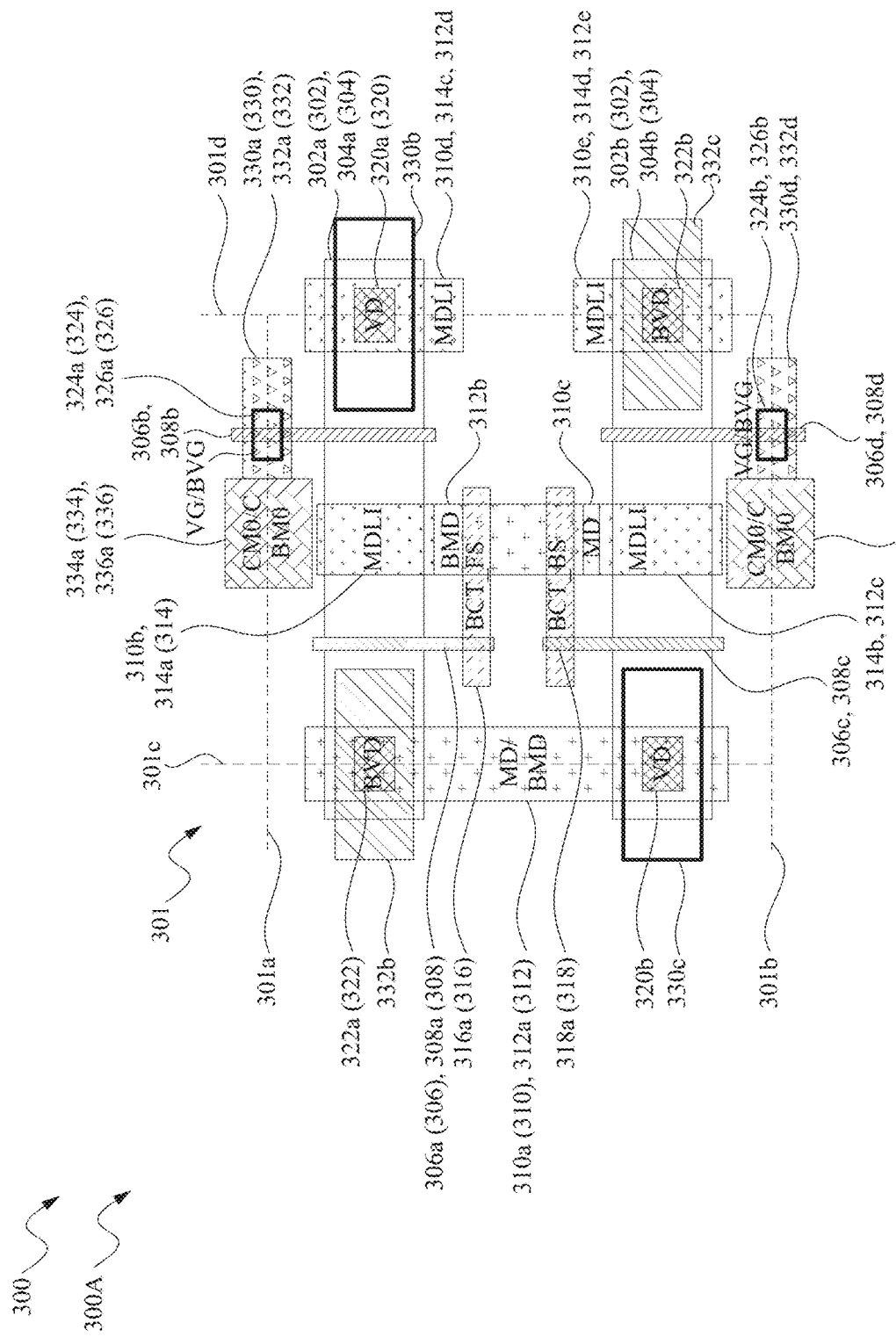
FIGS. 3A-3D are corresponding diagrams of corresponding portions of a layout design, of a corresponding integrated circuit, in accordance with some embodiments.
Figure 3B:
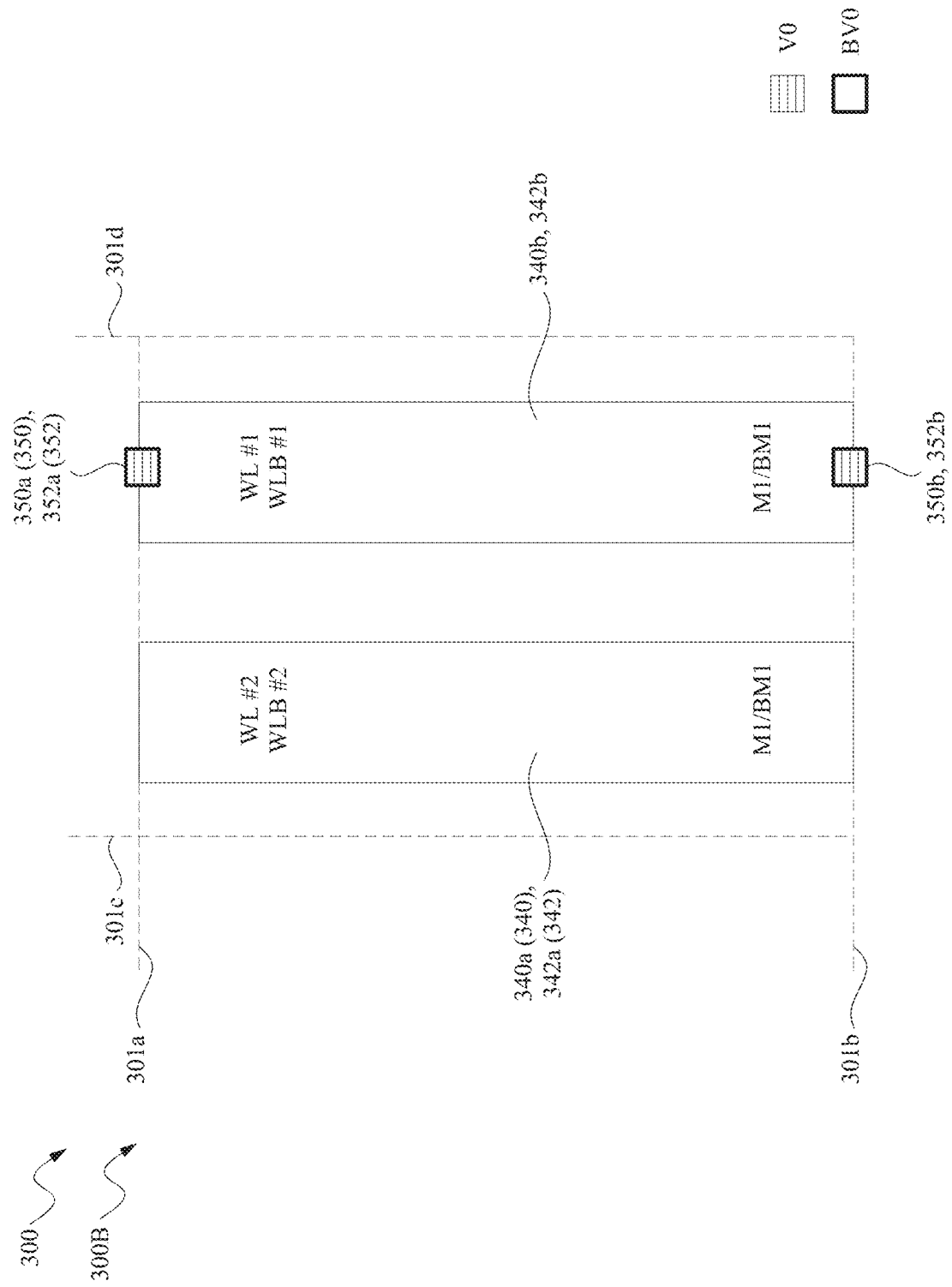
Figure 3C:
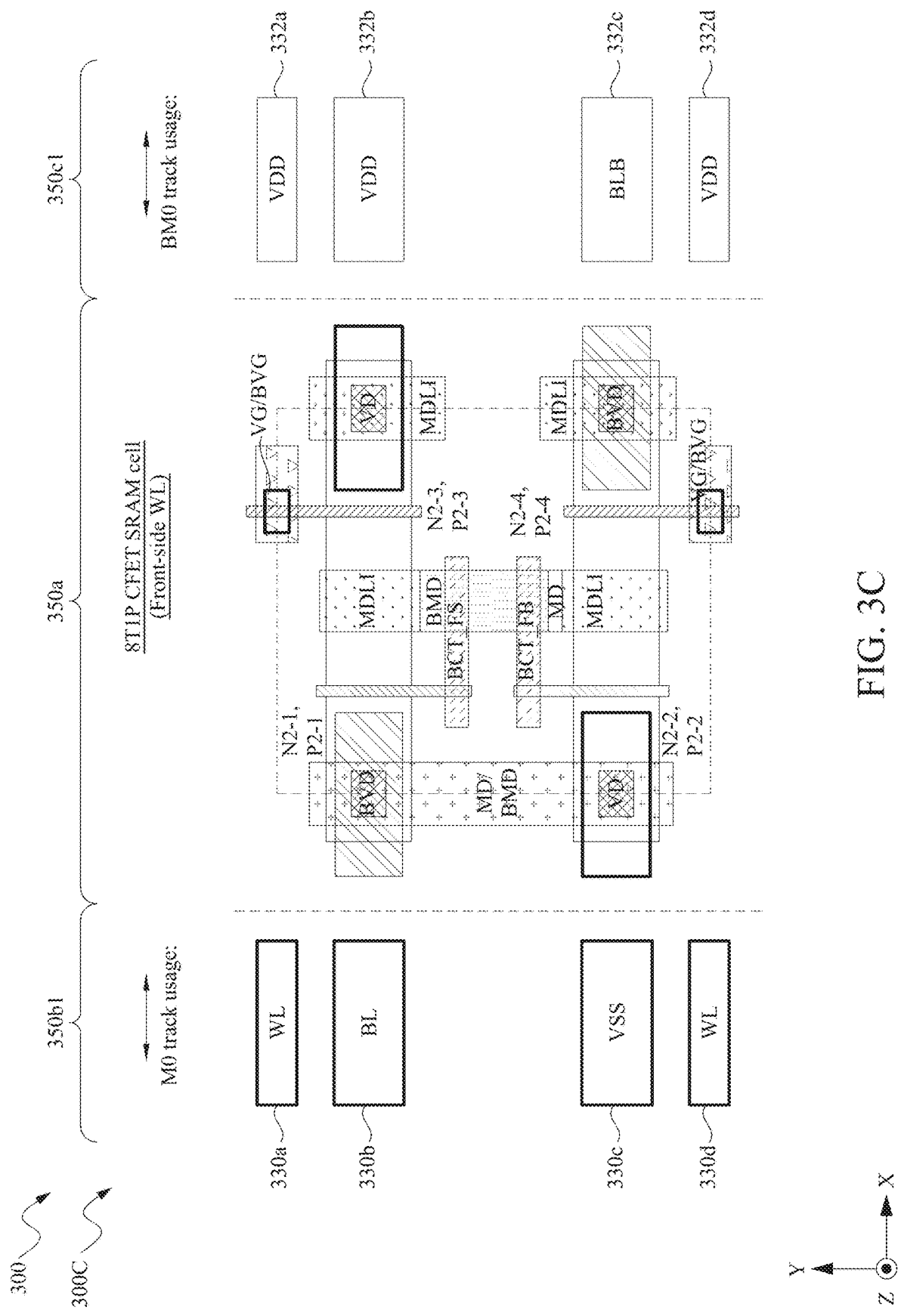
Figure 3D:
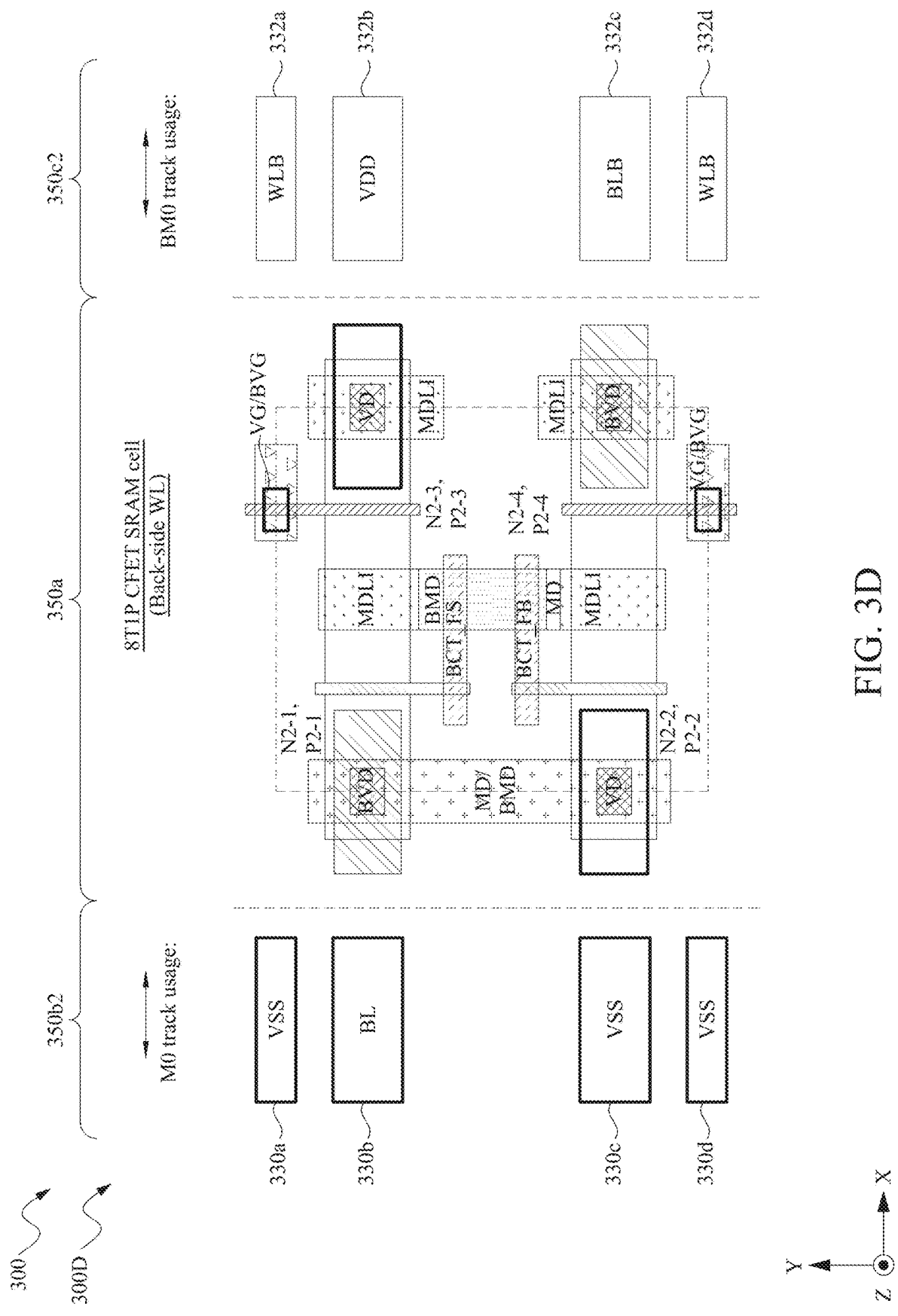

In some embodiments, each of the gate patterns in the set of gate patterns 304 and 306 is shown in FIGS. 3C-3D with labels "N2-1, P2-1, N2-2, P2-2, N2-3, P2-3, N2-4, P2-4" that identify corresponding transistors of FIGS. 2A-2B manufactured by the corresponding gate pattern in FIGS. 3A-3D, and are omitted for brevity.

In some embodiments, the set of gate patterns 306 or 308 encapsulate the set of active region patterns 302 and 304. In some embodiments, a portion of the set of gate patterns 306 or 308 is above the set of active region patterns 302 and 304. In some embodiments, another portion of the set of gate patterns 306 or 308 is below the set of active region patterns 302 and 304.

The set of gate patterns 306 or 308 is positioned on a second layout level. In some embodiments, the second layout level is different from the first layout level. In some embodiments, the second layout level corresponds to the POLY level of one or more of layout design 300 or integrated circuits 100, 300, 400, 500, 600, 700, 800A, 800B, 800C or 800D. In some embodiments, the POLY level is above the BMD, the BM0 and the BM1 level.

Other configurations, arrangements on other layout levels or quantities of patterns in the set of gate patterns 306 or 308 are within the scope of the present disclosure.

Layout design 300 further includes one or more contact patterns 310a, 310b, 310c, 310d, 310e (collectively referred to as a "set of contact patterns 310") extending in the second direction Y.

Each of the contact patterns of the set of contact patterns 310 is separated from an adjacent contact pattern of the set of contact patterns 310 in at least the first direction X or the second direction Y.

The set of contact patterns 310 is usable to manufacture a corresponding set of contacts 410 of integrated circuit 100, 300, 400, 500, 600, 700, 800A, 800B, 800C or 800D.

In some embodiments, contact pattern 310a, 310b, 310c, 310d, 310e of the set of contact patterns 310 is usable to manufacture corresponding contact 410a, 410b, 410c, 410d, 410e of the set of contact patterns 410. In some embodiments, the set of contact patterns 310 is also referred to as a set of metal over diffusion (MD) patterns.

In some embodiments, at least one of contact pattern 310a, 310b, 310c, 310d, 310e of the set of contact patterns 310 is usable to manufacture source or drain terminals of one of the NMOS or PMOS transistors of integrated circuit 100, 300, 400, 500, 600, 700, 800A, 800B, 800C or 800D.

In some embodiments, the set of contact patterns 310 overlap the set of active region patterns 302 or 304. The set of contact patterns 310 is located on a third layout level. In some embodiments, the third layout level corresponds to the contact level or an MD level of one or more of layout design 300 or integrated circuits 100, 300, 400, 500, 600, 700, 800A, 800B, 800C or 800D. In some embodiments, the third layout level is different from at least one of the first layout level or the second layout level. Other configurations, arrangements on other layout levels or quantities of patterns in the set of contact patterns 310 are within the scope of the present disclosure.

Layout design 300 further includes one or more contact patterns 312a, 312b, 312c, 312d, 312e (collectively referred to as a "set of contact patterns 312") extending in the second direction Y.

Each of the contact patterns of the set of contact patterns 312 is separated from an adjacent contact pattern of the set of contact patterns 312 in at least the first direction X or the second direction Y.

The set of contact patterns 310 and 312 are separated from one another in the third direction Z. In some embodiments, contact patterns 310a and 312a are separated from one another in the third direction Z. In some embodiments, contact patterns 310b and 312b are separated from one another in the third direction Z. In some embodiments, contact patterns 310c and 312c are separated from one another in the third direction Z. In some embodiments, contact patterns 310d and 312d are separated from one another in the third direction Z. In some embodiments, contact patterns 310e and 312e are separated from one another in the third direction Z.

The set of contact patterns 312 is usable to manufacture a corresponding set of contacts 412 of integrated circuit 100, 300, 400, 500, 600, 700, 800A, 800B, 800C or 800D.

In some embodiments, contact pattern 312a, 312b, 312c, 312d, 312e of the set of contact patterns 312 is usable to manufacture corresponding contact 412a, 412b, 412c, 412d, 412e of the set of contacts 412. In some embodiments, the set of contacts 412 are on a back-side 403b of integrated circuit 400. In some embodiments, the back-side 403b of integrated circuit 400 is opposite from the front-side of integrated circuit 400. In some embodiments, the set of contacts patterns 312 is also referred to as a set of back-side MD (BMD) patterns.

In some embodiments, at least one of contact pattern 312a, 312b, 312c, 312d, 312e of the set of contact patterns 312 is usable to manufacture source or drain terminals of one of the NMOS or PMOS transistors of integrated circuit 100, 300, 400, 500, 600, 700, 800A, 800B, 800C or 800D.

In some embodiments, the set of contact patterns 312 are overlapped by the set of active region patterns 302 or 304. The set of contact patterns 312 is located on a fourth layout level. In some embodiments, the fourth layout level corresponds to the back-side contact level or a back-side MD (BMD) level of one or more of layout design 300 or integrated circuits 100, 300, 400, 500, 600, 700, 800A, 800B, 800C or 800D. In some embodiments, the fourth layout level is different from at least one of the first layout level, the second layout level or the third layout level.

In some embodiments, the BMD level is above the BM0 and the BM1 level. In some embodiments, the BMD level is below the back-side 403b of integrated circuit 400. In some embodiments, the BMD level is below the OD level, the POLY level, the MD level, the M0 level, and the M1 level.

Other configurations, arrangements on other layout levels or quantities of patterns in the set of contact patterns 312 are within the scope of the present disclosure.

Layout design 300 further includes one or more contact patterns 314a, 314b, 314c, 314d (collectively referred to as a "set of contact patterns 314") extending in the second direction Y.

Each of the contact patterns of the set of contact patterns 314 is separated from an adjacent contact pattern of the set of contact patterns 314 in at least the first direction X or the second direction Y.

In some embodiments, the set of contact patterns 314 is between the set of contact patterns 310 and 312. Contact pattern 314a is between contact patterns 310b and 312b. Contact pattern 314b is between contact patterns 310c and 312c. Contact pattern 314c is between contact patterns 310d and 312d. Contact pattern 314d is between contact patterns 310e and 312c.

In some embodiments, contact patterns 314a, 310b and 312b are part of a same continuous pattern. In some embodiments, contact patterns 314b, 310c and 312c are part of a same continuous pattern. In some embodiments, contact patterns 314c, 310d and 312d are part of a same continuous pattern. In some embodiments, contact patterns 314d, 310e and 312e are part of a same continuous pattern.

In some embodiments, contact patterns 314a, 310b and 312b are separate discontinuous patterns. In some embodiments, contact patterns 314b, 310c and 312c are separate discontinuous patterns. In some embodiments, contact patterns 314c, 310d and 312d are separate discontinuous patterns. In some embodiments, contact patterns 314d. 310e and 312e are separate discontinuous patterns.

Contact patterns 310a and 314b are separated from one another in the second direction Y. Contact patterns 310c and 314d are separated from one another in the second direction Y.

Contact patterns 310a and 314c are separated from one another in the first direction X. Contact patterns 310b and 314d are separated from one another in the first direction X.

The set of contact patterns 314 is usable to manufacture a corresponding set of contacts 414 of integrated circuit 100, 300, 400, 500, 600, 700, 800A, 800B, 800C or 800D.

In some embodiments, contact pattern 314a, 314b, 314c, 314d of the set of contact patterns 314 is usable to manufacture corresponding contact 414a, 414b, 414c, 414d of the set of contacts 414. In some embodiments, the set of contacts 414 are on a front-side 403a of integrated circuit 400. In some embodiments, the set of contacts patterns 314 is also referred to as a set of local interconnect (MDLI) patterns.

In some embodiments, at least one of contact pattern 314a, 314b, 314c, 314d of the set of contact patterns 314 is usable to manufacture interconnect structures usable to connect source or drain terminals of one of the NMOS or PMOS transistors of integrated circuit 100, 300, 400, 500, 600, 700, 800A, 800B, 800C or 800D.

In some embodiments, the set of contact patterns 314 are overlapped by one or more of the set of active region patterns 302 or 304, the set of contact patterns 310 or the set of contact patterns 312. The set of contact patterns 314 is located on a fifth layout level. In some embodiments, the fifth layout level corresponds to the MDLI level of one or more of layout design 300 or integrated circuits 100. 300, 400, 500, 600, 700, 800A, 800B, 800C or 800D. In some embodiments, the fifth layout level is different from at least one of the first layout level, the second layout level or the fourth layout level.

In some embodiments, the MDLI level is between the MD level and the BMD level. In some embodiments, the MDLI level is below the OD level, the POLY level, the MD level, the M0 level, and the M1 level. In some embodiments, the MDLI level is above the BMD level, the BM0 level, and the BM1 level.

Other configurations, arrangements on other layout levels or quantities of patterns in the set of contact patterns 314 are within the scope of the present disclosure.

Layout design 300 further includes one or more contact patterns 316a (collectively referred to as a "set of contact patterns 316") extending in the first direction X.

Each of the contact patterns of the set of contact patterns 316 is separated from an adjacent contact pattern of the set of contact patterns 316 in at least the first direction X or the second direction Y.

The set of contact patterns 316 is usable to manufacture a corresponding set of contacts 416 of integrated circuit 100, 300, 400, 500, 600, 700, 800A, 800B, 800C or 800D.

In some embodiments, contact pattern 316a of the set of contact patterns 316 is usable to manufacture corresponding contact 416a of the set of contacts 416. The set of contacts 416 is on the front-side 403a of integrated circuit 400. Contact 416a is on the front-side 403a of integrated circuit 400. In some embodiments, the set of contacts patterns 316 is also referred to as a set of butted contacts (BCT) patterns. In some embodiments, the set of contacts 416 is also referred to as a set of butted contacts (BCT).

In some embodiments, at least one of contact pattern 316a of the set of contact patterns 316 is usable to manufacture interconnect structures usable to connect at least a gate terminal of one of the NMOS or PMOS transistors of integrated circuit 100, 300, 400, 500, 600, 700, 800A, 800B, 800C or 800D to source or drain terminals of another of the NMOS or PMOS transistors of integrated circuit 100, 300, 400, 500, 600, 700, 800A, 800B, 800C or 800D.

In some embodiments, the set of contact patterns 316 overlap one or more of the set of active region patterns 302, the set of active region patterns 304, the set of gate patterns 306 or the set of gate patterns 308. The set of contact patterns 316 is located on the third layout level. In some embodiments, the set of contact patterns 316 is on a same level as the set of contact patterns 310.

Other configurations, arrangements on other layout levels or quantities of patterns in the set of contact patterns 316 are within the scope of the present disclosure.

Layout design 300 further includes one or more contact patterns 318a (collectively referred to as a "set of contact patterns 318") extending in the first direction X.

Each of the contact patterns of the set of contact patterns 318 is separated from an adjacent contact pattern of the set of contact patterns 318 in at least the first direction X or the second direction Y.

The set of contact patterns 318 is separated from the set of contact patterns 316 in the second direction Y. Contact patterns 318a and 316a are separated from one another in the second direction Y.

The set of contact patterns 318 is usable to manufacture a corresponding set of contacts 418 of integrated circuit 100, 300, 400, 500, 600, 700, 800A, 800B, 800C or 800D.

In some embodiments, contact pattern 318a of the set of contact patterns 318 is usable to manufacture corresponding contact 418a of the set of contacts 418. The set of contacts 418 is on the back-side 403b of integrated circuit 400. Contact 418a is on the back-side 403b of integrated circuit 400. In some embodiments, the set of contacts patterns 318 is also referred to as a set of butted contacts (BCT) patterns. In some embodiments, the set of contacts 418 is also referred to as a set of butted contacts (BCT).

In some embodiments, at least one of contact pattern 318a of the set of contact patterns 318 is usable to manufacture interconnect structures usable to connect at least a gate terminal of one of the NMOS or PMOS transistors of integrated circuit 100, 300, 400, 500, 600, 700, 800A, 800B, 800C or 800D to source or drain terminals of another of the NMOS or PMOS transistors of integrated circuit 100, 300, 400, 500, 600, 700, 800A, 800B, 800C or 800D.

In some embodiments, the set of contact patterns 318 are overlapped by one or more of the set of active region patterns 302, the set of active region patterns 304, the set of gate patterns 306 or the set of gate patterns 308. The set of contact patterns 318 is located on the fourth layout level. In some embodiments, the set of contact patterns 318 is on a same level as the set of contact patterns 312.

Other configurations, arrangements on other layout levels or quantities of patterns in the set of contact patterns 318 are within the scope of the present disclosure.

Layout design 300 further includes one or more conductive feature patterns 330a, 330b, 330c, 330d (collectively referred to as a "set of conductive feature patterns 330") extending in the first direction X.

Each conductive feature pattern in the set of conductive feature patterns 330 is separated from another conductive feature pattern in the set of conductive feature patterns 330 in the second direction Y.

The set of conductive feature patterns 330 overlap at least one of the set of active region patterns 302 or 304, the set of gate patterns 306 or 308 or the set of contact patterns 310, 312, 314, 316 or 318.

The set of conductive feature patterns 330 is usable to manufacture a corresponding set of conductors 430 of integrated circuit 100, 300, 400, 500, 600, 700, 800A, 800B, 800C or 800D. Conductive feature patterns 330a, 330b, 330c, 330d are usable to manufacture corresponding conductors 430a, 430b, 430c, 430d of integrated circuit 100, 300, 400, 500, 600, 700, 800A, 800B, 800C or 800D. In some embodiments, at least one conductor of the set of conductors 430 is located on the front-side 403a of integrated circuit 100, 300, 400, 500, 600, 700, 800A, 800B, 800C or 800D.

In some embodiments, the set of conductive feature patterns 330 is located on a sixth layout level. In some embodiments, the sixth layout level is different from at least one of the first layout level, the second layout level, the third layout level, the fourth layout level or the fifth layout level. In some embodiments, the sixth layout level corresponds to the M0 level of one or more of layout design 300 or integrated circuits 100, 300, 400, 500, 600, 700, 800A, 800B, 800C or 800D. In some embodiments, the M0 level is above the OD level, the POLY level, the MD level, the BMD level, the BM0 level and the BM1 level.

In some embodiments, the set of conductive feature patterns 330 correspond to 4 M0 routing tracks. Other numbers of M0 routing tracks are within the scope of the present disclosure.

Other configurations, arrangements on other layout levels or quantities of patterns in the set of conductive feature patterns 330 are within the scope of the present disclosure.

Layout design 300 further includes one or more cut feature patterns 334a or 334b (collectively referred to as a "set of cut feature patterns 334") extending in the first direction X.

In some embodiments, each cut feature pattern 334a or 334b of the set of cut feature patterns 334 is separated from an adjacent cut feature pattern in the second direction Y.

The set of cut feature patterns 334 is located on the sixth layout level.

In some embodiments, the set of cut feature patterns 334 overlaps at least a portion of a pattern of the set of conductive feature patterns 330. In some embodiments, the set of cut feature patterns 334 overlaps other underlying patterns (not shown) of other layout levels (e.g., Active, Poly, MD, BMD, BM1, or the like) of layout design 300.

Figure 10:
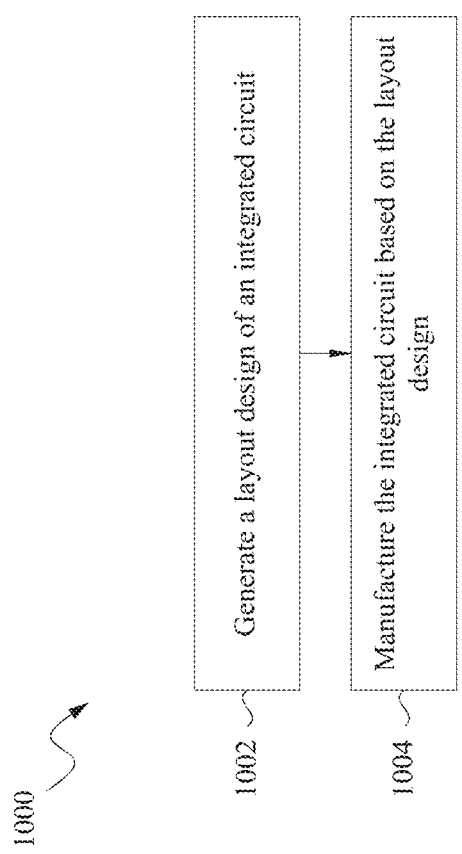
FIG. 10 is a flow chart of a method of manufacturing an integrated circuit, in accordance with some embodiments.

In some embodiments, each cut feature pattern of the set of feature patterns 334 identifies a corresponding location of a corresponding portion of a corresponding conductor in the set of conductors 430 that is removed in operation 1004 of method 1000 (FIG. 10). In some embodiments, cut feature pattern 334a identifies a location of a portion 434a of conductor 430a that is removed in operation 1004 of method 1000 (FIG. 10). In some embodiments, cut feature pattern 334b identifies a location of a portion 434b of conductor 430d that is removed in operation 1004 of method 1000 (FIG. 10). Removed portions 434a and 434b are part of the set of removed portions 434. In some embodiments, cut feature pattern 334a identifies a location of a portion 534a of conductor 531d, 533d, 631d or 633d that is removed in operation 1004 of method 1000 (FIG. 10). Removed portion 534a is a part of the set of removed portions 534.

Cut feature pattern 334a overlaps conductive feature pattern 330a. Cut feature pattern 334b overlaps conductive feature pattern 330d.

Other configurations or quantities of patterns in the set of cut feature patterns 334 are within the scope of the present disclosure.

Layout design 300 further includes one or more conductive feature patterns 332a, 332b, 332c. 332d (collectively referred to as a "set of conductive feature patterns 332") extending in the first direction X.

Each conductive feature pattern in the set of conductive feature patterns 332 is separated from another conductive feature pattern in the set of conductive feature patterns 332 in the second direction Y.

The set of conductive feature patterns 332 is overlapped by at least one of the set of active region patterns 302 or 304, the set of gate patterns 306 or 308 or the set of contact patterns 310, 312, 314, 316 or 318.

The set of conductive feature patterns 330 and 332 are separated from one another in the third direction Z. In some embodiments, conductive feature patterns 330a and 332a are separated from one another in the third direction Z. In some embodiments, conductive feature patterns 330*b* and 332*b* are separated from one another in the third direction Z. In some embodiments, conductive feature patterns 330*c* and 332*c* are separated from one another in the third direction Z. In some embodiments, conductive feature patterns 330*d* and 332*d* are separated from one another in the third direction Z. In some embodiments, conductive feature patterns 330*e* and 332*e* are separated from one another in the third direction Z.

The set of conductive feature patterns 332 is usable to manufacture a corresponding set of conductors 432 of integrated circuit 100, 300, 400, 500, 600, 700, 800A, 800B, 800C or 800D. Conductive feature patterns 332*a*, 332*b*, 332*c*, 332*d* are usable to manufacture corresponding conductors 432*a*, 432*b*, 432*c*, 432*d* of integrated circuit 100, 300, 400, 500, 600, 700, 800A, 800B. 800C or 800D. In some embodiments, at least one conductor of the set of conductors 432 is located on the back-side 403*b* of integrated circuit 100, 300, 400, 500, 600, 700, 800A, 800B, 800C or 800D.

In some embodiments, the set of conductive feature patterns 332 is located on a seventh layout level. In some embodiments, the seventh layout level is different from at least one of the first layout level, the second layout level, the third layout level, the fourth layout level, the fifth layout level or the sixth layout level. In some embodiments, the seventh layout level corresponds to the BM0 level of one or more of layout design 300 or integrated circuits 100, 300, 400, 500, 600, 700, 800A, 800B, 800C or 800D. In some embodiments, the BM0 level is below the OD level, the POLY level, the MD level, the BMD level, the BM0 level and the BM1 level. In some embodiments, the BM0 level is above the BM1 level.

In some embodiments, the set of conductive feature patterns 332 correspond to 4 BM0 routing tracks. Other numbers of BM0 routing tracks are within the scope of the present disclosure.

Other configurations, arrangements on other layout levels or quantities of patterns in the set of conductive feature patterns 332 are within the scope of the present disclosure.

Layout design 300 further includes one or more cut feature patterns 336*a* or 336*b* (collectively referred to as a "set of cut feature patterns 336") extending in the first direction X.

In some embodiments, each cut feature pattern 336*a* or 336*b* of the set of cut feature patterns 336 is separated from an adjacent cut feature pattern in the second direction Y.

The set of cut feature patterns 336 is located on the seventh layout level.

In some embodiments, the set of cut feature patterns 336 overlaps at least a portion of a pattern of the set of conductive feature patterns 332. In some embodiments, the set of cut feature patterns 336 overlaps other underlying patterns (not shown) of other layout levels (e.g., Active, Poly, MD, BMD, BM1, or the like) of layout design 300.

In some embodiments, each cut feature pattern of the set of feature patterns 336 identifies a corresponding location of a corresponding portion of a corresponding conductor in the set of conductors 432 that is removed in operation 1004 of method 1000 (FIG. 10). In some embodiments, cut feature pattern 336*a* identifies a location of a portion 436*a* of conductor 432*a* that is removed in operation 1004 of method 1000 (FIG. 10). In some embodiments, cut feature pattern 336*b* identifies a location of a portion 436*b* of conductor 432*d* that is removed in operation 1004 of method 1000 (FIG. 10).

Cut feature pattern 336*a* overlaps conductive feature pattern 332*a*. Cut feature pattern 336*b* overlaps conductive feature pattern 332*d*.

Other configurations or quantities of patterns in the set of cut feature patterns 336 are within the scope of the present disclosure.

Layout design 300 further includes one or more via patterns 320*a*, 320*b* (collectively referred to as a "set of via patterns 320").

The set of via patterns 320 is usable to manufacture a corresponding set of vias 420 of integrated circuit 100, 300, 400, 500, 600, 700, 800A, 800B, 800C or 800D. In some embodiments, via patterns 320*a*, 320*b* of the set of via patterns 320 are usable to manufacture corresponding vias 420*a*, 420*b* of the set of vias 420 of integrated circuit 100, 300, 400, 500, 600, 700, 800A, 800B, 800C or 800D.

In some embodiments, the set of via patterns 320 is between the set of active region patterns 302 and the set of conductive feature patterns 330. Via pattern 320*a* is between active region pattern 302*a* and conductive feature pattern 330*b*. Via pattern 320*b* is between active region pattern 302*b* and conductive feature pattern 330*c*.

The set of via patterns 320 is positioned at a via over diffusion (VD) level of one or more of layout design 300 or integrated circuits 100, 300, 400, 500, 600, 700, 800A, 800B, 800C or 800D. In some embodiments, the VD level is above the OD level, the POLY level, the MD level, the BMD level, the BM0 level and the BM1 level. In some embodiments, the VD level is below the M0 level and the M1 level. In some embodiments, the VD level is between the MD level and the M0 level. In some embodiments, the VD level is between the third layout level and the sixth layout level. Other layout levels are within the scope of the present disclosure.

Other configurations, arrangements on other layout levels or quantities of patterns in at least set of via patterns 320 are within the scope of the present disclosure.

Layout design 300 further includes one or more via patterns 322*a*, 322*b* (collectively referred to as a "set of via patterns 322").

The set of via patterns 322 is usable to manufacture a corresponding set of vias 422 of integrated circuit 100, 300, 400, 500, 600, 700, 800A, 800B, 800C or 800D. In some embodiments, via patterns 322*a*, 322*b* of the set of via patterns 322 are usable to manufacture corresponding vias 422*a*, 422*b* of the set of vias 422 of integrated circuit 100, 300, 400, 500, 600, 700, 800A, 800B, 800C or 800D.

In some embodiments, the set of via patterns 322 is between the set of active region patterns 304 and the set of conductive feature patterns 332. Via pattern 322*a* is between active region pattern 304*a* and conductive feature pattern 332*b*. Via pattern 322*b* is between active region pattern 304*b* and conductive feature pattern 332*c*.

The set of via patterns 322 is positioned at a back-side via over diffusion (BVD) level of one or more of layout design 300 or integrated circuits 100, 300, 400, 500, 600, 700, 800A, 800B, 800C or 800D. In some embodiments, the BVD level is below the OD level, the POLY level, the MD level, the BMD level, the M0 level and the M1 level. In some embodiments, the BVD level is above the BM0 level and the BM1 level. In some embodiments, the BVD level is between the BMD level and the BM0 level. In some embodiments, the BVD level is between the fourth layout level and the seventh layout level. Other layout levels are within the scope of the present disclosure.

Other configurations, arrangements on other layout levels or quantities of patterns in at least set of via patterns 322 are within the scope of the present disclosure.

Layout design 300 further includes one or more via patterns 324a, 324b (collectively referred to as a "set of via patterns 324").

The set of via patterns 324 is usable to manufacture a corresponding set of vias 424 of integrated circuit 100, 300, 400, 500, 600, 700, 800A, 800B, 800C or 800D. In some embodiments, via patterns 324a, 324b of the set of via patterns 324 are usable to manufacture corresponding vias 424a, 424b of the set of vias 424 of integrated circuit 100, 300, 400, 500, 600, 700, 800A, 800B, 800C or 800D.

In some embodiments, the set of via patterns 324 is between the set of gate patterns 306 and the set of conductive feature patterns 330. Via pattern 324a is between gate pattern 306b and conductive feature pattern 330a. Via pattern 324b is between gate pattern 306d and conductive feature pattern 330d.

The set of via patterns 324 is positioned at a via over gate (VG) level of one or more of layout design 300 or integrated circuits 100, 300, 400, 500, 600, 700, 800A, 800B, 800C or 800D. In some embodiments, the VG level is above the OD level, the POLY level, the MD level, the BMD level, the BM0 level and the BM1 level. In some embodiments, the VG level is below the M0 level and the M1 level. In some embodiments, the VG level is between the POLY level and the M0 level. In some embodiments, the VG level is between the second layout level and the sixth layout level. Other layout levels are within the scope of the present disclosure.

Other configurations, arrangements on other layout levels or quantities of patterns in at least set of via patterns 324 are within the scope of the present disclosure.

Layout design 300 further includes one or more via patterns 326a, 326b (collectively referred to as a "set of via patterns 326").

The set of via patterns 326 is usable to manufacture a corresponding set of vias 426 of integrated circuit 100, 300, 400, 500, 600, 700, 800A, 800B, 800C or 800D. In some embodiments, via patterns 326a, 326b of the set of via patterns 326 are usable to manufacture corresponding vias 426a, 426b of the set of vias 426 of integrated circuit 100, 300, 400, 500, 600, 700, 800A, 800B, 800C or 800D.

In some embodiments, the set of via patterns 326 is between the set of gate patterns 308 and the set of conductive feature patterns 332. Via pattern 326a is between gate pattern 308b and conductive feature pattern 332a. Via pattern 326b is between gate pattern 308d and conductive feature pattern 332d.

The set of via patterns 326 is positioned at a back-side via over gate (BVG) level of one or more of layout design 300 or integrated circuits 100, 300, 400, 500, 600, 700, 800A, 800B, 800C or 800D. In some embodiments, the BVG level is below the OD level, the POLY level, the MD level, the BMD level, the M0 level and the M1 level. In some embodiments, the BVG level is above the BM0 level and the BM1 level. In some embodiments, the BVG level is between the POLY level and the BM0 level. In some embodiments, the BVG level is between the second layout level and the seventh layout level. Other layout levels are within the scope of the present disclosure.

Other configurations, arrangements on other layout levels or quantities of patterns in at least set of via patterns 326 are within the scope of the present disclosure.

Layout design 300 further includes one or more conductive feature patterns 340a, 340b (collectively referred to as a "set of conductive feature patterns 340") extending in the second direction Y.

Each conductive feature pattern in the set of conductive feature patterns 340 is separated from another conductive feature pattern in the set of conductive feature patterns 340 in the first direction X.

The set of conductive feature patterns 340 overlap at least one of the set of active region patterns 302 or 304, the set of gate patterns 306 or 308 or the set of contact patterns 310, 312, 314, 316 or 318 or the set of conductive feature patterns 330 or 332.

The set of conductive feature patterns 340 is usable to manufacture a corresponding set of conductors 440 of integrated circuit 100, 300, 400, 500, 600, 700, 800A, 800B, 800C or 800D. Conductive feature patterns 340a, 340b are usable to manufacture corresponding conductors 440a, 440b of integrated circuit 100, 300, 400, 500, 600, 700, 800A, 800B, 800C or 800D. In some embodiments, at least one conductor of the set of conductors 440 is located on the front-side 403a of integrated circuit 100, 300, 400, 500, 600, 700, 800A, 800B, 800C or 800D.

In some embodiments, the set of conductive feature patterns 340 is located on an eighth layout level. In some embodiments, the eighth layout level is different from at least one of the first layout level, the second layout level, the third layout level, the fourth layout level, the fifth layout level, the sixth layout level or the seventh layout level. In some embodiments, the eighth layout level corresponds to the M1 level of one or more of layout design 300 or integrated circuits 100, 300, 400, 500, 600, 700, 800A, 800B, 800C or 800D. In some embodiments, the M1 level is above the OD level, the POLY level, the MD level, the BMD level, the BM0 level and the BM1 level.

In some embodiments, the set of conductive feature patterns 340 corresponds to 2 M1 routing tracks. Other numbers of M1 routing tracks are within the scope of the present disclosure.

Other configurations, arrangements on other layout levels or quantities of patterns in the set of conductive feature patterns 340 are within the scope of the present disclosure.

Layout design 300 further includes one or more conductive feature patterns 342a, 342b (collectively referred to as a "set of conductive feature patterns 342") extending in the second direction Y.

Each conductive feature pattern in the set of conductive feature patterns 342 is separated from another conductive feature pattern in the set of conductive feature patterns 342 in the first direction X.

The set of conductive feature patterns 342 is overlapped by at least one of the set of active region patterns 302 or 304, the set of gate patterns 306 or 308 or the set of contact patterns 310, 312, 314, 316 or 318, the set of conductive feature patterns 330 or 332 or set of conductive feature patterns 340.

The set of conductive feature patterns 340 and 342 are separated from one another in the third direction Z. In some embodiments, conductive feature patterns 340a and 342a are separated from one another in the third direction Z. In some embodiments, conductive feature patterns 340b and 342b are separated from one another in the third direction Z.

The set of conductive feature patterns 342 is usable to manufacture a corresponding set of conductors 442 of integrated circuit 100, 300, 400, 500, 600, 700, 800A, 800B, 800C or 800D. Conductive feature patterns 342a, 342b are usable to manufacture corresponding conductors 442a, 442b of integrated circuit 100, 300, 400, 500, 600, 700, 800A, 800B, 800C or 800D. In some embodiments, at least one conductor of the set of conductors 442 is located on the back-side 403b of integrated circuit 100, 300, 400, 500, 600, 700, 800A, 800B, 800C or 800D.

In some embodiments, the set of conductive feature patterns 342 is located on a ninth layout level. In some embodiments, the ninth layout level is different from at least one of the first layout level, the second layout level, the third layout level, the fourth layout level, the fifth layout level, the sixth layout level, the seventh layout level or the eighth layout level. In some embodiments, the ninth layout level corresponds to the BM1 level of one or more of layout design 300 or integrated circuits 100, 300, 400, 500, 600, 700, 800A, 800B, 800C or 800D. In some embodiments, the BM1 level is below the OD level, the POLY level, the MD level, the BMD level, and the BM0 level.

In some embodiments, the set of conductive feature patterns 342 corresponds to 2 BM1 routing tracks. Other numbers of BM1 routing tracks are within the scope of the present disclosure.

Other configurations, arrangements on other layout levels or quantities of patterns in the set of conductive feature patterns 342 are within the scope of the present disclosure.

Layout design 300 further includes one or more via patterns 350a, 350b (collectively referred to as a "set of via patterns 350").

The set of via patterns 350 is usable to manufacture a corresponding set of vias 450 of integrated circuit 100, 300, 400, 500, 600, 700, 800A, 800B, 800C or 800D. In some embodiments, via patterns 350a, 350b of the set of via patterns 350 are usable to manufacture corresponding vias 450a, 450b of the set of vias 450 of integrated circuit 100, 300, 400, 500, 600, 700, 800A, 800B, 800C or 800D.

In some embodiments, the set of via patterns 350 is between the set of conductive feature patterns 330 and the set of conductive feature patterns 340. Via pattern 350a is between conductive feature pattern 330a and conductive feature pattern 340b. Via pattern 350b is between conductive feature pattern 330d and conductive feature pattern 340b.

The set of via patterns 350 is positioned at a via over M0 (V0) level of one or more of layout design 300 or integrated circuits 100, 300, 400, 500, 600, 700, 800A, 800B, 800C or 800D. In some embodiments, the V0 level is above the OD level, the POLY level, the MD level, the M0 level, the BMD level, the BM0 level and the BM1 level. In some embodiments, the V0 level is below the M1 level. In some embodiments, the V0 level is between the M0 level and the M1 level. In some embodiments, the V0 level is between the sixth layout level and the eighth layout level. Other layout levels are within the scope of the present disclosure.

Other configurations, arrangements on other layout levels or quantities of patterns in at least set of via patterns 350 are within the scope of the present disclosure.

Layout design 300 further includes one or more via patterns 352a, 352b (collectively referred to as a "set of via patterns 352").

The set of via patterns 352 is usable to manufacture a corresponding set of vias 452 of integrated circuit 100, 300, 400, 500, 600, 700, 800A, 800B, 800C or 800D. In some embodiments, via patterns 352a, 352b of the set of via patterns 352 are usable to manufacture corresponding vias 452a, 452b of the set of vias 452 of integrated circuit 100, 300, 400, 500, 600, 700, 800A, 800B, 800C or 800D.

In some embodiments, the set of via patterns 352 is between the set of conductive feature patterns 332 and the set of conductive feature patterns 342. Via pattern 352a is between conductive feature pattern 332a and conductive feature pattern 342b. Via pattern 352b is between conductive feature pattern 332d and conductive feature pattern 342b.

The set of via patterns 352 is positioned at a via over BM0 (BV0) level of one or more of layout design 300 or integrated circuits 100, 300, 400, 500, 600, 700, 800A, 800B, 800C or 800D. In some embodiments, the BV0 level is below the OD level, the POLY level, the MD level, the M0 level, the M1 level, the BMD level, and the BM0 level. In some embodiments, the BV0 level is above the BM1 level. In some embodiments, the BV0 level is between the BM0 level and the BM1 level. In some embodiments, the BV0 level is between the seventh layout level and the ninth layout level. Other layout levels are within the scope of the present disclosure.

Other configurations, arrangements on other layout levels or quantities of patterns in at least set of via patterns 352 are within the scope of the present disclosure.

FIG. 3C is a diagram of a portion 300C of layout design 300, simplified for ease of illustration.

Portion 300C is an embodiment of integrated circuit 200A of FIG. 2A, and similar detailed description is omitted for brevity.

Portion 300C includes a region 350a, a region 350b1 and a region 350c1.

Region 350a is portion 300A of FIG. 3A, and similar detailed description is omitted for brevity.

Region 350b1 identifies M0 track usage for the set of conductive feature patterns 330. Stated differently, region 350b1 identifies M0 signals for corresponding conductive feature patterns in the set of conductive feature patterns 330. For example, conductive feature pattern 330a is useable for the word line WL, conductive feature pattern 330b1 is useable for the bit line BL, conductive feature pattern 330c is useable for the reference supply voltage VSS, and conductive feature pattern 330d is useable for the word line WL, in accordance with some embodiments.

Region 350c1 identifies BM0 track usage for the set of conductive feature patterns 330. Stated differently, region 350c1 identifies BM0 signals for corresponding conductive feature patterns in the set of conductive feature patterns 332. For example, conductive feature pattern 332a is useable for the supply voltage VDD, conductive feature pattern 332b is useable for the supply voltage VDD, conductive feature pattern 332c is useable for the bit line bar BLB, and conductive feature pattern 332d is useable for the supply voltage VDD, in accordance with some embodiments.

Other M0 track assignments are within the scope of the present disclosure.

FIG. 3D is a diagram of a portion 300D of layout design 300, simplified for ease of illustration.

Portion 300D is an embodiment of integrated circuit 200B of FIG. 2B, and similar detailed description is omitted for brevity.

Portion 300D includes region 350a, a region 350b2 and a region 350c2.

Region 350a is portion 300A of FIG. 3A, and similar detailed description is omitted for brevity.

Region 350b2 identifies M0 track usage for the set of conductive feature patterns 330. Stated differently, region 350b2 identifies M0 signals for corresponding conductive feature patterns in the set of conductive feature patterns 330. For example, conductive feature pattern 330a is useable for the reference supply voltage VSS, conductive feature pattern 330b is useable for the bit line BL, conductive feature pattern 330c is useable for the reference supply voltage VSS, and conductive feature pattern 330d is useable for the reference supply voltage VSS, in accordance with some embodiments.

Region 350c2 identifies BM0 track usage for the set of conductive feature patterns 330. Stated differently, region 350c2 identifies BM0 signals for corresponding conductive feature patterns in the set of conductive feature patterns 332. For example, conductive feature pattern 332a is useable for the word line bar WLB, conductive feature pattern 332b1 is useable for the supply voltage VDD, conductive feature pattern 332c is useable for the bit line bar BLB, and conductive feature pattern 332d is useable for the word line bar WLB, in accordance with some embodiments.

Other M0 track assignments are within the scope of the present disclosure.

In some embodiments, by configuring one or more conductive feature patterns of the set of conductive feature patterns 320 as a word line WL configured to supply a corresponding word line signal from the front-side of the substrate thereby causes portion 300C of layout design 300 to have reduced resistance capacitance (RC) loading compared to other approaches thereby causing the layout design 300 to have increased speed and reduced power consumption than other approaches.

In some embodiments, by configuring one or more conductive feature patterns of the set of conductive feature patterns 322 as a word line bar WLB configured to supply a corresponding word line bar signal from the back-side of the substrate thereby causes portion 300D of layout design 300 to have reduced RC loading compared to other approaches thereby causing the layout design 300 to have increased speed and reduced power consumption than other approaches.

Other configurations, arrangements on other layout levels or quantities of patterns in layout design 300 are within the scope of the present disclosure.

FIGS. 4A-4I are diagrams of an integrated circuit 400, in accordance with some embodiments.

FIGS. 4A-4D are corresponding diagrams of corresponding portions 400A-400D of an integrated circuit 400, simplified for ease of illustration.

Portion 400A includes one or more features of integrated circuit 400 of the OD level, the POLY level, the MD level, the M0 level, the VG level, the VD level, the BMD level, the BM0 level, the BVG level, and the BVD level. Portion 400A is manufactured by portion 300A.

Portion 400B includes one or more features of integrated circuit 400 of the M1 level, the BM1 level, the V0 level and the BV0 level. Portion 400B is manufactured by portion 300B.

Portion 400C includes one or more features of integrated circuit 400 of the OD level, the POLY level, the MD level, the M0 level, the VG level, the VD level, the BMD level, the BM0 level, the BVG level, and the BVD level. Portion 400C is manufactured by portion 300C.

Portion 400D includes one or more features of integrated circuit 400 of the OD level, the POLY level, the MD level, the M0 level, the VG level, the VD level, the BMD level, the BM0 level, the BVG level, and the BVD level. Portion 400D is manufactured by portion 300D.

Figure 4C:
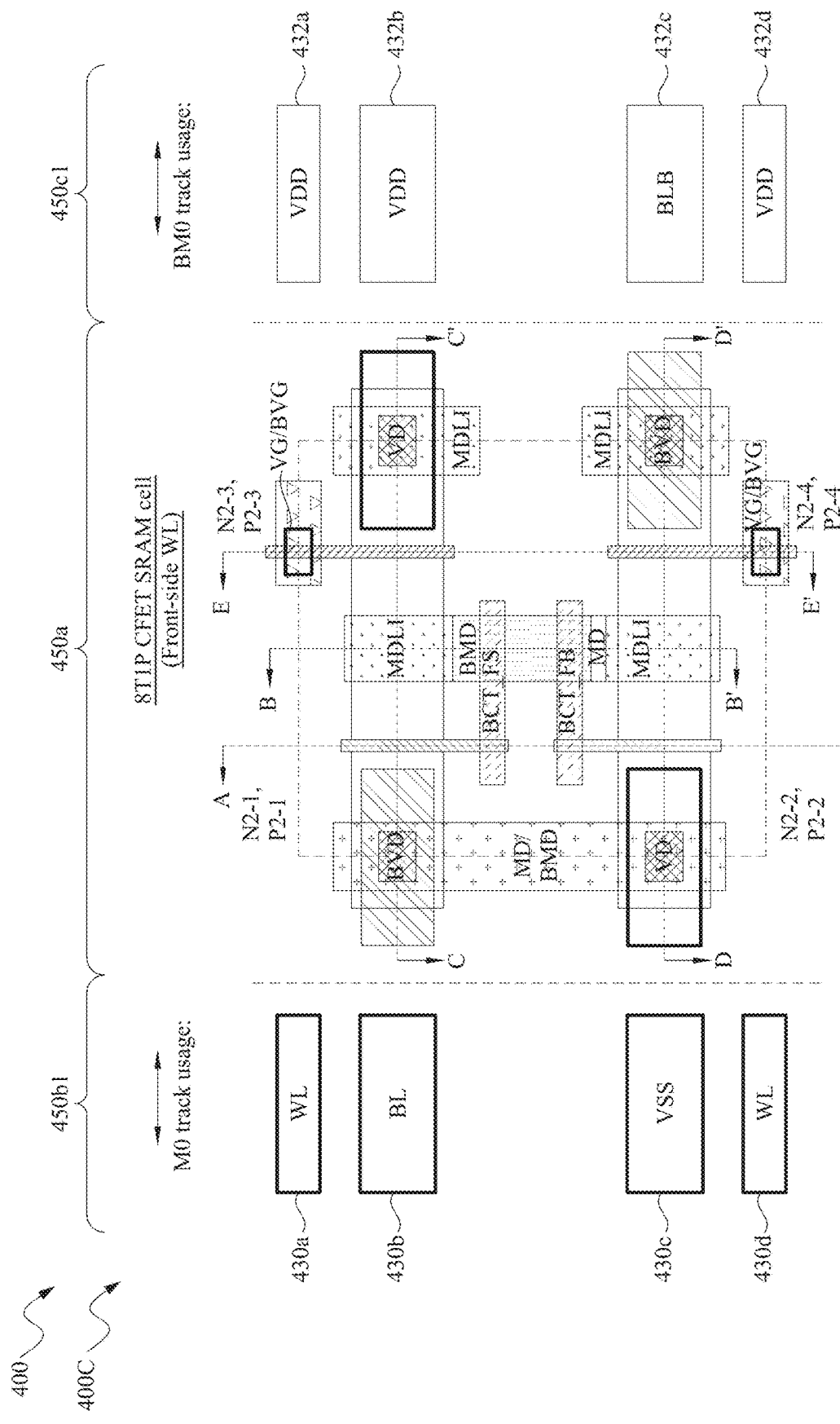
Figure 4D:
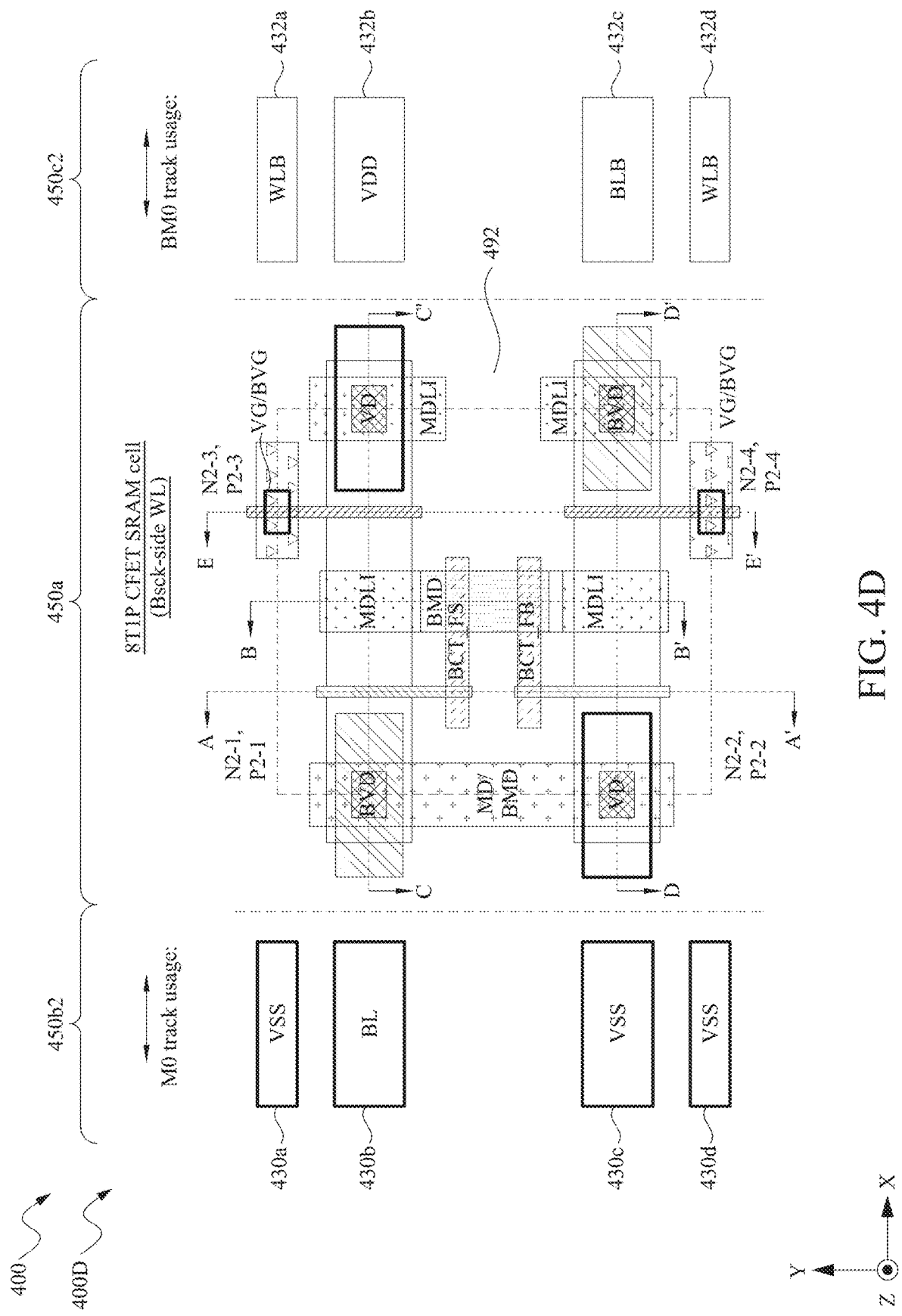
Figures 4E, 4F:
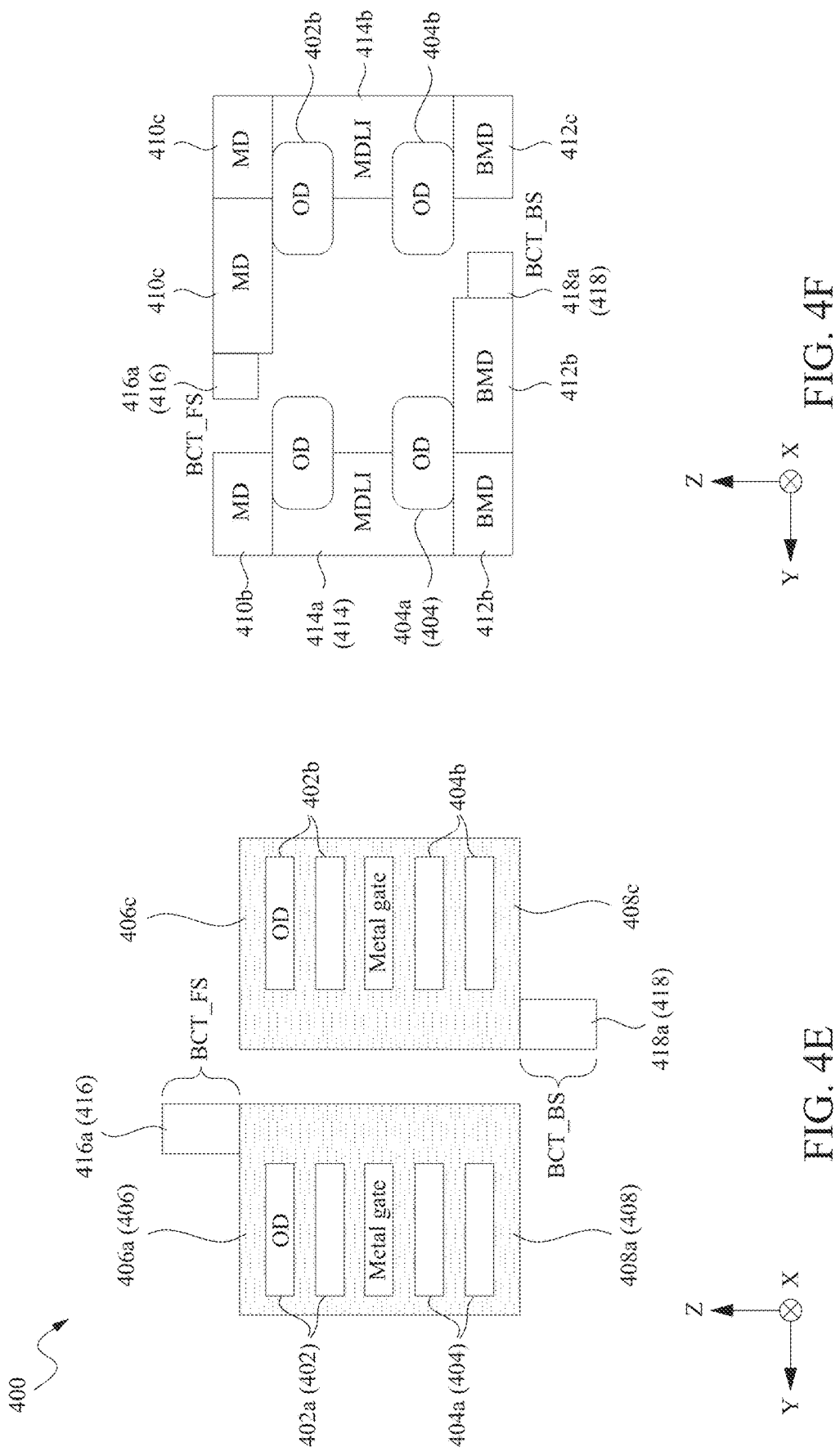
Figure 4G:
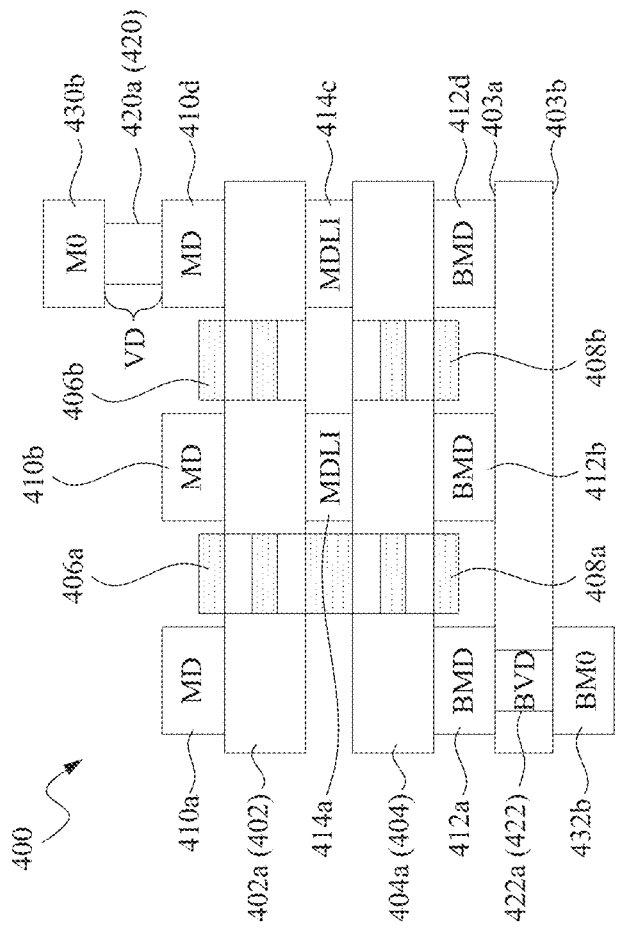
Figure 4H:
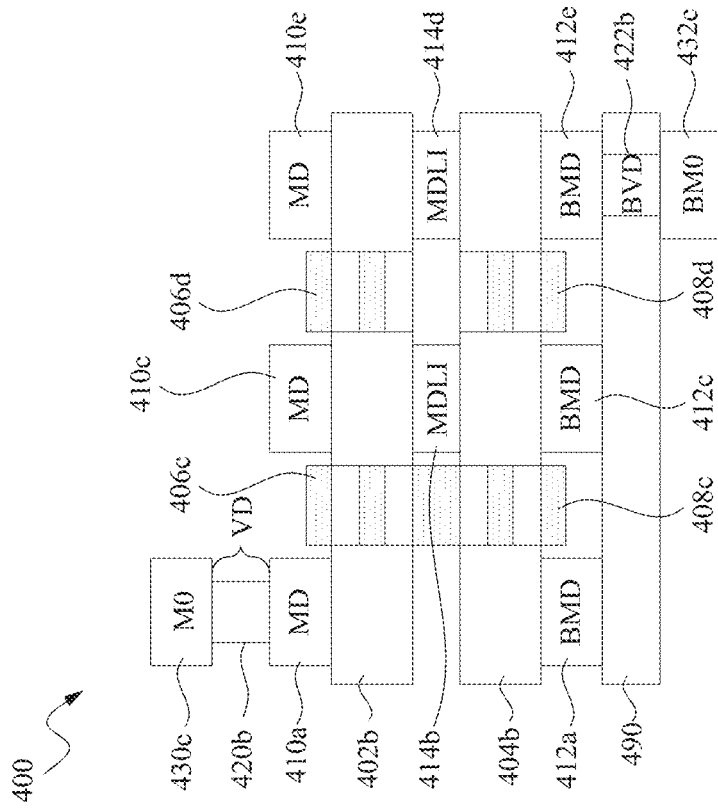
Figure 4I:
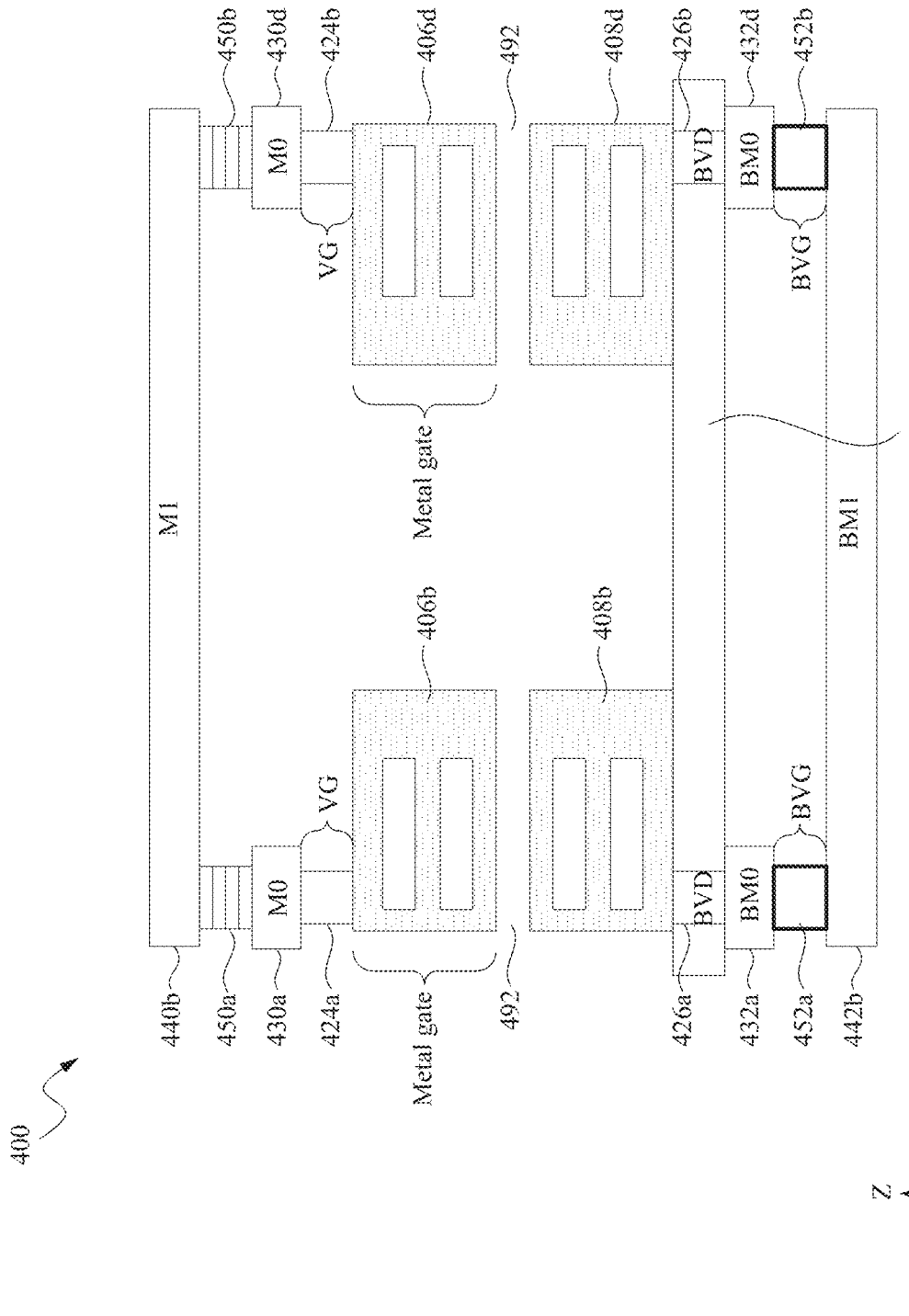

FIGS. 4C-4I are corresponding cross-sectional views of integrated circuit 400, in accordance with some embodiments. FIG. 4D is a cross-sectional view of integrated circuit 400 as intersected by plane A-A', in accordance with some embodiments. FIG. 4E is a cross-sectional view of integrated circuit 400 as intersected by plane B-B', in accordance with some embodiments. FIG. 4F is a cross-sectional view of integrated circuit 400 as intersected by plane C-C', in accordance with some embodiments. FIG. 4G is a cross-sectional view of integrated circuit 400 as intersected by plane D-D', in accordance with some embodiments. FIG. 4H is a cross-sectional view of integrated circuit 400 as intersected by plane E-E', in accordance with some embodiments.

Components that are the same or similar to those in one or more of FIGS. 1, 2A-2B, 3A-3D, 4A-4I, 5A-5C, 6A-6B, 7A-7B, 8A-8D are given the same reference numbers, and detailed description thereof is thus omitted.

Integrated circuit 400 is manufactured by layout design 300. Integrated circuit 400 is cell 401. Structural relationships including alignment, lengths and widths, as well as configurations and layers of integrated circuit 400, 500 600, and 700 are similar to the structural relationships and configurations and layers of layout design 300 of FIGS. 3A-3D, and similar detailed description will not be described in at least FIGS. 4A-4I, for brevity. For example, in some embodiments, at least one or more widths, lengths or pitches of layout design 300 is similar to corresponding widths, lengths or pitches of integrated circuit 400, 500 600, and 700, and similar detailed description is omitted for brevity. For example, in some embodiments, at least cell boundary 301a or 301b is similar to at least corresponding cell boundary 401a or 401b of integrated circuit 400, and similar detailed description is omitted for brevity.

Integrated circuit 400 includes at least the set of active regions 402 and 404, the set of gates 406 and 408, the set of contacts 410, the set of contacts 412, the set of contacts 414, the set of contacts 416, the set of contacts 418, the set of conductors 430, the set of conductors 432, the set of vias 420, the set of vias 422, the set of vias 424, the set of vias 426, the set of conductors 440, the set of conductors 442, the set of vias 450, the set of vias 452, a substrate 490 and an insulating region 492.

The set of active regions 402 and 404 are embedded in substrate 490. Substrate 490 has a front-side 403a and a back-side 403b opposite from the front-side 403a. In some embodiments, at least the set of active regions 402 and 404, the set of gates 406 and 408 or the set of contacts 410, 412, 414, 416 and 418 are formed in the front-side 403a of substrate 490.

In some embodiments, the set of active regions 402 and 404 correspond to active regions of CFET transistors. In some embodiments, the set of active regions 402 and 404 correspond to nanosheet structures (not labelled) of nanosheet transistors. In some embodiments, the set of active regions 402 include drain regions and source regions grown by an epitaxial growth process. In some embodiments, the set of active regions 402 include drain regions and source regions that are grown with an epitaxial material at the corresponding drain regions and source regions.

Other transistor types are within the scope of the present disclosure. For example, in some embodiments, the set of active regions 402 corresponds to nanowire structures (not shown) of nanowire transistors. In some embodiments, the set of active regions 402 corresponds to planar structures (not shown) of planar transistors. In some embodiments, the set of active regions 402 corresponds to fin structures (not shown) of finFETs.

In some embodiments, active regions 402a and 402b correspond to source and drain regions of NMOS transistors of integrated circuit 100, 300, 400, 500, 600, 700, 800A, 800B, 800C or 800D, and active regions 404a and 404b correspond to source and drain regions of PMOS transistors of integrated circuit 100, 300, 400, 500, 600, 700, 800A, 800B, 800C or 800D.

In some embodiments, active regions 402a and 402b correspond to source and drain regions of PMOS transistors of integrated circuit 100, 300, 400, 500, 600, 700, 800A, 800B, 800C or 800D, and active regions 404a and 404b correspond to source and drain regions of NMOS transistors of integrated circuit 100, 300, 400, 500, 600, 700, 800A, 800B, 800C or 800D.

In some embodiments, at least active region 402a or 402b is an N-type doped S/D region, and at least active region 404a or 404b is a P-type doped S/D region embedded in a dielectric material of substrate 490. In some embodiments, at least active region 402a or 402b is a P-type doped S/D region, and at least active region 404a or 404b is an N-type doped S/D region embedded in a dielectric material of substrate 490.

Other configurations, arrangements on other layout levels or quantities of structures in the set of active regions 402 or 404 are within the scope of the present disclosure.

Figure 9:
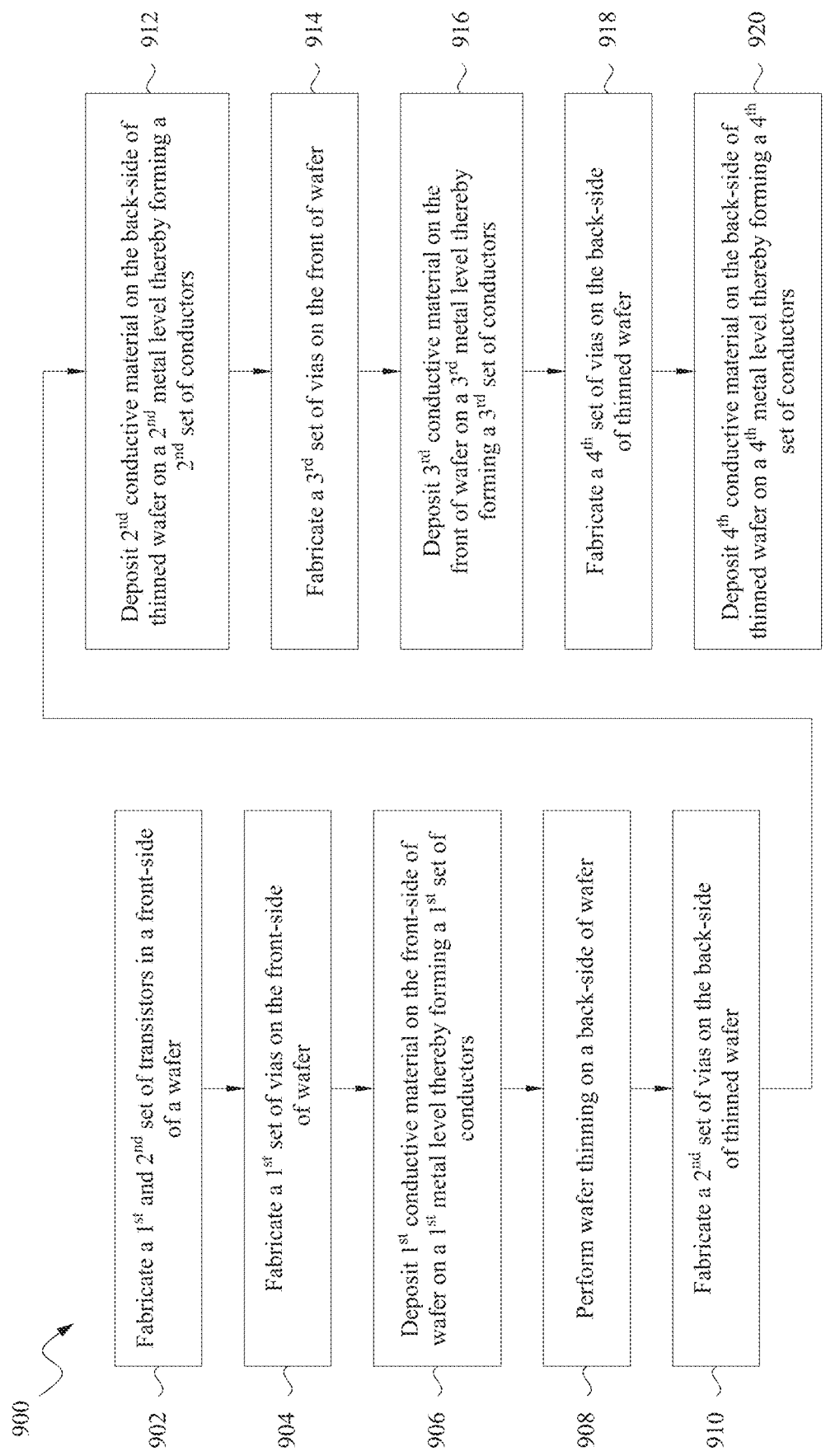
FIG. 9 is a functional flow chart of a method of manufacturing an integrated circuit, in accordance with some embodiments.

Insulating region 492 is configured to electrically isolate one or more elements of the set of active regions 402 and 404, the set of gates 406 and 408, the set of contacts 410, the set of contacts 412, the set of contacts 414, the set of contacts 416, the set of contacts 418, the set of conductors 430, the set of conductors 432, the set of vias 420, the set of vias 422, the set of vias 424, the set of vias 426, the set of conductors 440, the set of conductors 442, the set of vias 450, the set of vias 452 from one another. In some embodiments, insulating region 490 includes multiple insulating regions deposited at different times from each other during method 900 (FIG. 9). In some embodiments, insulating region is a dielectric material. In some embodiments, the dielectric material includes silicon dioxide, silicon oxy-nitride, or the like.

Other configurations, arrangements on other layout levels or other numbers of portions in insulating region 490 are within the scope of the present disclosure.

The set of gates 406 and 408 correspond to one or more gates of transistors N2-1, P2-1, N2-2, P2-2, N2-3, P2-3, N2-4, P2-4 of integrated circuits 100, 300, 400, 500, 600, 700, 800A, 800B, 800C or 800D. In some embodiments, each of the gates in the set of gates 406 and 408 are shown in FIGS. 4A-4F with labels "N2-1, P2-1, N2-2, P2-2, N2-3, P2-3, N2-4, P2-4" that identify corresponding transistors of FIGS. 2A-2B having corresponding gates in FIGS. 4A-4F, and are omitted for brevity.

In some embodiments, gate 406a is a gate of NMOS transistor N2-1, gate 408a is a gate of PMOS transistor P2-1, gate 406b is a gate of NMOS transistor N2-3, gate 408b is a gate of PMOS transistor P2-3, gate 406c is a gate of NMOS transistor N2-2, gate 408c is a gate of PMOS transistor P2-2, gate 406d is a gate of NMOS transistor N2-4, and gate 408d is a gate of PMOS transistor P2-4.

In some embodiments, gate 406a and gate 408a are coupled together. In some embodiments, gate 406a and gate 408a are part of the same continuous structure. In some embodiments, gate 406c and gate 408c are coupled together. In some embodiments, gate 406c and gate 408c are part of the same continuous structure.

In some embodiments, gate 406b and gate 408b are separated from each other in the third direction Z. In some embodiments, gate 406d and gate 408d are separated from each other in the third direction Z.

In some embodiments, the set of gates 406 or 408 encapsulates the set of active regions 402 or 404.

Other configurations, arrangements on other layout levels or quantities of gates in the set of gates 406 and 408 are within the scope of the present disclosure.

Each contact of the set of contacts 410 or 412 corresponds to one or more drain or source terminals of transistors N2-1, P2-1, N2-2, P2-2, N2-3, P2-3, N2-4, P2-4 of integrated circuits 100, 300, 400, 500, 600, 700, 800A, 800B, 800C or 800D. In some embodiments, one or more contacts of the set of contacts 410 or 412 overlaps a pair of active regions of the set of active regions 402 and 404, thereby electrically coupling the pair of active regions of the set of active regions 402 and 404, and the source or drain of the corresponding transistors. For example, contact 410a overlaps active region 402a and 402b, thereby electrically coupling source regions of transistor N2-1 and N2-2 together. For example, contact 410b is overlapped by active region 404a and 404b, thereby electrically coupling source regions of transistor P2-1 and P2-2 together.

In some embodiments, the set of contacts 410 or 412 encapsulates the set of active regions 402 or 404.

In some embodiments, contact 410a corresponds to the source terminals of transistors N2-1 and N2-2, and electrically couples the sources of transistors N2-1 and N2-2 together.

In some embodiments, contact 412a corresponds to the source terminals of transistors P2-1 and P2-2, and electrically couples the sources of transistors P2-1 and P2-2 together.

In some embodiments, contact 410b corresponds to the drain terminals of transistors N2-1 and N2-3. In some embodiments, contact 412b corresponds to the drain terminals of transistors P2-1 and P2-3.

In some embodiments, contact 410c corresponds to the drain terminals of transistors N2-2 and N2-4. In some embodiments, contact 412c corresponds to the drain terminals of transistors P2-2 and P2-4.

In some embodiments, contact 410d corresponds to the source terminals of transistor N2-3. In some embodiments, contact 412d corresponds to the source terminals of transistor P2-3.

In some embodiments, contact 410e corresponds to the source terminals of transistor N2-4. In some embodiments, contact 412e corresponds to the source terminals of transistor P2-4.

In embodiments, contact 414a is between contact 410b and contact 412b, thereby coupling contact 410b and contact 412b together, and electrically coupling the drain terminals of transistors N2-1 and N2-3 and the drain terminals of transistors P2-1 and P2-3 together.

In some embodiments, contact 414b is between contact 410c and contact 412c, thereby coupling contact 410c and contact 412c together, and electrically coupling the drain terminals of transistors N2-2 and N2-4 and the drain terminals of transistors P2-2 and P2-4 together.

In some embodiments, contact 414c is between contact 410d and contact 412d, thereby coupling contact 410d and contact 412d together, and electrically coupling the source terminal of transistor N2-3 and the source terminal of transistors P2-3 together.

In some embodiments, contact 414d is between contact 410e and contact 412e, thereby coupling contact 410c and contact 412e together, and electrically coupling the source terminal of transistor N2-4 and the source terminal of transistor P2-4 together.

In some embodiments, contact 416a couples gate 406a and gate 408a with contact 410c, thereby electrically coupling the gate terminal of transistors N2-1 and P2-1 with the drain terminals of transistors N2-2 and P2-2 and transistors N2-4 and P2-4 together.

In some embodiments, contact 418a couples gate 406c and gate 408c with contact 412b, thereby electrically coupling the gate terminal of transistors N2-2 and P2-2 with the drain terminals of transistors N2-1 and P2-1 and transistors N2-3 and P2-3 together.

In some embodiments, portions of contacts 410b and 412c are removed.

Other configurations, arrangements on other layout levels or quantities of contacts in the set of contacts 410, 412, 414, 416 and 418 are within the scope of the present disclosure.

The set of conductors 420 and 422 are M0 routing tracks. In some embodiments, the set of conductors 420 and 422 are routing tracks in other layers. In some embodiments, the set of conductors 420 or 422 corresponds to 4 M0 routing tracks.

In some embodiments, the set of conductors 430 and 432 correspond to at least one of a bit line BL, a bit line bar BLB, a word line WL or a word line bar WLB. In some embodiments, the set of conductors 430 and 432 is configured to supply at least one of the supply voltage VDD or the reference supply voltage VSS.

As shown in FIG. 4C, conductor 430a is a word line WL, conductor 430b1 is a bit line BL, conductor 430c is configured to supply the reference supply voltage VSS, conductor 430d is the word line WL, conductor 432a is configured to supply the supply voltage VDD, conductor 432b is configured to supply the supply voltage VDD, conductor 432c is a bit line bar BLB, and conductor 432d is configured to supply the supply voltage VDD, in accordance with some embodiments.

As shown in FIG. 4D, conductor 430a is configured to supply the reference supply voltage VSS, conductor 430b1 is the bit line BL, conductor 430c is configured to supply the reference supply voltage VSS, conductor 430d is configured to supply the reference supply voltage VSS, conductor 432a is the word line bar WLB, conductor 432b1 is configured to supply the supply voltage VDD, conductor 432c is the bit line bar BLB, and conductor 432d is the word line bar WLB, in accordance with some embodiments.

Other configurations, arrangements on other layout levels or quantities of conductors in the set of conductors 430 and 432 are within the scope of the present disclosure.

The set of vias 420 is configured to electrically couple a corresponding source or drain region of the set of active regions 402 to the set of conductors 430 by the set of contacts 410, and vice versa. The set of vias 420 is between the set of contacts 410 and the set of conductors 430.

The set of vias 422 is configured to electrically couple a corresponding source or drain region of the set of active regions 404 to the set of conductors 432 by the set of contacts 412, and vice versa. The set of vias 422 is between the set of contacts 412 and the set of conductors 432.

The set of vias 424 is configured to electrically couple one or more gates of the set of gates 404 to the set of conductors 430, and vice versa. The set of vias 424 is between the set of gates 406 and the set of conductors 430.

The set of vias 426 is configured to electrically couple one or more gates of the set of gates 406 to the set of conductors 432, and vice versa. The set of vias 426 is between the set of gates 408 and the set of conductors 432.

Via 420a electrically couples conductor 430b to contact 410d. Via 420b electrically couples conductor 430c to contact 410a.

Via 422a electrically couples conductor 432b to contact 412a. Via 422b electrically couples conductor 432c to contact 412c.

Via 424a electrically couples conductor 430a to gate 406b. Via 424b electrically couples conductor 430d to gate 406d.

Via 426a electrically couples conductor 432a to gate 408b. Via 426b electrically couples conductor 432d to gate 408d.

Other configurations, arrangements on other layout levels or quantities of vias in the set of vias 420, 422, 424 and 426 are within the scope of the present disclosure.

The set of conductors 440 corresponds to 2 M1 routing tracks. Other number of M1 routing tracks are within the scope of the present disclosure. In some embodiments, the set of conductors 440 are routing tracks in other metal layers.

The set of conductors 442 corresponds to 2 BM1 routing tracks. Other number of BM1 routing tracks are within the scope of the present disclosure. In some embodiments, the set of conductors 442 are routing tracks in other metal layers.

In some embodiments, conductor 440a is an input pin configured to receive a first word line signal WL #1, conductor 440b is an input pin configured to receive a second word line signal WL #2, conductor 442a is an input pin configured to receive a first word line bar signal WLB #1, and conductor 442b is an input pin configured to receive a second word line bar signal WLB #2.

In some embodiments, conductor 440a is an input pin configured as a first word line WL #1, conductor 440b is an input pin configured as a second word line signal WL #2, conductor 442a is an input pin configured as a first word line bar signal WLB #1, and conductor 442b is an input pin configured as a second word line bar signal WLB #2.

Other configurations, arrangements on other layout levels or quantities of conductors in the set of conductors 440 and 442 are within the scope of the present disclosure.

The set of vias 450 is configured to electrically couple the set of conductors 440 to the set of conductors 430, and vice versa. The set of vias 450 is between the set of set of conductors 440 and the set of conductors 430.

The set of vias 452 is configured to electrically couple the set of conductors 442 to the set of conductors 432, and vice versa. The set of vias 452 is between the set of set of conductors 442 and the set of conductors 432.

Via 450a electrically couples conductor 440b to conductor 430a. Via 450b electrically couples conductor 440b to conductor 430d.

Via 452a electrically couples conductor 442b to conductor 432a. Via 452b electrically couples conductor 442b to conductor 432d.

Other configurations, arrangements on other layout levels or quantities of vias in the set of vias 450 and 452 are within the scope of the present disclosure.

FIG. 4C is a diagram of a portion 400C of integrated design 400, simplified for case of illustration.

Portion 400C is an embodiment of integrated circuit 200A of FIG. 2A, and similar detailed description is omitted for brevity.

Portion 400C includes a region 450a, a region 450b1 and a region 450c1.

Region 450a is portion 400A of FIG. 4A, and similar detailed description is omitted for brevity.

Region 450b1 identifies M0 track usage for the set of conductors 430. Stated differently, region 450b1 identifies M0 signals for corresponding conductors in the set of conductors 430. For example, conductor 430a is useable for the word line WL, conductor 430b is useable for the bit line BL, conductor 430c is useable for the reference supply voltage VSS, and conductor 430d is useable for the word line WL, in accordance with some embodiments.

Region 450c1 identifies BM0 track usage for the set of conductors 430. Stated differently, region 450c1 identifies BM0 signals for corresponding conductors in the set of conductors 432. For example, conductor 432a is useable for the supply voltage VDD, conductor 432b is useable for the supply voltage VDD, conductor 432c is useable for the bit line bar BLB, and conductor 432d is useable for the supply voltage VDD, in accordance with some embodiments.

In some embodiments, the gate of PMOS transistor P2-3 is coupled to the voltage supply VDD by at least conductor 432a thereby causing PMOS transistor P2-3 to be turned off. In some embodiments, the gate of PMOS transistor P2-4 is coupled to the voltage supply VDD by at least conductor 432d thereby causing PMOS transistor P2-4 to be turned off.

Other M0 track assignments are within the scope of the present disclosure.

FIG. 4D is a diagram of a portion 400D of integrated design 400, simplified for ease of illustration.

Portion 400D is an embodiment of integrated circuit 200B of FIG. 2B, and similar detailed description is omitted for brevity.

Portion 400D includes region 450a, a region 450b2 and a region 450c2.

Region 450a is portion 400A of FIG. 4A, and similar detailed description is omitted for brevity.

Region 450b2 identifies M0 track usage for the set of conductors 430. Stated differently, region 450b2 identifies M0 signals for corresponding conductors in the set of conductors 430. For example, conductor 430a is useable for the reference supply voltage VSS, conductor 430b is useable for the bit line BL, conductor 430c is useable for the reference supply voltage VSS, and conductor 430d is useable for the reference supply voltage VSS, in accordance with some embodiments.

Region 450c2 identifies BM0 track usage for the set of conductors 432. Stated differently, region 450c2 identifies BM0 signals for corresponding conductors in the set of conductors 432. For example, conductor 432a is useable for the word line bar WLB, conductor 432b is useable for the supply voltage VDD, conductor 432c is useable for the bit line bar BLB, and conductor 432d is useable for the word line bar WLB, in accordance with some embodiments.

In some embodiments, the gate of NMOS transistor N2-3 is coupled to the reference voltage supply VSS by at least conductor 430a thereby causing NMOS transistor N2-3 to be turned off. In some embodiments, the gate of NMOS transistor N2-4 is coupled to the reference voltage supply VSS by at least conductor 430d thereby causing NMOS transistor N2-4 to be turned off.

Other M0 track assignments are within the scope of the present disclosure.

In some embodiments, by configuring one or more conductors of the set of conductors 420 as a word line WL configured to supply a corresponding word line signal from the front-side 403a of the substrate thereby causes portion 400C of integrated circuit 400 to have reduced RC loading compared to other approaches thereby causing the integrated circuit 400 to have increased speed and reduced power consumption than other approaches.

In some embodiments, by configuring one or more conductors of the set of conductors 422 as a word line bar WLB configured to supply a corresponding word line bar signal from the back-side 403b of the substrate thereby causes portion 400D of integrated circuit 400 to have reduced RC loading compared to other approaches thereby causing the integrated circuit 400 to have increased speed and reduced power consumption than other approaches.

In some embodiments, at least one gate of the set of gates 406 or 408 are formed using a doped or non-doped polycrystalline silicon (or polysilicon). In some embodiments, at least one gate of the set of gates 406 or 408 include a metal, such as Al, Cu, W, Ti, Ta, TiN, TaN, NiSi, CoSi, other suitable conductive materials, or combinations thereof.

In some embodiments, at least one contact of the set of contacts 410, 412, 414, 416 or 418, or at least one conductor of the set of conductors 430, 432, 440 or 442, or at least one via of the set of vias 420, 422, 424, 426, 450 or 452 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W-TIN, TiSix, NiSix, TiN, TaN, or the like. In some embodiments, a doped semiconductor includes at least doped silicon, or the like.

Other configurations or arrangements of integrated circuit 400 are within the scope of the present disclosure.

Figure 5A:
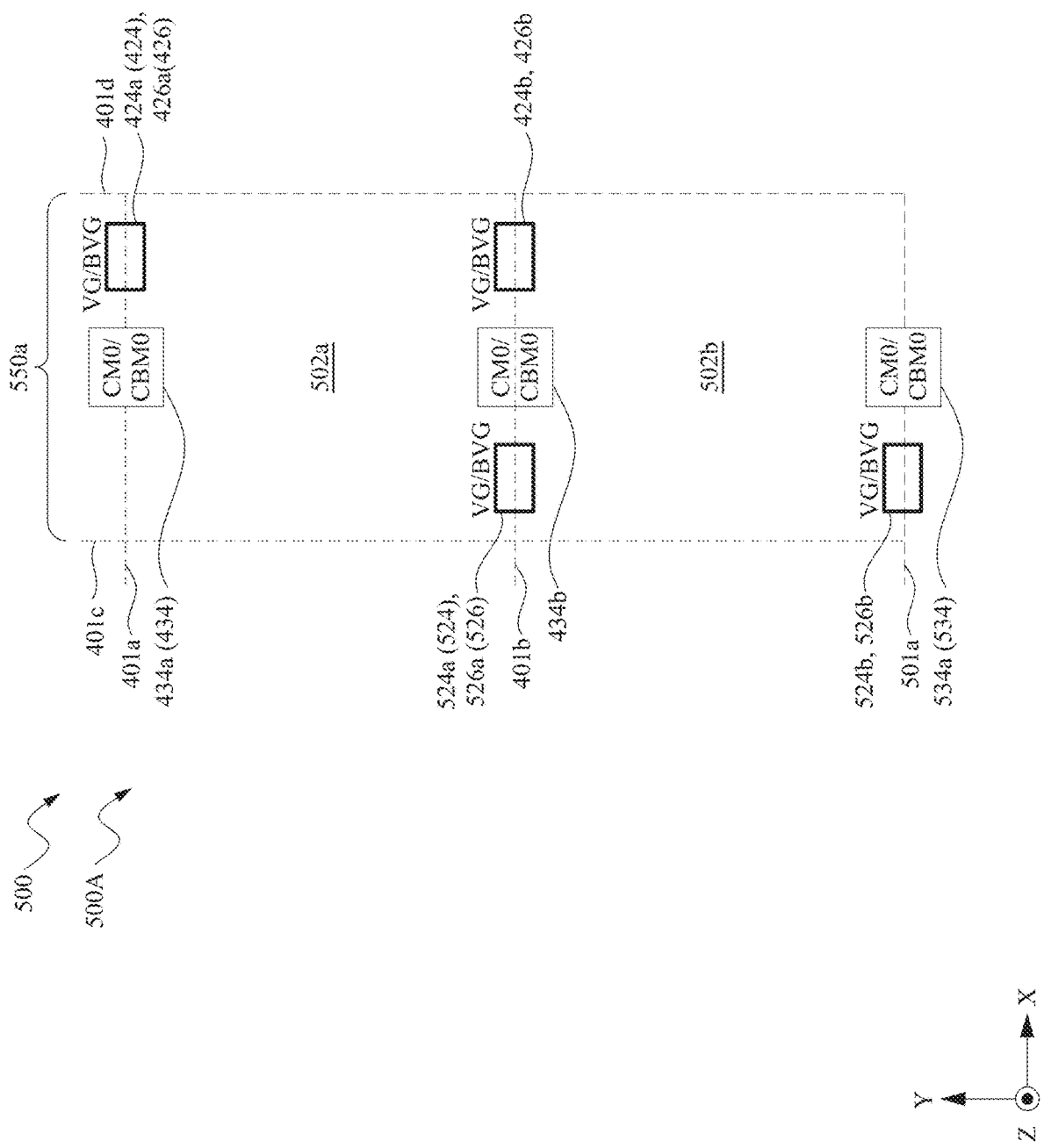
Figure 5C:
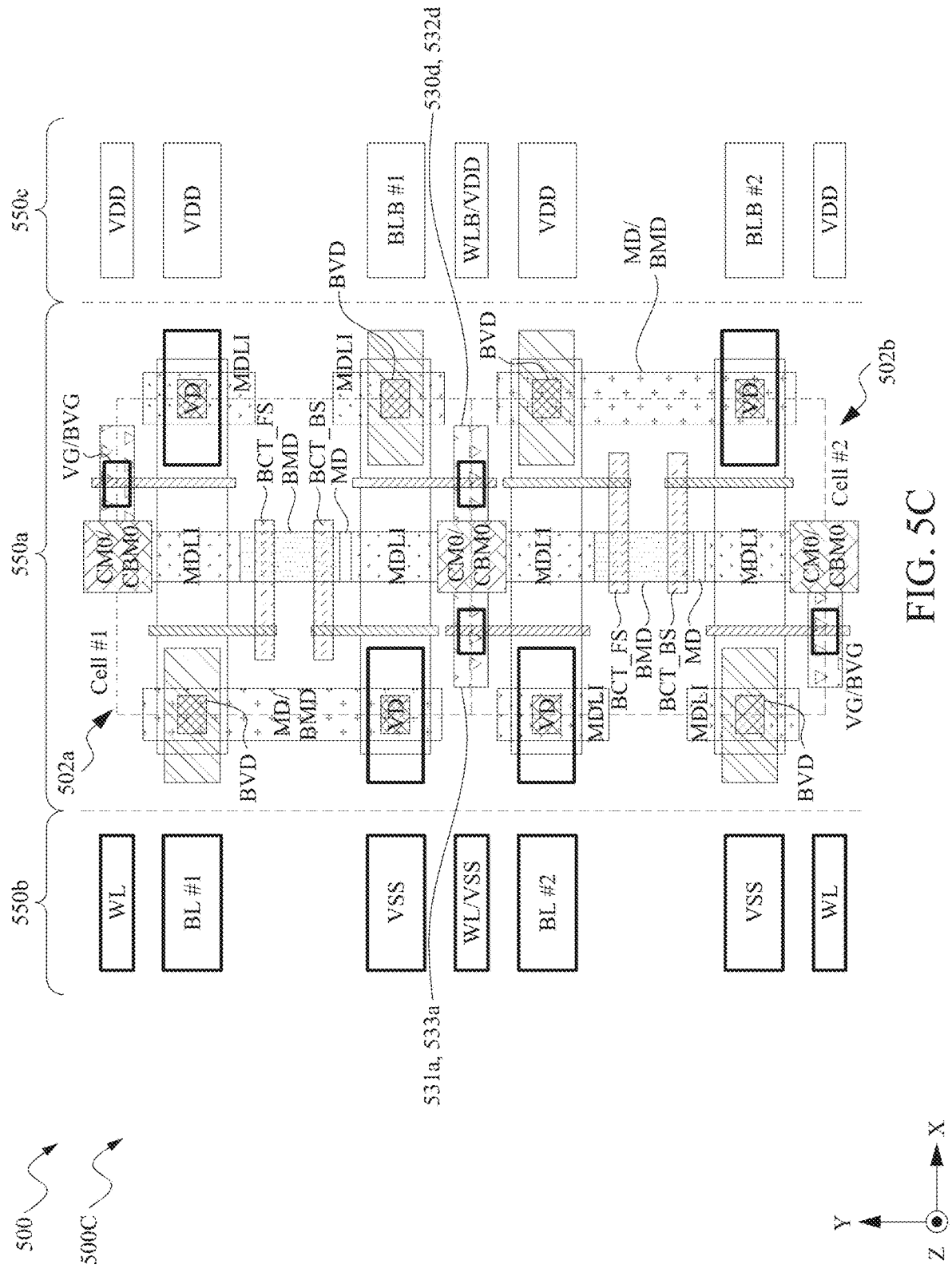

FIGS. 5A-5C are diagrams of an integrated circuit 500, in accordance with some embodiments.

Integrated circuit 500 is a non-limiting example of adjacent cells (e.g., cell 502a and cell 502b) utilizing one or more features of FIGS. 4A-4I. For example, cell 502a and cell 502b correspond to integrated circuit 400C of FIG. 4C, and are controlled by word lines from the front-side 403a of integrated circuit 500, in accordance with some embodiments. In some embodiments, each cell (e.g., cells 502a and 502b) in FIGS. 5A-5C is a memory cell similar to integrated circuit 200A of FIG. 2A, and similar detailed description is omitted for brevity.

FIGS. 5A-5C are corresponding diagrams of corresponding portions 500A-500C of an integrated circuit 500, simplified for ease of illustration.

Portion 500A includes one or more features of integrated circuit 500 of the VG level, the BVG level, the cut M0 level, and the cut BM0 level.

Portion 500B includes one or more features of integrated circuit 500 of the VG level, the M0 level, the BM0 level, the BVG level, the cut M0 level, the cut BM0 level, the M1 level, and the BM1 level.

Portion 500C includes one or more features of integrated circuit 500 of the OD level, the POLY level, the MD level, the M0 level, the VG level, the VD level, the BMD level, the BM0 level, the BVG level, the BVD level, the cut M0 level, the cut BM0 level, the M1 level, and the BM1 level.

Integrated circuit 500 includes a region 550a.

Region 550a includes a cell 502a and a cell 502b. In some embodiments, each of cell 502a and cell 502b is cell 401 of FIGS. 4A-4D, and similar detailed description is omitted for brevity. In some embodiments, cell 502a is portion 400C of FIG. 4C, and cell 502b is a mirror image of portion 400C of FIG. 4C with respect to boundary 401c, and similar detailed description is omitted for brevity. In some embodiments, cell 502a is manufactured by portion 300A, and cell 502b is manufactured by a mirror image of portion 300A with respect to boundary 401c.

Region 550a further includes cell boundaries 401a, 401b and 501a that extend in the first direction X, and cell boundaries 401c and 401d that extend in the second direction Y. Cell boundary 501a is similar to cell boundary 401a and 401b, and similar detailed description is omitted for brevity.

In some embodiments, cell 502b is a mirror image of cell 502a with respect to boundary 401c, and similar detailed description is omitted for brevity. Stated differently, cell 502b is cell 502a rotated 180 degrees with respect to boundary 401c, and similar detailed description is omitted for brevity. In some embodiments, by arranging cells 502a and 502b as shown in FIGS. 5A-5C, integrated circuit 500 has an even-odd interleaving structure. In some embodiments, by integrated circuit 500 having an interleaving structure results in reduced resistance capacitance (RC) loading for integrated circuit 500 thereby causing integrated circuit 500 to have increased speed and reduced power consumption.

In some embodiments, by cells 502a and 502b corresponding to portion 400C of FIG. 4C, cells 502a and 502b have word lines WL positioned on the front-side 403a of integrated circuit 500 similar to FIG. 4C, and similar detailed description is omitted for brevity.

In some embodiments, each of cell 502a and cell 502b includes similar elements of integrated circuit 400 or cell 401 of FIGS. 4A-4D, and similar detailed description is omitted for brevity.

In comparison with cell 502a, a set of vias 524 of cell 502b replaces the set of vias 424, and a set of vias 526 of cell 502b replaces the set of vias 426, and similar detailed description is omitted for brevity.

The set of vias 524 includes via 524a and 524b.

The set of vias 526 includes via 526a and 526b.

In comparison with cell 502a, vias 524a and 524b of cell 502b replaces corresponding vias 424a and 424b, and vias 526a and 526b of cell 502b replaces vias 426a and 426b, and similar detailed description is omitted for brevity.

In comparison with vias 424a and 424b, corresponding positions of corresponding vias 524a and 524b are shifted in the first direction X since cell 502b is a mirror image of cell 502a with respect to boundary 401c.

In comparison with vias 426a and 426b, corresponding positions of corresponding vias 526a and 526b are shifted in the first direction X since cell 502b is a mirror image of cell 502a with respect to boundary 401c.

Integrated circuit 500 further includes a region 550b and a region 550c. Region 550b is similar to region 450b1 of FIG. 4C, and region 550c is similar to region 450c1 of FIG. 4C, and similar detailed description is omitted for brevity.

Region 550b includes a set of conductors 530 and a set of conductors 531.

Region 550b identifies M0 track usage for the set of conductors 530 for cell 502a, and M0 track usage for the set of conductors 531 for cell 502b. Stated differently, region 550b identifies M0 signals for corresponding conductors in the set of conductors 530 for cell 502a, and identifies M0 signals for corresponding conductors in the set of conductors 531 for cell 502b.

Each of the set of conductors 530 and 531 are similar to the set of conductors 430 of FIG. 4C, and similar detailed description is omitted for brevity.

In some embodiments, the set of conductors 530 is useable for cell 502a, and the set of conductors 531 is useable for cell 502b.

The set of conductors 530 includes conductors 530a, 530b, 530c and 530d.

The set of conductors 531 includes conductors 531a, 531b, 531c and 531d.

In comparison with integrated circuit 400, conductors 530a, 530b, 530c and 530d of the set of conductors 530 replaces corresponding conductors 430a, 430b, 430c and 430d of the set of conductors 430, and similar detailed description is omitted for brevity.

In comparison with integrated circuit 400, conductors 531a, 531b, 531c and 531d of the set of conductors 531 are similar to corresponding conductors 430a, 430b, 430c and 430d of the set of conductors 430, and similar detailed description is omitted for brevity.

In some embodiments, conductor 530a is useable for the word line WL, conductor 530b is useable for a bit line BL #1, conductor 530c is useable for the reference supply voltage VSS, and conductor 530d is useable for the word line WL or the reference supply voltage VSS, in accordance with some embodiments. In some embodiments, conductor 531a is useable for the word line WL or the reference supply voltage VSS, conductor 531b is useable for a bit line BL #2, conductor 531c is useable for the reference supply voltage VSS, and conductor 531d is useable for the word line WL, in accordance with some embodiments.

In some embodiments, bit line BL #1 is a bit line for cell 502a, bit line BL #2 is a bit line for cell 502b, bit line bar BLB #1 is a bit line for cell 502a, bit line bar BLB #2 is a bit line bar for cell 502b.

In some embodiments, word line WL is a word line for cell 502a or 502b, and word line bar is a word line bar for cell 502 or 502b.

Region 550c includes a set of conductors 532 and a set of conductors 533.

Region 550c identifies BM0 track usage for the set of conductors 532 for cell 502a, and BM0 track usage for the set of conductors 533 for cell 502b. Stated differently, region 550c identifies BM0 signals for corresponding conductors in the set of conductors 532 for cell 502a, and identifies BM0 signals for corresponding conductors in the set of conductors 533 for cell 502b.

Each of the set of conductors 532 and 533 are similar to the set of conductors 430 of FIG. 4C, and similar detailed description is omitted for brevity.

In some embodiments, the set of conductors 532 is useable for cell 502a, and the set of conductors 533 is useable for cell 502b.

The set of conductors 532 includes conductors 532a, 532b, 532c and 532d.

The set of conductors 533 includes conductors 533a, 533b, 533c and 533d.

In comparison with integrated circuit 400, conductors 532a, 532b, 532c and 532d of the set of conductors 532 replaces corresponding conductors 430a, 430b, 430c and 430d of the set of conductors 430, and similar detailed description is omitted for brevity.

In comparison with integrated circuit 400, conductors 533a, 533b, 533c and 533d of the set of conductors 533 are similar to corresponding conductors 430a, 430b, 430c and 430d of the set of conductors 430, and similar detailed description is omitted for brevity.

In some embodiments, conductor 532a is useable for the supply voltage VDD, conductor 532b is useable for the supply voltage VDD, conductor 532c is useable for a bit line bar BLB #1, and conductor 532d is useable for the word line bar WLB or the supply voltage VDD, in accordance with some embodiments.

In some embodiments, conductor 533a is useable for the word line bar WLB or the supply voltage VDD, conductor 533b is useable for the supply voltage VDD, conductor 533c is useable for a bit line bar BLB #2, and conductor 533d is useable for the supply voltage VDD, in accordance with some embodiments.

Integrated circuit 500 further includes a region 550d. Region 550d includes a set of conductors 540 and a set of conductors 542.

Region 550d identifies M1 track usage for the set of conductors 540, and BM1 track usage for the set of conductors 542. Stated differently, region 550d identifies M1 signals for corresponding conductors in the set of conductors 540, and identifies BM1 signals for corresponding conductors in the set of conductors 542. For example, conductor 540a is useable for word line WL #2, conductor 540b is useable for word line WL #1, conductor 542a is useable for the supply voltage VDD, and conductor 542b is useable for the supply voltage VDD, in accordance with some embodiments.

In comparison with integrated circuit 400, the set of conductors 540 of integrated circuit 500 replaces the set of conductors 440, and the set of conductors 542 of integrated circuit 500 replaces the set of conductors 442, and similar detailed description is omitted for brevity.

The set of conductors 540 includes conductors 540a and 540b.

The set of conductors 542 includes conductors 542a and 542b.

In comparison with integrated circuit 400, conductors 540a and 540b of integrated circuit 500 replaces corresponding conductors 440a and 440b, and conductors 542a and 542b of integrated circuit 500 replaces conductors 442a and 442b, and similar detailed description is omitted for brevity.

In some embodiments, conductor 540b is configured as a word line WL #1 of cell 502a, and conductor 542b is configured as a voltage supply line (VDD) of cell 502a. For example, in some embodiments, conductor 540b is configured to supply a first word line signal on word line WL #1 to cell 502a from the front-side 403a of integrated circuit 500, and conductor 542b is configured to supply the supply voltage VDD to cell 502a from the back-side 403b of integrated circuit 500.

In some embodiments, conductor 540a is configured as a word line WL #2 of cell 502b, and conductor 542a is configured as a voltage supply line (VDD) of cell 502b. For example, in some embodiments, conductor 540a is configured to supply a second word line signal on word line WL #2 to cell 502b from the front-side 403a of integrated circuit 500, and conductor 542a is configured to supply the supply voltage VDD to cell 502b from the back-side 403b of integrated circuit 500.

In some embodiments, word line WL #1 is a word line for cell 502a, and word line WL #2 is a word line for cell 502b.

As shown in FIGS. 5A-5C, cell 502a and cell 502b are controlled by different corresponding word line signals. For example, cell 502a is selected/controlled by a first word line signal on word line WL #1, and cell 502b is selected/controlled by a second word line signal on word line WL #2.

In some embodiments, by controlling adjacent cells (cell 502a and 502b) by different corresponding word line signals, the bit line cell loading of integrated circuit 500 is reduced compared to other approaches thereby reducing a number of dummy read memory cells resulting in less consumed power compared to other approaches. In some embodiments, the bit line cell loading of integrated circuit 500 is reduced by at least 50% compared to other approaches.

In some embodiments, cell 502a can be selected for a read or write operation by setting the first word line signal on word line WL #1 equal to the supply voltage VDD, and cell 502b can be deselected for a read or write operation by setting the second word line signal on word line WL #2 equal to the reference supply voltage VSS. In these embodiments, when cell 502a is selected for a read or write operation, then conductor 530d is configured to receive the word line signal from word line WL #1 (supply voltage VDD), and conductor 532d is configured to receive the word line bar signal from word line bar WLB #1 (e.g., supply voltage VDD). In these embodiments, when cell 502b is deselected for a read or write operation, then conductor 531a is configured to receive the word line signal from word line WL #2 (reference supply voltage VSS), and conductor 533a is configured to receive the word line bar signal from word line bar WLB #2 (e.g., supply voltage VDD).

In some embodiments, cell 502b can be deselected for a read or write operation by setting the first word line signal on word line WL #1 equal to the reference supply voltage VSS, and cell 502b can be selected for a read or write operation by setting the second word line signal on word line WL #2 equal to the supply voltage VDD. In these embodiments, when cell 502a is deselected for a read or write operation, then conductor 530d is configured to receive the word line signal from word line #1 (reference supply voltage VSS), and conductor 532d is configured to receive the word line bar signal from word line bar #1 (e.g., supply voltage VDD). In these embodiments, when cell 502b is selected for a read or write operation, then conductor 531a is configured to receive the word line signal from word line #2 (supply voltage VDD), and conductor 533a is configured to receive the word line bar signal from word line bar #1 (e.g., supply voltage VDD).

Other configurations or arrangements of integrated circuit 500 are within the scope of the present disclosure.

Figure 6A:

FIGS. 6A-6B are diagrams of an integrated circuit 600, in accordance with some embodiments.

Integrated circuit 600 is a variation of integrated circuit 500 of FIGS. 5A-5C, and similar detailed description is omitted for brevity. In comparison with integrated circuit 500 of FIGS. 5A-5C, integrated circuit 600 is controlled by word line bars from the back-side 403b.

Integrated circuit 600 is a non-limiting example of adjacent cells (e.g., cell 602a and cell 602b) utilizing one or more features of FIGS. 4A-4I. For example, cell 602a and cell 602b correspond to integrated circuit 400D of FIG. 4D, and are controlled by word line bars from the back-side 403b of integrated circuit 600, in accordance with some embodiments. In some embodiments, each cell (e.g., cells 602a and 602b) in FIGS. 6A-6B is a memory cell similar to integrated circuit 200B of FIG. 2B, and similar detailed description is omitted for brevity.

FIGS. 6A-6B are corresponding diagrams of corresponding portions 600A-600B of an integrated circuit 600, simplified for ease of illustration.

Portion 600A includes one or more features of integrated circuit 600 of the VG level, the BVG level, the cut M0 level, and the cut BM0 level.

Portion 600B includes one or more features of integrated circuit 600 of the VG level, the M0 level, the BM0 level, the BVG level, the cut M0 level, the cut BM0 level, the M1 level, and the BM1 level.

Integrated circuit 600 includes a region 650a. Region 650a is similar to region 550a, and similar detailed description is omitted for brevity.

Region 650a includes a cell 602a and a cell 602b. Cell 602a is similar to cell 502a, and cell 602b is similar to cell 502b, and similar detailed description is omitted for brevity.

In some embodiments, each of cell 602a and cell 602b is cell 401 of FIGS. 4A-4D, and similar detailed description is omitted for brevity. In some embodiments, cell 602a is portion 400D of FIG. 4D, and cell 602b is a mirror image of portion 400D of FIG. 4D with respect to boundary 401c, and similar detailed description is omitted for brevity. In some embodiments, cell 602a is manufactured by portion 300A, and cell 602b is manufactured by a mirror image of portion 300A with respect to boundary 401c.

In some embodiments, cell 602b is a mirror image of cell 602a with respect to boundary 401c, and similar detailed description is omitted for brevity. Stated differently, cell 602b is cell 602a rotated 180 degrees with respect to boundary 401c, and similar detailed description is omitted for brevity. In some embodiments, by arranging cells 602a and 602b as shown in FIGS. 6A-6B, integrated circuit 600 has an even-odd interleaving structure. In some embodiments, by integrated circuit 600 having an interleaving structure results in reduced resistance capacitance (RC) loading for integrated circuit 600 thereby causing integrated circuit 600 to have increased speed and reduced power consumption.

In some embodiments, by cells 602a and 602b corresponding to portion 400D of FIG. 4D, cells 602a and 602b have word line bars WLB positioned on the back-side 403b of integrated circuit 600 similar to FIG. 4D, and similar detailed description is omitted for brevity.

In some embodiments, each of cell 602a and cell 602b includes similar elements of integrated circuit 400 or cell 401 of FIGS. 4A-4D, and similar detailed description is omitted for brevity.

Integrated circuit 600 further includes a region 650b and a region 650c. Region 650b is similar to region 450b2 of FIG. 4D, and region 650c is similar to region 450c2 of FIG. 4D, and similar detailed description is omitted for brevity. In some embodiments, region 650b is similar to region 550b of FIGS. 5A-5C, and region 650c is similar to region 550b of FIGS. 5A-5C, and similar detailed description is omitted for brevity.

Region 650b includes a set of conductors 630 and a set of conductors 631.

Region 650b identifies M0 track usage for the set of conductors 630 for cell 602a, and M0 track usage for the set of conductors 631 for cell 602b. Stated differently, region 650b identifies M0 signals for corresponding conductors in the set of conductors 630 for cell 602a, and identifies M0 signals for corresponding conductors in the set of conductors 631 for cell 602b.

Each of the set of conductors 630 and 631 are similar to the set of conductors 430 of FIG. 4C, and similar detailed description is omitted for brevity.

In some embodiments, the set of conductors 630 is useable for cell 602a, and the set of conductors 631 is useable for cell 602a.

The set of conductors 630 includes conductors 630a, 630b, 630c and 630d.

The set of conductors 631 includes conductors 631a, 631b, 631c and 631d.

In comparison with integrated circuit 400, conductors 630a, 630b, 630c and 630d of the set of conductors 630 replaces corresponding conductors 430a, 430b, 430c and 430d of the set of conductors 430, and similar detailed description is omitted for brevity.

In comparison with integrated circuit 400, conductors 631a, 631b, 631c and 631d of the set of conductors 631 are similar to corresponding conductors 430a, 430b, 430c and 430d of the set of conductors 430, and similar detailed description is omitted for brevity.

In some embodiments, conductor 630a is useable for the reference supply voltage VSS, conductor 630b is useable for a bit line BL #1, conductor 630c is useable for the reference supply voltage VSS, and conductor 630d is useable for the word line WL or the reference supply voltage VSS, in accordance with some embodiments.

In some embodiments, conductor 631a is useable for the word line WL or the reference supply voltage VSS, conductor 631b is useable for a bit line BL #2, conductor 631c is useable for the reference supply voltage VSS, and conductor 631d is useable for the reference supply voltage VSS, in accordance with some embodiments.

In some embodiments, bit line BL #1 is a bit line for cell 602a, bit line BL #2 is a bit line for cell 602b, bit line bar BLB #1 is a bit line for cell 602a, bit line bar BLB #2 is a bit line bar for cell 602b.

In some embodiments, word line WL is a word line for cell 602a or 602b, word line bar WLB #1 is a word line bar for cell 602a, and word line bar WLB #2 is a word line bar for cell 602b.

Region 650c includes a set of conductors 632 and a set of conductors 633.

Region 650c identifies BM0 track usage for the set of conductors 632 for cell 602a, and BM0 track usage for the set of conductors 633 for cell 602b. Stated differently, region 650c identifies BM0 signals for corresponding conductors in the set of conductors 632 for cell 602a, and identifies BM0 signals for corresponding conductors in the set of conductors 633 for cell 602b.

Each of the set of conductors 632 and 633 are similar to the set of conductors 430 of FIG. 4C, and similar detailed description is omitted for brevity.

In some embodiments, the set of conductors 632 is useable for cell 602a, and the set of conductors 633 is useable for cell 602b.

The set of conductors 632 includes conductors 632a, 632b, 632c and 632d.

The set of conductors 633 includes conductors 633a, 633b, 633c and 633d.

In comparison with integrated circuit 400, conductors 632a, 632b, 632c and 632d of the set of conductors 632 replaces corresponding conductors 430a, 430b, 430c and 430d of the set of conductors 430, and similar detailed description is omitted for brevity.

In comparison with integrated circuit 400, conductors 633a, 633b, 633c and 633d of the set of conductors 633 are similar to corresponding conductors 430a, 430b, 430c and 430d of the set of conductors 430, and similar detailed description is omitted for brevity.

In some embodiments, conductor 632a is useable for the word line bar WLB, conductor 632b is useable for the supply voltage VDD, conductor 632c is useable for a bit line bar BLB #1, and conductor 632d is useable for the word line bar WLB or the supply voltage VDD, in accordance with some embodiments.

In some embodiments, conductor 633a is useable for the word line bar WLB or the supply voltage VDD, conductor 633b is useable for the supply voltage VDD, conductor 633c is useable for a bit line bar BLB #2, and conductor 633d is useable for the word line bar WLB, in accordance with some embodiments.

Integrated circuit 600 further includes a region 650d. Region 650d includes a set of conductors 640 and a set of conductors 642.

Region 650*d* identifies M1 track usage for the set of conductors 640, and BM1 track usage for the set of conductors 642. Stated differently, region 650*d* identifies M1 signals for corresponding conductors in the set of conductors 640, and identifies BM1 signals for corresponding conductors in the set of conductors 642. For example, conductor 640*a* is useable for the reference supply voltage VSS, conductor 640*b* is useable for the reference supply voltage VSS, conductor 642*a* is useable for word line bar WLB #2, and conductor 642*b* is useable for word line bar WLB #1, in accordance with some embodiments.

In comparison with integrated circuit 400, the set of conductors 640 of integrated circuit 600 replaces the set of conductors 440, and the set of conductors 642 of integrated circuit 600 replaces the set of conductors 442, and similar detailed description is omitted for brevity.

The set of conductors 640 includes conductors 640*a* and 640*b*.

The set of conductors 642 includes conductors 642*a* and 642*b*.

In comparison with integrated circuit 400, conductors 640*a* and 640*b* of integrated circuit 600 replaces corresponding conductors 440*a* and 440*b*, and conductors 642*a* and 642*b* of integrated circuit 600 replaces conductors 442*a* and 442*b*, and similar detailed description is omitted for brevity.

In some embodiments, conductor 642*b* is configured as a word line bar WLB #1 of cell 602*a*, and conductor 640*b* is configured as a reference voltage supply line (VSS) of cell 602*a*. For example, in some embodiments, conductor 642*b* is configured to supply a first word line bar signal on word line WLB #1 to cell 602*a* from the back-side 403*b* of integrated circuit 600, and conductor 640*b* is configured to supply the reference supply voltage VSS to cell 602*a* from the front-side 403*a* of integrated circuit 600.

In some embodiments, conductor 642*a* is configured as a word line bar WLB #2 of cell 602*b*, and conductor 640*a* is configured as a reference voltage supply line (VSS) of cell 602*b*. For example, in some embodiments, conductor 642*a* is configured to supply a second word line bar signal on word line bar WLB #2 to cell 602*b* from the back-side 403*b* of integrated circuit 600, and conductor 640*a* is configured to supply the reference supply voltage VSS to cell 602*b* from the front-side 403*a* of integrated circuit 600.

In some embodiments, word line bar WLB #1 is a word line bar for cell 602*a*, and word line bar WLB #2 is a word line bar for cell 602*b*.

As shown in FIGS. 6A-6B, cell 602*a* and cell 602*b* are controlled by different corresponding word line signals. For example, cell 602*a* is selected/controlled by a first word line bar signal on word line bar WLB #1, and cell 602*b* is selected/controlled by a second word line bar signal on word line bar WLB #2.

In some embodiments, by controlling adjacent cells (cell 602*a* and 602*b*) by different corresponding word line bar signals, the bit line cell loading of integrated circuit 600 is reduced compared to other approaches thereby reducing a number of dummy read memory cells resulting in less consumed power compared to other approaches. In some embodiments, the bit line cell loading of integrated circuit 600 is reduced by at least 50% compared to other approaches.

In some embodiments, cell 602*a* can be selected for a read or write operation by setting the first word line bar signal on word line bar WLB #1 equal to the reference supply voltage VSS, and cell 602*b* can be deselected for a read or write operation by setting the second word line bar signal on word line WLB #2 equal to the supply voltage VDD. In these embodiments, when cell 602*a* is selected for a read or write operation, then conductor 630*d* is configured to receive the word line signal from word line WL #1 (reference supply voltage VSS), and conductor 632*d* is configured to receive the word line bar signal from word line bar WLB #1 (e.g., reference supply voltage VSS). In these embodiments, when cell 602*b* is deselected for a read or write operation, then conductor 631*a* is configured to receive the word line signal from word line WL #2 (reference supply voltage VSS), and conductor 633*a* is configured to receive the word line bar signal from word line bar WLB #2 (e.g., supply voltage VDD).

In some embodiments, cell 602*a* can be deselected for a read or write operation by setting the first word line signal on word line bar WLB #1 equal to the supply voltage VDD, and cell 602*b* can be selected for a read or write operation by setting the second word line signal on word line bar WLB #2 equal to the reference supply voltage VSS.

In these embodiments, when cell 602*a* is deselected for a read or write operation, then conductor 630*d* is configured to receive the word line signal from word line WL #1 (reference supply voltage VSS), and conductor 632*d* is configured to receive the word line bar signal from word line bar WLB #1 (e.g., supply voltage VDD).

In these embodiments, when cell 602*b* is selected for a read or write operation, then conductor 631*a* is configured to receive the word line signal from word line WL #2 (reference supply voltage VSS), and conductor 633*a* is configured to receive the word line bar signal from word line bar WLB #1 (e.g., reference supply voltage VSS).

Other configurations or arrangements of integrated circuit 600 are within the scope of the present disclosure.

Figure 7A:
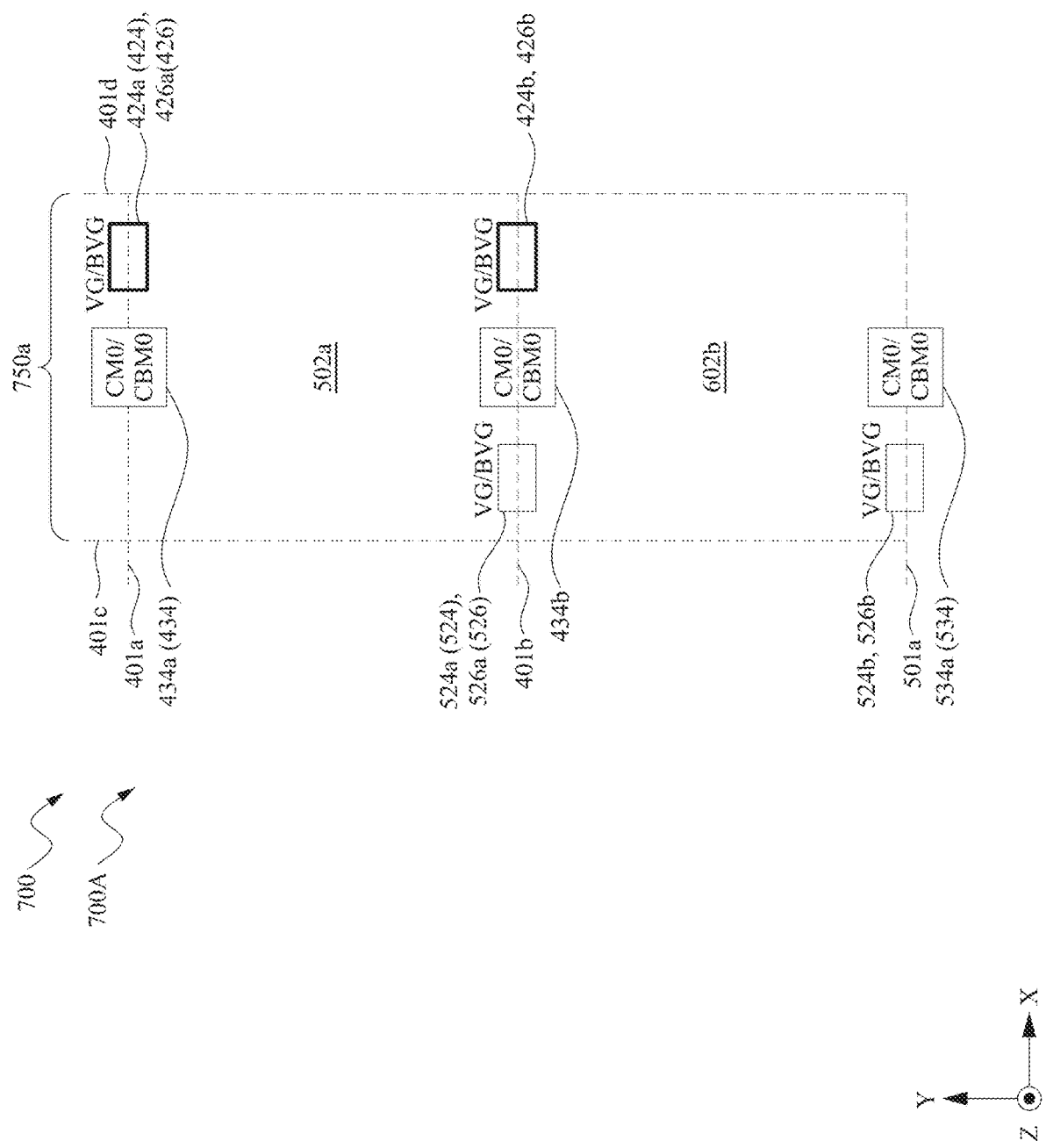
FIGS. 7A-7B are diagrams of an integrated circuit, in accordance with some embodiments.
Figure 7B:
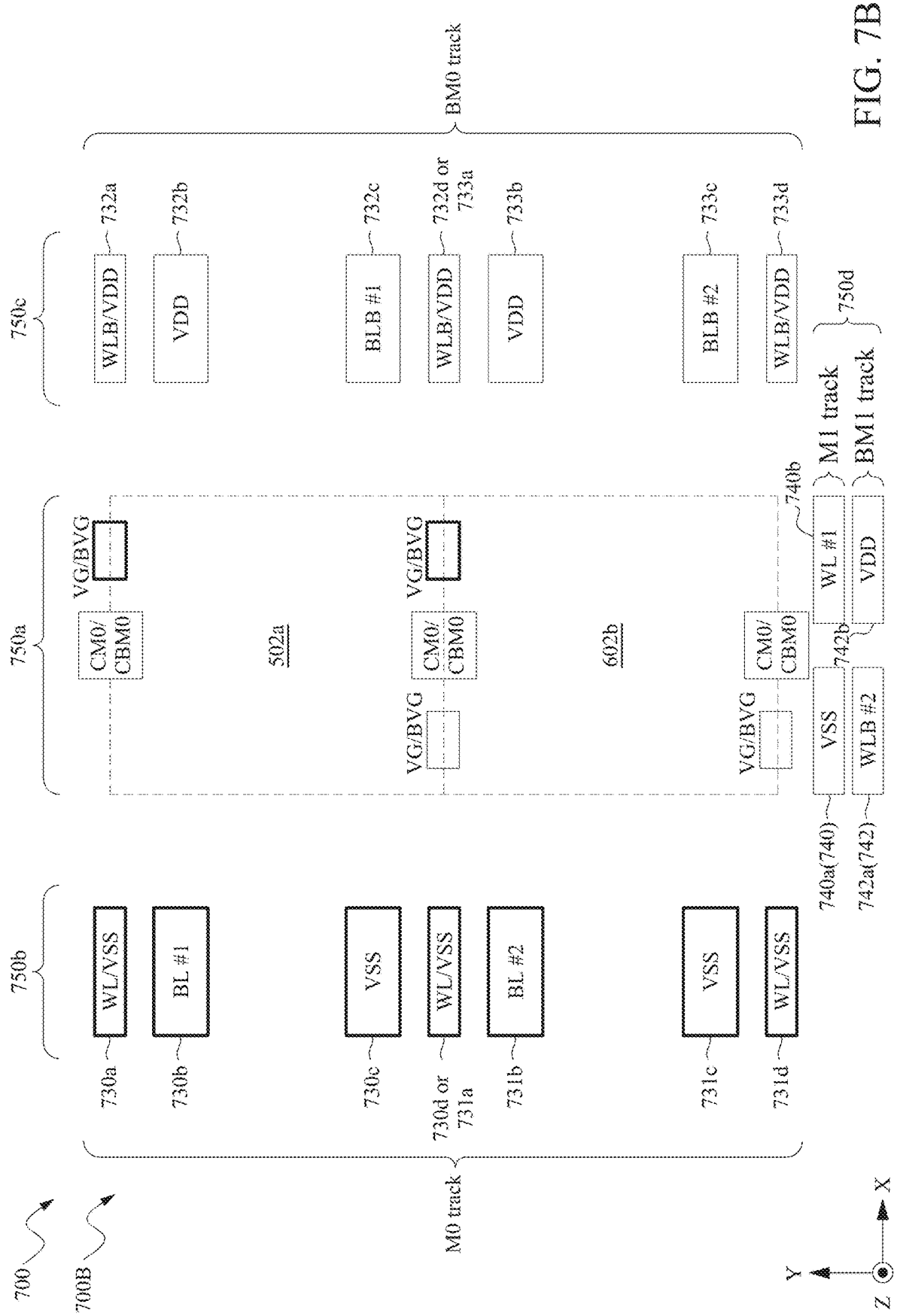

FIGS. 7A-7B are diagrams of an integrated circuit 700, in accordance with some embodiments.

Integrated circuit 700 is a variation of integrated circuit 500 of FIGS. 5A-5C and integrated circuit 600 of FIGS. 6A-6B, and similar detailed description is omitted for brevity. For example, integrated circuit 700 is a hybrid of cell 502*a* of FIGS. 5A-5C, and cell 602*b* of FIGS. 6A-6B, and similar detailed description is omitted for brevity.

Integrated circuit 700 includes cell 502*a* and cell 602*b*.

Cell 502*a* is controlled by word lines from the front-side 403*a*. Cell 602*b* is controlled by word line bars from the back-side 403*b*.

FIGS. 7A-7B are corresponding diagrams of corresponding portions 700A-700B of an integrated circuit 700, simplified for ease of illustration.

Portion 700A includes one or more features of integrated circuit 700 of the VG level, the BVG level, the cut M0 level, and the cut BM0 level.

Portion 700B includes one or more features of integrated circuit 700 of the VG level, the M0 level, the BM0 level, the BVG level, the cut M0 level, the cut BM0 level, the M1 level, and the BM1 level.

Integrated circuit 700 includes a region 750*a*. Region 750*a* is similar to region 450*a* and region 550*a*, and similar detailed description is omitted for brevity.

Region 750*a* includes cell 502*a* and cell 602*b*.

In some embodiments, cell 602*b* is a mirror image of cell 502*a* with respect to boundary 401*c*, and similar detailed description is omitted for brevity. In some embodiments, by arranging cells 502*a* and 602*b* as shown in FIGS. 7A-7B, integrated circuit 700 has an even-odd interleaving structure. In some embodiments, by integrated circuit 700 having an interleaving structure results in reduced RC loading for integrated circuit 700 thereby causing integrated circuit 700 to have increased speed and reduced power consumption.

In some embodiments, by cell 502a corresponding to portion 400C of FIG. 4C, cell 502a has word lines WL positioned on the front-side 403a of integrated circuit 700 similar to FIG. 4C, and similar detailed description is omitted for brevity.

In some embodiments, by cell 602b corresponding to portion 400D of FIG. 4D, cell 602b has word line bars WLB positioned on the back-side 403b of integrated circuit 700 similar to FIG. 4D, and similar detailed description is omitted for brevity.

Integrated circuit 700 further includes a region 750b and a region 750c. Region 750b is similar to region 550b of FIGS. 5A-5C and region 650b of FIGS. 6A-6B, and region 750c is similar to region 550c of FIGS. 5A-5C and region 650c of FIGS. 6A-6B, and similar detailed description is omitted for brevity.

Region 750b includes a set of conductors 730 and a set of conductors 731. The set of conductors 730 includes conductors 730a, 730b, 730c and 730d. The set of conductors 731 includes conductors 731a, 731b, 731c and 731d.

In some embodiments, the set of conductors 730 is useable for cell 502a, and the set of conductors 731 is useable for cell 602a.

Region 750c includes a set of conductors 732 and a set of conductors 733. The set of conductors 732 includes conductors 732a, 732b, 732c and 732d. The set of conductors 733 includes conductors 733a, 733b, 733c and 733d.

In some embodiments, the set of conductors 732 is useable for cell 502a, and the set of conductors 733 is useable for cell 602a.

Integrated circuit 700 further includes a region 750d. Region 750d includes a set of conductors 740 and a set of conductors 742. The set of conductors 740 includes conductors 740a and 740b.

The set of conductors 742 includes conductors 742a and 742b. In some embodiments, configurations of conductors 740a, 740b, 742a and 742b are similar to the description of FIGS. 5A-5C and 6A-6B, and similar detailed description is omitted for brevity.

In some embodiments, integrated circuit 700 achieves one or more of the benefits described herein.

Other configurations or arrangements of integrated circuit 700 are within the scope of the present disclosure.

FIGS. 8A-8D are corresponding diagrams of corresponding integrated circuit 800A-800D, in accordance with some embodiments.

Figures 8A, 8B:
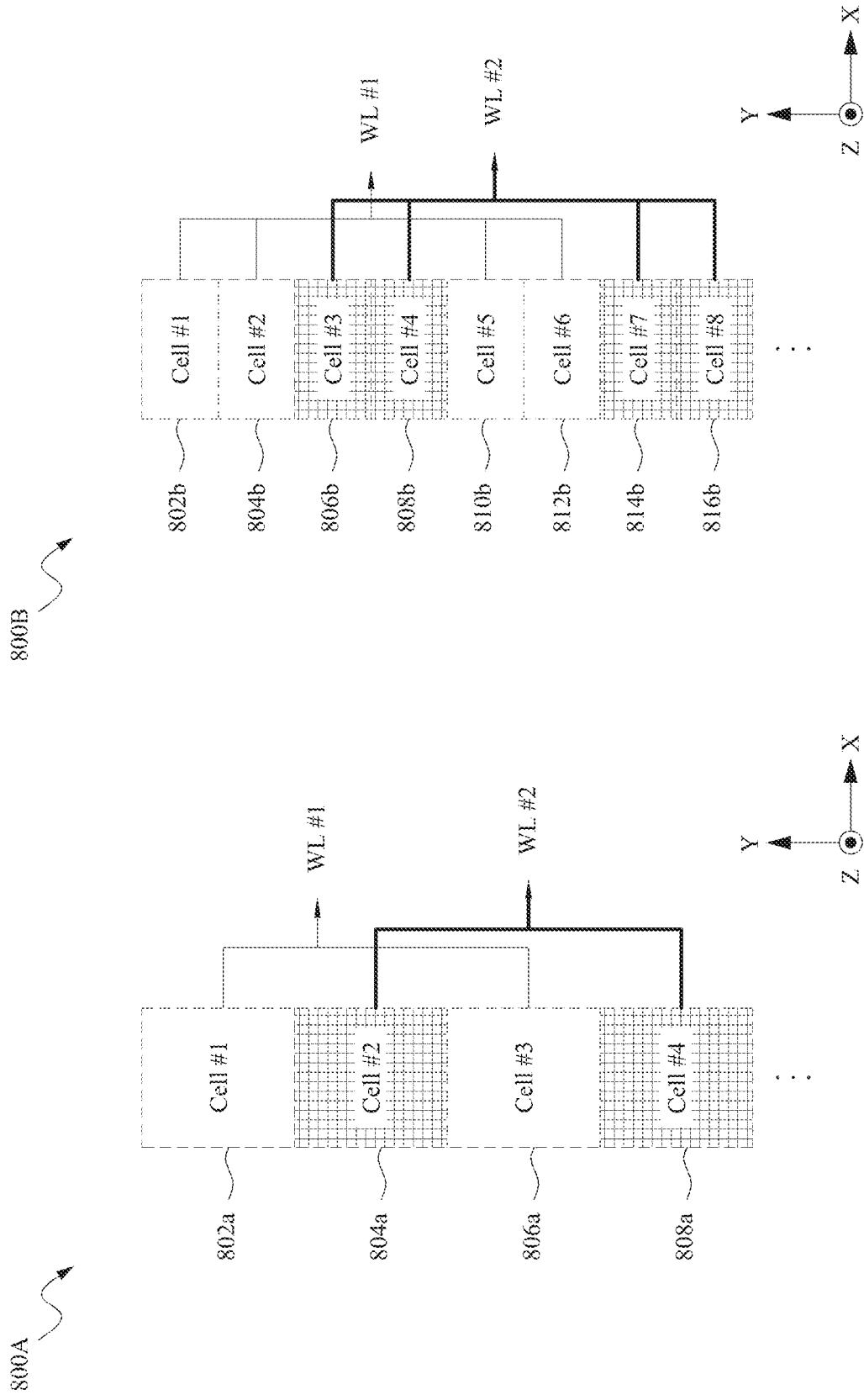

FIG. 8A is a diagram of integrated circuit 800A, simplified for ease of illustration.

Integrated circuit 800A is an array of cells 802a, 804a, 806a and 808a.

Integrated circuits 800A-800D are shown as including a single column and a plurality of rows.

Other number of columns or other number of rows for integrated circuit 800A-800D are within the scope of the present disclosure.

Integrated circuit 800A includes a cell 802a, a cell 804a, a cell 806a and a cell 808a. Cells 802a and 806a are configured to share word line WL #1. Cells 804a and 808a are configured to share word line WL #2.

In some embodiments, each of cell 802a and cell 806a correspond to cell 502a, and each of cell 804a and cell 808a correspond to cell 502b. In some embodiments, each of cell 802a and cell 806a correspond to cell 502b, and each of cell 804a and cell 808a correspond to cell 502a.

In some embodiments, each of cell 802a and cell 806a correspond to cell 602a, and each of cell 804a and cell 808a correspond to cell 602b. In some embodiments, each of cell 802a and cell 806a correspond to cell 602b, and each of cell 804a and cell 808a correspond to cell 602a.

In some embodiments, each of cell 802a and cell 806a correspond to cell 702a, and each of cell 804a and cell 808a correspond to cell 702b. In some embodiments, each of cell 802a and cell 806a correspond to cell 702b, and each of cell 804a and cell 808a correspond to cell 702a.

In some embodiments, integrated circuit 800A achieves one or more of the benefits described herein.

Other configurations or arrangements of integrated circuit 800A are within the scope of the present disclosure.

Integrated circuit 800A is a variation of integrated circuit 500 of FIGS. 5A-5C and integrated circuit 600 of FIGS. 6A-6B, and similar detailed description is omitted for brevity. For example, integrated circuit 800A is a hybrid of cell 502a of FIGS. 5A-5C, and cell 602b of FIGS. 6A-6B, and similar detailed description is omitted for brevity.

FIG. 8B is a diagram of integrated circuit 800B, simplified for ease of illustration.

Integrated circuit 800B is an array of cells 802b, 804b, 806b, 808b, 810b and 812b.

Integrated circuit 800B includes a cell 802b, a cell 804b, a cell 806b, a cell 808b, a cell 810b, a cell 812b, a cell 814b, a cell 816b. Cells 802b, 804b, 810b and 812b are configured to share word line WL #1. Cells 806b, 808b, 814b and 816b are configured to share word line WL #2.

In some embodiments, each of cell 802b, cell 804b, cell 810b and cell 812b correspond to cell 502a, and each of cell 806b, cell 808b, cell 814b and cell 816b correspond to cell 502b. In some embodiments, each of cell 802b, cell 804b, cell 810b and cell 812b correspond to cell 502b, and each of cell 806b, cell 808b, cell 814b and cell 816b correspond to cell 502a.

In some embodiments, each of cell 802b, cell 804b, cell 810b and cell 812b correspond to cell 602a, and each of cell 806b, cell 808b, cell 814b and cell 816b correspond to cell 602b. In some embodiments, each of cell 802b, cell 804b, cell 810b and cell 812b correspond to cell 602b, and each of cell 806b, cell 808b, cell 814b and cell 816b correspond to cell 602a.

In some embodiments, each of cell 802b, cell 804b, cell 810b and cell 812b correspond to cell 702a, and each of cell 806b, cell 808b, cell 814b and cell 816b correspond to cell 702b. In some embodiments, each of cell 802b, cell 804b, cell 810b and cell 812b correspond to cell 702b, and each of cell 806b, cell 808b, cell 814b and cell 816b correspond to cell 702a.

In some embodiments, integrated circuit 800B achieves one or more of the benefits described herein.

Other configurations or arrangements of integrated circuit 800B are within the scope of the present disclosure.

FIG. 8C is a diagram of integrated circuit 800C, simplified for ease of illustration.

Integrated circuit 800C is an array of cells 802c, 804c, 806c, 808c, 810c, 812c, 814c and 816c.

Integrated circuit 800C includes a cell 802c, a cell 804c, a cell 806c, a cell 808c, a cell 810c, a cell 812c, a cell 814c, a cell 816c. Cells 804c, 808c, 810c and 812c are configured to share word line WL #1. Cells 802c, 806c, 814c and 816c are configured to share word line WL #2.

In some embodiments, each of cell 804c, cell 808c, cell 810c and cell 812c correspond to cell 502a, and each of cell 802c, cell 806c, cell 814c and cell 816c correspond to cell 502b. In some embodiments, each of cell 804c, cell 808c, cell 810c and cell 812c correspond to cell 502b, and each of cell 802c, cell 806c, cell 814c and cell 816c correspond to cell 502a.

In some embodiments, each of cell 804c, cell 808c, cell 810c and cell 812c correspond to cell 602a, and each of cell 802c, cell 806c, cell 814c and cell 816c correspond to cell 602b. In some embodiments, each of cell 804c, cell 808c, cell 810c and cell 812c correspond to cell 602b, and each of cell 802c, cell 806c, cell 814c and cell 816c correspond to cell 602a.

In some embodiments, each of cell 804c, cell 808c, cell 810c and cell 812c correspond to cell 702a, and each of cell 802c, cell 806c, cell 814c and cell 816c correspond to cell 702b. In some embodiments, each of cell 804c, cell 808c, cell 810c and cell 812c correspond to cell 702b, and each of cell 802c, cell 806c, cell 814c and cell 816c correspond to cell 702a.

In some embodiments, integrated circuit 800C achieves one or more of the benefits described herein.

Other configurations or arrangements of integrated circuit 800C are within the scope of the present disclosure.

FIG. 8D is a diagram of integrated circuit 800D, simplified for case of illustration.

Integrated circuit 800D is an array of cells 802d, 804d, 806d, 808d, 810d, 812d, 814d and 816d.

Integrated circuit 800D includes a cell 802d, a cell 804d, a cell 806d, a cell 808d, a cell 810d, a cell 812d, a cell 814d, a cell 816d. Cells 802d, 804d, 806d and 808d are configured to share word line WL #1. Cells 810d, 812d, 814d and 816d are configured to share word line WL #2.

In some embodiments, each of cell 802d, cell 804d, cell 806d and cell 808d correspond to cell 502a, and each of cell 810d, cell 812d, cell 814d and cell 816d correspond to cell 502b. In some embodiments, each of cell 802d, cell 804d, cell 806d and cell 808d correspond to cell 502b, and each of cell 810d, cell 812d, cell 814d and cell 816d correspond to cell 502a.

In some embodiments, each of cell 802d, cell 804d, cell 806d and cell 808d correspond to cell 602a, and each of cell 810d, cell 812d, cell 814d and cell 816d correspond to cell 602b. In some embodiments, each of cell 802d, cell 804d, cell 806d and cell 808d correspond to cell 602b, and each of cell 810d, cell 812d, cell 814d and cell 816d correspond to cell 602a.

In some embodiments, each of cell 802d, cell 804d, cell 806d and cell 808d correspond to cell 702a, and each of cell 810d, cell 812d, cell 814d and cell 816d correspond to cell 702b. In some embodiments, each of cell 802d, cell 804d, cell 806d and cell 808d correspond to cell 702b, and each of cell 810d, cell 812d, cell 814d and cell 816d correspond to cell 702a.

In some embodiments, integrated circuit 800D achieves one or more of the benefits described herein.

Other configurations or arrangements of integrated circuit 800D are within the scope of the present disclosure.

FIG. 9 is a functional flow chart of a method 900 of manufacturing an IC device, in accordance with some embodiments. It is understood that additional operations may be performed before, during, and/or after the method 900 depicted in FIG. 9, and that some other processes may only be briefly described herein.

In some embodiments, other order of operations of method 900-1100 is within the scope of the present disclosure. Method 900-1100 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least method 900, 1000 or 1100 is not performed.

In some embodiments, method 900 is an embodiment of operation 1004 of method 1000. In some embodiments, the methods 900-1100 are usable to manufacture or fabricate at least integrated circuit 100, 200, 400, 500, 600, 700, 800A, 800B, 800C or 800D, or an integrated circuit with similar features as at least layout design 300.

In some embodiments, other order of operations of methods 900-1100 are within the scope of the present disclosure. Methods 900-1100 include exemplary operations, but the operations are not necessarily performed in the order shown. Operations may be added, replaced, changed order, and/or eliminated as appropriate, in accordance with the spirit and scope of disclosed embodiments.

In operation 902 of method 900, a first set of transistors and a second set of transistors are fabricated on a front-side 303a of a semiconductor wafer or substrate. In some embodiments, the first set of transistors or the second set of transistors of method 900 includes one or more transistors in at least the set of active regions 402 or 404. In some embodiments, the first set of transistors or the second set of transistors of method 900 includes one or more transistors described herein.

In some embodiments, operation 902 includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1\times10^{12}$ atoms/cm$^3$ to $1\times10^{14}$ atoms/cm$^3$.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/cm$^2$ to about $1\times10^{12}$ atoms/cm$^2$.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/ or combination thereof. In some embodiments, source/drain features are further exposed to annealing processes after forming source/drain features and/or after the subsequent doping process.

In some embodiments, operation 902 further includes operation 902a (not shown). In some embodiments, operation 902a includes forming contacts (e.g., set of contacts 410, 412, 414, 416, 418) of the first set of transistors or the second set of transistors. In some embodiments, operation 902a further includes fabricating a first set of contacts on the front-side of the substrate, thereby electrically coupling a first source/drain of a first transistor of the first or second set of transistors and a first source/drain of a second transistor of the first or second set of transistors.

In some embodiments, operation 902 further includes forming a gate region of the first set of transistors or the second set of transistors. In some embodiments, the gate regions of method 900 include the set of gates 406 or 408.

In some embodiments, the gate region is between the drain region and the source region. In some embodiments, the gate region is over the first well and the substrate. In some embodiments, fabricating the gate regions of operation 902 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 904 of method 900, a first set of vias are formed on the front-side 403a of the thinned wafer or substrate on a first level (e.g., VD or VG). In some embodiments, the first set of vias of method 900 includes one or more portions at least the set of vias 420, 424 or 524.

In some embodiments, operation 904 includes forming a first set of self-aligned contacts (SACs) in the insulating layer over the front-side 403a of the wafer. In some embodiments, the first set of vias is electrically coupled to at least the first set of transistors or the second set of transistors.

In operation 906 of method 900, a first conductive material is deposited on the front-side 403a of the substrate on a first metal level thereby forming a first set of conductors on the front-side 403a of the wafer or substrate on a first metal level (e.g., M0).

In some embodiments, operation 906 includes at least depositing a first set of conductive regions over the front-side 403a of the integrated circuit. In some embodiments, the first set of conductors of method 900 includes one or more portions of at least the set of conductors 430, 530, 531, 630, 631, 730 or 731.

In operation 908 of method 900, thinning is performed on the back-side 403b of the wafer or substrate. In some embodiments, operation 904 includes a thinning process performed on the back-side 403b of the semiconductor wafer or substrate. In some embodiments, the thinning process includes a grinding operation and a polishing operation (such as chemical mechanical polishing (CMP)) or other suitable processes. In some embodiments, after the thinning process, a wet etching operation is performed to remove defects formed on the back-side 403b of the semiconductor wafer or substrate.

In operation 910 of method 900, a second set of vias are formed on the back-side 403b of the thinned wafer or substrate on a second level (e.g., BVD or BVG). In some embodiments, the second set of vias of method 900 includes one or more portions at least the set of vias 422, 426 or 526.

In some embodiments, operation 910 includes forming a second set of self-aligned contacts (SACs) in the insulating layer over the back-side 403b of the wafer. In some embodiments, the second set of vias is electrically coupled to at least the first set of transistors or the second set of transistors.

In operation 912 of method 900, a second conductive material is deposited on the back-side 403b of the substrate on a second metal level thereby forming a second set of conductors on the back-side 403b of the wafer or substrate on a second metal level (e.g., BM0).

In some embodiments, operation 912 includes at least depositing a second set of conductive regions over the back-side 403b of the integrated circuit. In some embodiments, the second set of conductors of method 900 includes one or more portions of at least the set of conductors 432, 532, 533, 632, 633, 732 or 733.

In operation 914 of method 900, a third set of vias are formed on the front-side 403a of the thinned wafer or substrate on a third level (e.g., V0). In some embodiments, the third set of vias of method 900 includes one or more portions at least the set of vias 450.

In some embodiments, operation 914 includes forming a third set of self-aligned contacts (SACs) in the insulating layer over the front-side 403a of the wafer. In some embodiments, the third set of vias is electrically coupled to at least the first set of transistors or the second set of transistors.

In operation 916 of method 900, a third conductive material is deposited on the front-side 403a of the substrate on a third metal level thereby forming a third set of conductors on the front-side 403a of the wafer or substrate on a third metal level (e.g., M1).

In some embodiments, operation 916 includes at least depositing a third set of conductive regions over the front-side 403a of the integrated circuit. In some embodiments, the third set of conductors of method 900 includes one or more portions of at least the set of conductors 440, 540, 640 or 740.

In operation 918 of method 900, a fourth set of vias are formed on the back-side 403b of the thinned wafer or substrate on a fourth level (e.g., BV0). In some embodiments, the fourth set of vias of method 900 includes one or more portions at least the set of vias 452.

In some embodiments, operation 918 includes forming a fourth set of self-aligned contacts (SACs) in the insulating layer over the back-side 403b of the wafer. In some embodiments, the fourth set of vias is electrically coupled to at least the first set of transistors or the second set of transistors.

In operation 920 of method 900, a fourth conductive material is deposited on the back-side 403b of the substrate on a fourth metal level thereby forming a fourth set of conductors on the back-side 403b of the wafer or substrate on a fourth metal level (e.g., BM1).

In some embodiments, operation 920 includes at least depositing a fourth set of conductive regions over the back-side 403b of the integrated circuit. In some embodiments, the fourth set of conductors of method 900 includes one or more portions of at least the set of conductors 442, 542, 642 or 742.

In some embodiments, one or more of operations 902, 904, 906, 910, 912, 914, 916, 918 or 920 of method 900 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 13:
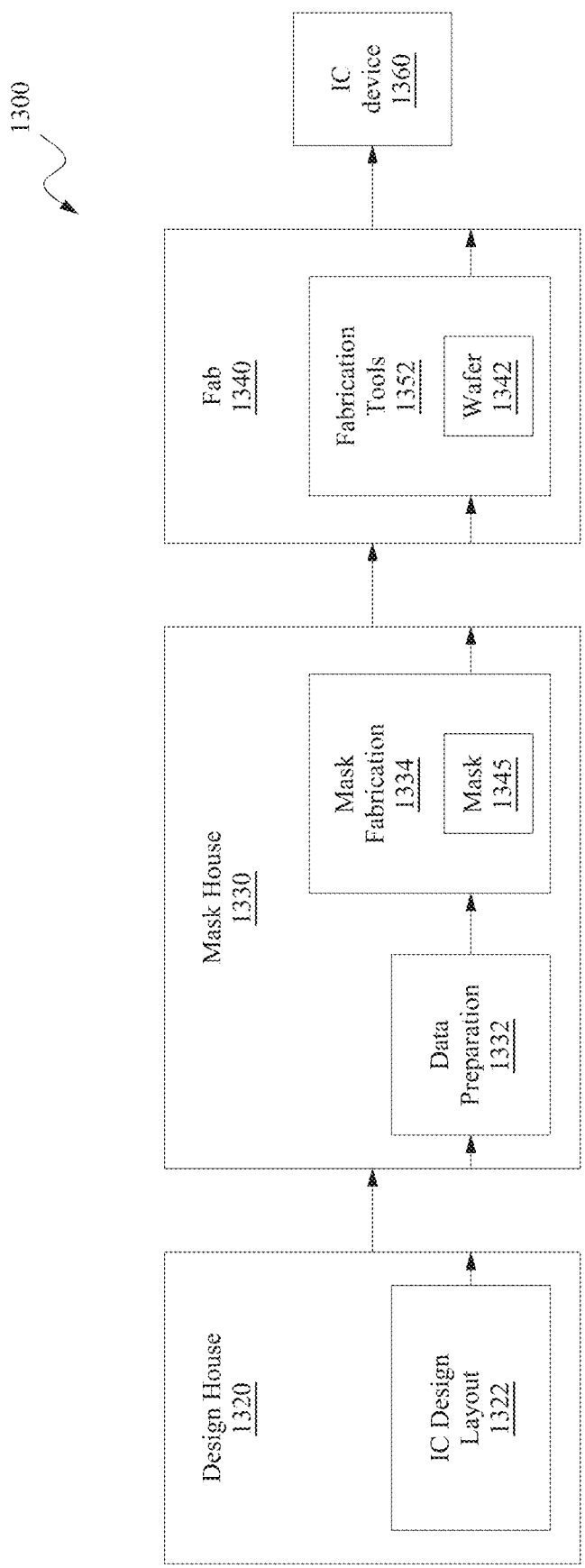
FIG. 13 is a block diagram of an IC manufacturing system, and an IC manufacturing flow associated therewith, in accordance with at least one embodiment of the present disclosure.

In some embodiments, at least one or more operations of method 900 is performed by system 1300 of FIG. 13. In some embodiments, at least one method(s), such as method 900 discussed above, is performed in whole or in part by at least one manufacturing system, including system 1300. One or more of the operations of method 900 is performed by IC fab 1340 (FIG. 13) to fabricate IC device 1360. In some embodiments, one or more of the operations of method 900 is performed by fabrication tools 1352 to fabricate wafer 1342.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 906, 912, 916 or 920, the conductive material is planarized to provide a level surface for subsequent steps.

In some embodiments, one or more of the operations of method 900, 1000 or 1100 is not performed.

One or more of the operations of methods 1000-1100 is performed by a processing device configured to execute instructions for manufacturing an integrated circuit, such as at least integrated circuit 100, 200, 400, 500, 600, 700, 800A, 800B, 800C or 800D. In some embodiments, one or more operations of methods 1000-1100 is performed using a same processing device as that used in a different one or more operations of methods 1000-1100. In some embodiments, a different processing device is used to perform one or more operations of methods 1000-1100 from that used to perform a different one or more operations of methods 1000-1100. In some embodiments, other order of operations of method 900, 1000 or 1100 is within the scope of the present disclosure. Method 900, 1000 or 1100 includes exemplary operations, but the operations are not necessarily performed in the order shown. Operations in method 900, 1000 or 1100 may be added, replaced, changed order, and/or eliminated as appropriate, in accordance with the spirit and scope of disclosed embodiments.

FIG. 10 is a flowchart of a method 1000 of forming or manufacturing an integrated circuit in accordance with some embodiments. It is understood that additional operations may be performed before, during, and/or after the method 1000 depicted in FIG. 10, and that some other operations may only be briefly described herein. In some embodiments, the method 1000 is usable to form integrated circuits, such as at least integrated circuit 100, 200, 400, 500, 600, 700, 800A, 800B, 800C or 800D. In some embodiments, the method 1000 is usable to form integrated circuits having similar features and similar structural relationships as one or more of layout design 300.

In operation 1002 of method 1000, a layout design of an integrated circuit is generated. Operation 1002 is performed by a processing device (e.g., processor 1202 (FIG. 12)) configured to execute instructions for generating a layout design. In some embodiments, the layout design of method 1000 includes one or more patterns of at least layout design 300, or one or more features similar to at least integrated circuit 100, 200, 400, 500, 600, 700, 800A, 800B, 800C or 800D. In some embodiments, the layout design of the present application is in a graphic database system (GDSII) file format. In some embodiments, operation 1002 corresponds to method 1100 of FIG. 11.

In operation 1004 of method 1000, the integrated circuit is manufactured based on the layout design. In some embodiments, operation 1004 of method 1000 comprises manufacturing at least one mask based on the layout design, and manufacturing the integrated circuit based on the at least one mask. In some embodiments, operation 1004 corresponds to method 900 of FIG. 9.

Figure 11:
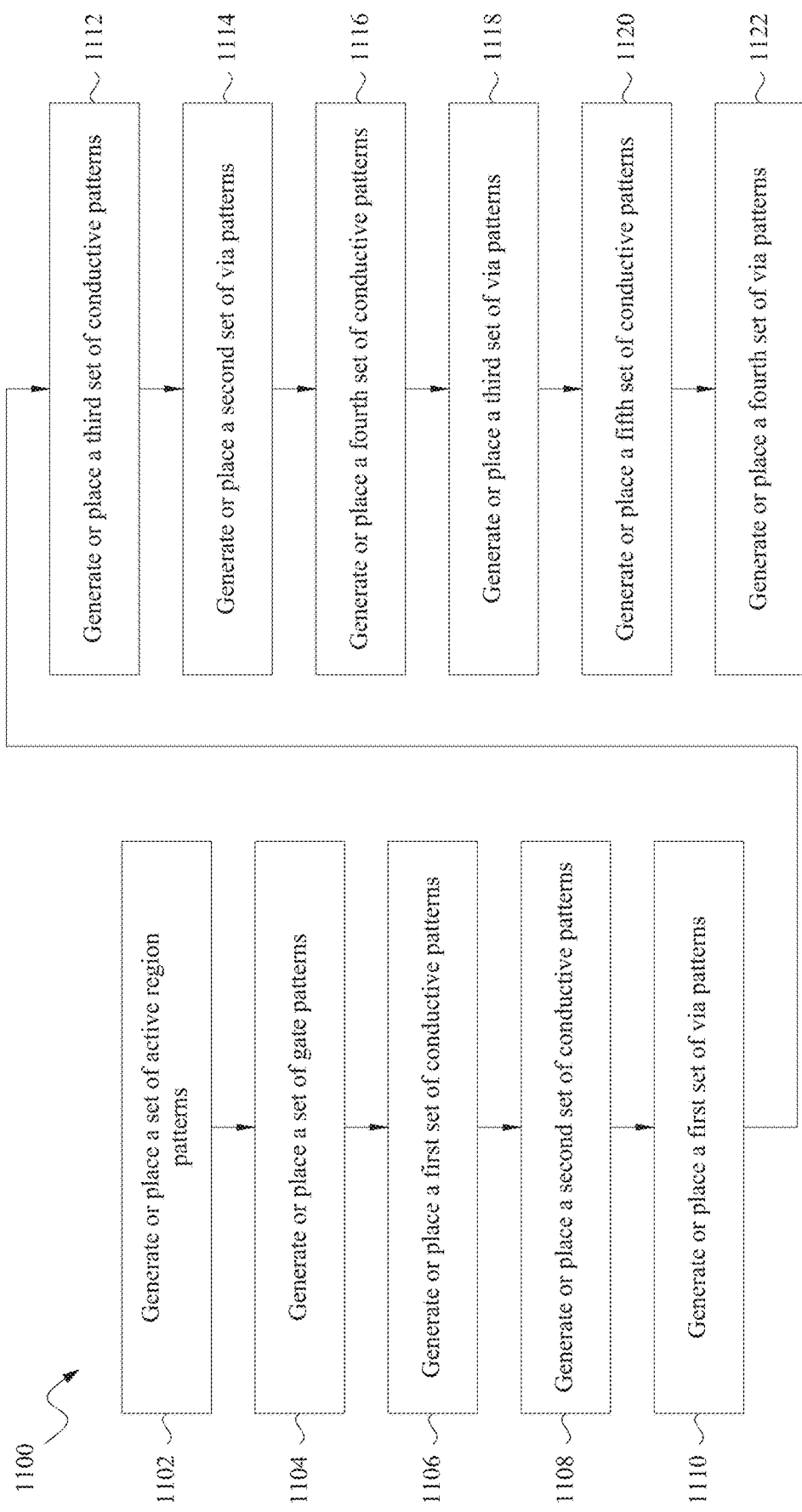
FIG. 11 is a flowchart of a method of generating a layout design of an integrated circuit, in accordance with some embodiments.

FIG. 11 is a flowchart of a method 1100 of generating a layout design of an integrated circuit, in accordance with some embodiments. It is understood that additional operations may be performed before, during, and/or after the method 1100 depicted in FIG. 11, and that some other processes may only be briefly described herein. In some embodiments, method 1100 is an embodiment of operation 1002 of method 1000. In some embodiments, method 1100 is usable to generate one or more layout patterns of at least layout design 300, or one or more features similar to at least integrated circuit 100, 200, 400, 500, 600, 700, 800A, 800B, 800C or 800D.

In some embodiments, method 1100 is usable to generate one or more layout patterns having structural relationships including alignment, lengths and widths, as well as configurations and layers of at least layout design 300, or one or more features similar to at least integrated circuit 100, 200,

400, 500, 600, 700, 800A, 800B, 800C or 800D, and similar detailed description will not be described in FIG. 11, for brevity.

In operation 1102 of method 1100, a set of active region patterns is generated or placed on the layout design. In some embodiments, the set of active region patterns of method 1100 includes at least portions of one or more patterns of set of active region patterns 302 or 304. In some embodiments, the set of active region patterns of method 1100 includes one or more regions similar to the set of active regions 402 or 404.

In operation 1104 of method 1100, a set of gate patterns is generated or placed on the layout design. In some embodiments, the set of gate patterns of method 1100 includes at least portions of one or more patterns of set of gate patterns 306 or 308. In some embodiments, the set of active gate patterns of method 1100 includes one or more regions similar to the set of gates 406 or 408.

In operation 1106 of method 1100, a first set of conductive patterns is generated or placed on the layout design. In some embodiments, the first set of conductive patterns of method 1100 includes at least portions of one or more patterns of the set of contact patterns 310 or 312. In some embodiments, the first set of conductive patterns of method 1100 includes at least portions of one or more patterns of the set of conductive patterns 316 or 318. In some embodiments, the first set of conductive patterns of method 1100 includes one or more patterns similar to the set of contacts 410 or 412. In some embodiments, the first set of conductive patterns of method 1100 includes one or more patterns similar to the set of contacts 414. In some embodiments, the first set of conductive patterns of method 1100 includes one or more patterns similar to the set of contacts 416 or 418. In some embodiments, the first set of conductive patterns of method 1100 includes one or more patterns or similar patterns in the MD or BMD layer.

In operation 1108 of method 1100, a second set of conductive patterns is generated or placed on the layout design. In some embodiments, the second set of conductive patterns of method 1100 includes at least portions of one or more patterns of at least the set of conductive patterns 330. In some embodiments, the second set of conductive patterns of method 1100 includes one or more conductive patterns similar to at least the set of conductors 430, 530, 531, 630, 631, 730 or 731. In some embodiments, the second set of conductive patterns of method 1100 includes one or more patterns or similar conductors in the M0 layer.

In operation 1110 of method 1100, a first set of via patterns is generated or placed on the layout design. In some embodiments, the first set of via patterns of method 1100 includes at least portions of one or more patterns of set of via patterns 320 or 324. In some embodiments, the first set of via patterns of method 1100 includes one or more via patterns similar to at least the set of vias 420, 424 or 524. In some embodiments, the first set of via patterns of method 1100 includes one or more patterns or similar vias in the VG or VD layer.

In operation 1112 of method 1100, a third set of conductive patterns is generated or placed on the layout design. In some embodiments, the third set of conductive patterns of method 1100 includes at least portions of one or more patterns of at least the set of conductive patterns 332. In some embodiments, the third set of conductive patterns of method 1100 includes one or more conductive patterns similar to at least the set of conductors 432, 532, 533, 632, 633, 732 or 733. In some embodiments, the third set of conductive patterns of method 1100 includes one or more patterns or similar conductors in the BM0 layer.

In operation 1114 of method 1100, a second set of via patterns is generated or placed on the layout design. In some embodiments, the second set of via patterns of method 1100 includes at least portions of one or more patterns of set of via patterns 322 or 326. In some embodiments, the second set of via patterns of method 1100 includes one or more via patterns similar to at least the set of vias 422, 426 or 526. In some embodiments, the second set of via patterns of method 1100 includes one or more patterns or similar vias in the BVG or BVD layer.

In operation 1116 of method 1100, a fourth set of conductive patterns is generated or placed on the layout design. In some embodiments, the fourth set of conductive patterns of method 1100 includes at least portions of one or more patterns of at least the set of conductive patterns 340. In some embodiments, the fourth set of conductive patterns of method 1100 includes one or more conductive patterns similar to at least the set of conductors 440, 540, 640 or 740. In some embodiments, the fourth set of conductive patterns of method 1100 includes one or more patterns or similar conductors in the M1 layer.

In operation 1118 of method 1100, a third set of via patterns is generated or placed on the layout design. In some embodiments, the third set of via patterns of method 1100 includes at least portions of one or more patterns of set of via patterns 350. In some embodiments, the third set of via patterns of method 1100 includes one or more via patterns similar to at least the set of vias 450. In some embodiments, the third set of via patterns of method 1100 includes one or more patterns or similar vias in the V0 layer.

In operation 1120 of method 1100, a fifth set of conductive patterns is generated or placed on the layout design. In some embodiments, the fifth set of conductive patterns of method 1100 includes at least portions of one or more patterns of at least the set of conductive patterns 342. In some embodiments, the fifth set of conductive patterns of method 1100 includes one or more conductive patterns similar to at least the set of conductors 442, 542, 642 or 742. In some embodiments, the fifth set of conductive patterns of method 1100 includes one or more patterns or similar conductors in the BM1 layer.

In operation 1122 of method 1100, a fourth set of via patterns is generated or placed on the layout design. In some embodiments, the fourth set of via patterns of method 1100 includes at least portions of one or more patterns of set of via patterns 352. In some embodiments, the fourth set of via patterns of method 1100 includes one or more via patterns similar to at least the set of vias 452. In some embodiments, the fourth set of via patterns of method 1100 includes one or more patterns or similar vias in the BV0 layer.

Figure 12:
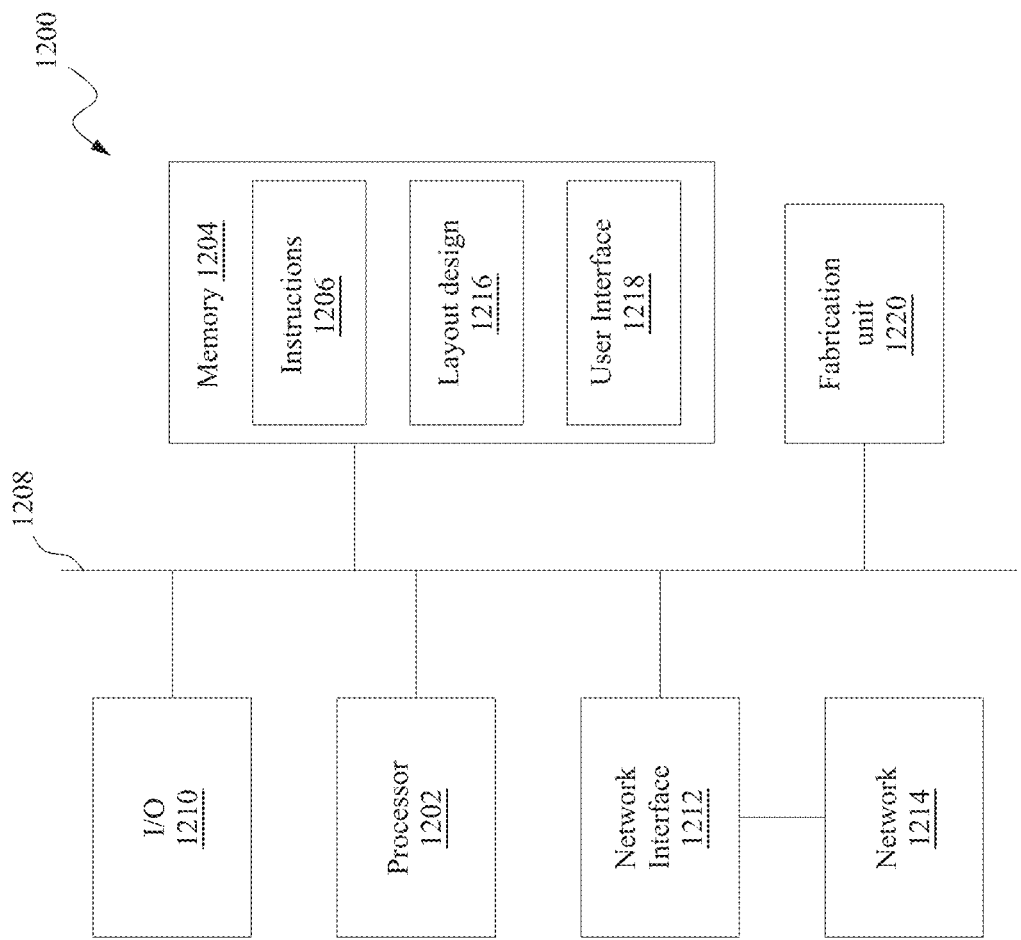
FIG. 12 is a schematic view of a system for designing an IC layout design and manufacturing an IC circuit, in accordance with some embodiments.

FIG. 12 is a schematic view of a system 1200 for designing an IC layout design and manufacturing an IC circuit in accordance with some embodiments.

In some embodiments, system 1200 generates or places one or more IC layout designs described herein. System 1200 includes a hardware processor 1202 and a non-transitory, computer readable storage medium 1204 (e.g., memory 1204) encoded with, i.e., storing, the computer program code 1206, i.e., a set of executable instructions 1206. Computer readable storage medium 1204 is configured for interfacing with manufacturing machines for producing the integrated circuit. The processor 1202 is electrically coupled to the computer readable storage medium 1204 via a bus 1208. The processor 1202 is also electrically coupled to an I/O interface 1210 by bus 1208. A network interface 1212 is also electrically connected to the processor 1202 via bus 1208. Network interface 1212 is connected to a network 1214, so that processor 1202 and computer readable storage medium 1204 are capable of connecting to external elements via network 1214. The processor 1202 is configured to execute the computer program code 1206 encoded in the computer readable storage medium 1204 in order to cause system 1200 to be usable for performing a portion or all of the operations as described in method 1000-1100.

In some embodiments, the processor 1202 is a central processing unit (CPU), a multi-processor, a distributed processing system, an application specific integrated circuit (ASIC), and/or a suitable processing unit.

In some embodiments, the computer readable storage medium 1204 is an electronic, magnetic, optical, electromagnetic, infrared, and/or a semiconductor system (or apparatus or device). For example, the computer readable storage medium 1204 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1204 includes a compact disk-read only memory (CD-ROM), a compact disk-read/write (CD-R/W), and/or a digital video disc (DVD).

In some embodiments, the storage medium 1204 stores the computer program code 1206 configured to cause system 1200 to perform method 1000-1100. In some embodiments, the storage medium 1204 also stores information needed for performing method 1000-1100 as well as information generated during performing method 1000-1100, such as layout design 1216, user interface 1218 and fabrication unit 1220, and/or a set of executable instructions to perform the operation of method 1000-1100. In some embodiments, layout design 1216 comprises one or more of layout patterns of at least layout design 300, or features similar to at least integrated circuit 100, 200, 400, 500, 600, 700, 800A, 800B, 800C or 800D.

In some embodiments, the storage medium 1204 stores instructions (e.g., computer program code 1206) for interfacing with manufacturing machines. The instructions (e.g., computer program code 1206) enable processor 1202 to generate manufacturing instructions readable by the manufacturing machines to effectively implement method 1000-1100 during a manufacturing process.

System 1200 includes I/O interface 1210. I/O interface 1210 is coupled to external circuitry. In some embodiments, I/O interface 1210 includes a keyboard, keypad, mouse, trackball, trackpad, and/or cursor direction keys for communicating information and commands to processor 1202.

System 1200 also includes network interface 1212 coupled to the processor 1202. Network interface 1212 allows system 1200 to communicate with network 1214, to which one or more other computer systems are connected. Network interface 1212 includes wireless network interfaces such as BLUETOOTH, WIFI, WIMAX. GPRS, or WCDMA; or wired network interface such as ETHERNET, USB, or IEEE-2094. In some embodiments, method 1000-1100 is implemented in two or more systems 1200, and information such as layout design, and user interface are exchanged between different systems 1200 by network 1214.

System 1200 is configured to receive information related to a layout design through I/O interface 1210 or network interface 1212. The information is transferred to processor 1202 by bus 1208 to determine a layout design for producing at least integrated circuit 100, 200, 400, 500, 600, 700, 800A, 800B, 800C or 800D. The layout design is then stored in computer readable medium 1204 as layout design 1216. System 1200 is configured to receive information related to a user interface through I/O interface 1210 or network interface 1212. The information is stored in computer readable medium 1204 as user interface 1218. System 1200 is configured to receive information related to a fabrication unit 1220 through I/O interface 1210 or network interface 1212. The information is stored in computer readable medium 1204 as fabrication unit 1220. In some embodiments, the fabrication unit 1220 includes fabrication information utilized by system 1200. In some embodiments, the fabrication unit 1220 corresponds to mask fabrication 1334 of FIG. 13.

In some embodiments, method 1000-1100 is implemented as a standalone software application for execution by a processor. In some embodiments, method 1000-1100 is implemented as a software application that is a part of an additional software application. In some embodiments, method 1000-1100 is implemented as a plug-in to a software application. In some embodiments, method 1000-1100 is implemented as a software application that is a portion of an EDA tool. In some embodiments, method 1000-1100 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1000-1100 is implemented by a manufacturing device to manufacture an integrated circuit using a set of masks manufactured based on one or more layout designs generated by system 1200. In some embodiments, system 1200 is a manufacturing device configured to manufacture an integrated circuit using a set of masks manufactured based on one or more layout designs of the present disclosure. In some embodiments, system 1200 of FIG. 12 generates layout designs of an integrated circuit that are smaller than other approaches. In some embodiments, system 1200 of FIG. 12 generates layout designs of integrated circuit structure that occupy less area and provide better routing resources than other approaches.

FIG. 13 is a block diagram of an integrated circuit (IC) manufacturing system 1300, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1300.

In FIG. 13, IC manufacturing system 1300 (hereinafter "system 1300") includes entities, such as a design house 1320, a mask house 1330, and an IC manufacturer/fabricator ("fab") 1340, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1320, mask house 1330, and IC fab 1340 is owned by a single larger company. In some embodiments, one or more of design house 1320, mask house 1330, and IC fab 1340 coexist in a common facility and use common resources.

Design house (or design team) 1320 generates an IC design layout 1322. IC design layout 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout 1322 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout 1322. The design procedure includes one or more of logic design, physical design or place and route. IC design layout 1322 is presented in one or more data files having information of the geometrical patterns. For example, IC design layout 1322 can be expressed in a GDSII file format or DFII file format.

Mask house 1330 includes data preparation 1332 and mask fabrication 1334. Mask house 1330 uses IC design layout 1322 to manufacture one or more masks 1345 to be used for fabricating the various layers of IC device 1360 according to IC design layout 1322. Mask house 1330 performs mask data preparation 1332, where IC design layout 1322 is translated into a representative data file (RDF). Mask data preparation 1332 provides the RDF to mask fabrication 1334. Mask fabrication 1334 includes a mask writer. A mask writer converts the RDF to an image on a substrate, such as a mask (reticle) 1345 or a semiconductor wafer 1342. The IC design layout 1322 is manipulated by mask data preparation 1332 to comply with particular characteristics of the mask writer and/or requirements of IC fab 1340. In FIG. 13, mask data preparation 1332 and mask fabrication 1334 are illustrated as separate elements. In some embodiments, mask data preparation 1332 and mask fabrication 1334 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1334, which may undo part of the modifications performed by OPC in order to meet mask creation rules.

In some embodiments, mask data preparation 1332 includes lithography process checking (LPC) that simulates processing that will be implemented by IC fab 1340 to fabricate IC device 1360. LPC simulates this processing based on IC design layout 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1322.

It should be understood that the above description of mask data preparation 1332 has been simplified for the purposes of clarity. In some embodiments, data preparation 1332 includes additional features such as a logic operation (LOP) to modify the IC design layout according to manufacturing rules. Additionally, the processes applied to IC design layout 1322 during data preparation 1332 may be executed in a variety of different orders.

After mask data preparation 1332 and during mask fabrication 1334, a mask 1345 or a group of masks 1345 are fabricated based on the modified IC design layout 1322. In some embodiments, mask fabrication 1334 includes performing one or more lithographic exposures based on IC design layout 1322. In some embodiments, an electron-beam (e-beam) or a mechanism of multiple e-beams is used to form a pattern on a mask (photomask or reticle) 1345 based on the modified IC design layout 1322. The mask 1345 can be formed in various technologies. In some embodiments, the mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1345 includes a transparent substrate (e.g., fused quartz) and an opaque material (e.g., chromium) coated in the opaque regions of the binary mask. In another example, the mask 1345 is formed using a phase shift technology. In the phase shift mask (PSM) version of mask 1345, various features in the pattern formed on the mask are configured to have proper phase difference to enhance the resolution and imaging quality. In various examples, the phase shift mask can be attenuated PSM or alternating PSM. The mask(s) generated by mask fabrication 1334 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1340 is an IC fabrication entity that includes one or more manufacturing facilities for the fabrication of a variety of different IC products. In some embodiments, IC Fab 1340 is a semiconductor foundry. For example, there may be a manufacturing facility for the front end fabrication of a plurality of IC products (front-end-of-line (FEOL)

fabrication), while a second manufacturing facility may provide the back end fabrication for the interconnection and packaging of the IC products (back-end-of-line (BEOL) fabrication), and a third manufacturing facility may provide other services for the foundry entity.

IC fab 1340 includes wafer fabrication tools 1352 (hereinafter "fabrication tools 1352") configured to execute various manufacturing operations on semiconductor wafer 1342 such that IC device 1360 is fabricated in accordance with the mask(s), e.g., mask 1345. In various embodiments, fabrication tools 1352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1340 uses mask(s) 1345 fabricated by mask house 1330 to fabricate IC device 1360. Thus, IC fab 1340 at least indirectly uses IC design layout 1322 to fabricate IC device 1360. In some embodiments, a semiconductor wafer 1342 is fabricated by IC fab 1340 using mask(s) 1345 to form IC device 1360. In some embodiments, the IC fabrication includes performing one or more lithographic exposures based at least indirectly on IC design layout 1322. Semiconductor wafer 1342 includes a silicon substrate or other proper substrate having material layers formed thereon. Semiconductor wafer 1342 further includes one or more of various doped regions, dielectric features, multilevel interconnects, and the like (formed at subsequent manufacturing steps).

System 1300 is shown as having design house 1320, mask house 1330 or IC fab 1340 as separate components or entities. However, it is understood that one or more of design house 1320, mask house 1330 or IC fab 1340 are part of the same component or entity.

One aspect of this description relates to a memory cell. In some embodiments, the memory cell includes a first transistor of a first type, and being configured as a first pass-gate transistor. In some embodiments, the memory cell further includes a second transistor of a second type different from the first type, and the second transistor being positioned below the first transistor. In some embodiments, the memory cell further includes a third transistor of the first type, and being configured as a second pass-gate transistor. In some embodiments, the memory cell further includes a fourth transistor of the second type, and being positioned below the third transistor. In some embodiments, the memory cell further includes a first inverter coupled to the first transistor and the third transistor. In some embodiments, the memory cell further includes a second inverter coupled to the first transistor, the third transistor and the first inverter. In some embodiments, the memory cell further includes a first word line extending in a first direction, being configured to supply a first word line signal, being on a first metal layer above a front-side of a substrate, and being coupled to the first transistor and the third transistor. In some embodiments, the memory cell further includes a second word line extending in the first direction, being configured to supply a second word line signal, being on a second metal layer different from the first metal layer, the second metal layer being below a back-side of the substrate opposite from the front-side of the substrate, and the second metal layer being coupled to the second transistor and the fourth transistor. In some embodiments, at least the first transistor, the second transistor, the third transistor or the fourth transistor are on the front-side of the substrate.

Another aspect of this description relates to a memory cell array. In some embodiments, the memory cell array includes a first memory cell. In some embodiments, the first memory cell includes a first transistor stack on a substrate. In some embodiments, the first transistor stack includes a first transistor of a first type, and being on a first level, and a second transistor of a second type different from the first type. In some embodiments, the second transistor is on a second level different from the first level. In some embodiments, the memory cell array further includes a second memory cell adjacent to the first memory cell. In some embodiments, the second memory cell includes a second transistor stack on the substrate. In some embodiments, the second transistor stack includes a third transistor of the first type, and being on the first level, and a fourth transistor of the second type, and being on the second level. In some embodiments, the memory cell array further includes a first word line extending in a first direction, being configured to supply a first word line signal to one of the first transistor or the second transistor, the first word line being on a first metal layer or a second metal layer different from the first metal layer, the first word line being coupled to the one of the first transistor or the second transistor, the first metal layer being above a front-side of the substrate, and the second metal layer being below a back-side of the substrate opposite from the front-side of the substrate. In some embodiments, the one of the first transistor or the second transistor is a first pass-gate transistor, and another of the first transistor or the second transistor is a first dummy transistor.

Still another aspect of this description relates to a method of fabricating an integrated circuit. In some embodiments, the method includes fabricating a first set of transistors and a second set of transistors in a front-side of a substrate, the first set of transistors being stacked above the second set of transistors. In some embodiments, the method further includes fabricating a first set of vias on the front-side of the substrate, the first set of vias being electrically coupled to at least the first set of transistors. In some embodiments, the method further includes depositing a first conductive material on the front-side of the substrate on a first metal level thereby forming a first set of conductors, the first set of conductors being electrically coupled to at least the first set of transistors by the first set of vias, the first set of transistors being configured to receive a first word line signal or a reference supply voltage from at least a first conductor of the first set of conductors from the front-side. In some embodiments, the method further includes performing thinning on a back-side of the substrate opposite from the front-side. In some embodiments, the method further includes fabricating a second set of vias on the back-side of the thinned substrate, the second set of vias being electrically coupled to at least the second set of transistors. In some embodiments, the method further includes depositing a second conductive material on the back-side of the thinned substrate on a second metal level thereby forming a second set of conductors, the second set of conductors being electrically coupled to at least the second set of transistors by the second set of vias, the second set of transistors being configured to receive a second word line signal or a supply voltage from at least a first conductor of the second set of conductors from the back-side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a first transistor of a first type, and being configured as a first pass-gate transistor;
a second transistor of a second type different from the first type, and the second transistor being positioned below the first transistor;
a third transistor of the first type, and being configured as a second pass-gate transistor;
a fourth transistor of the second type, and being positioned below the third transistor;
a first inverter coupled to the first transistor and the third transistor;
a second inverter coupled to the first transistor, the third transistor and the first inverter;
a first word line extending in a first direction, being configured to supply a first word line signal, being on a first metal layer above a front-side of a substrate, and being coupled to the first transistor and the third transistor; and
a second word line extending in the first direction, being configured to supply a second word line signal, being on a second metal layer different from the first metal layer, the second metal layer being below a back-side of the substrate opposite from the front-side of the substrate, and the second word line being coupled to the second transistor and the fourth transistor,
wherein at least the first transistor, the second transistor, the third transistor or the fourth transistor are on the front-side of the substrate.

2. The memory cell of claim 1, wherein
the first word line comprises:
a first conductor extending in the first direction, being coupled to the first transistor, and being on the first metal layer; and
a second conductor extending in the first direction, being coupled to the third transistor, being on the first metal layer, and being separated from the first conductor in a second direction; and
the second word line comprises:
a third conductor extending in the first direction, being coupled to the second transistor, and being on the second metal layer; and
a fourth conductor extending in the first direction, being coupled to the fourth transistor, being on the second metal layer, and being separated from the third conductor in the second direction.

3. The memory cell of claim 2, wherein
the first transistor comprises:
a first gate extending in the second direction different from the first direction, the first gate being overlapped by the first conductor;
the second transistor comprises:
a second gate extending in the second direction, being below the first gate, and being above the second conductor;
the third transistor comprises:

a third gate extending in the second direction and being separated from the first gate in the second direction, the third gate being overlapped by the third conductor; and
the fourth transistor comprises:
a fourth gate extending in the second direction, being separated from the second gate in the second direction, being below the third gate, and being above the fourth conductor.

4. The memory cell of claim 3, further comprising:
a first via electrically coupling the first conductor and the first gate together, the first via being between the first conductor and the first gate;
a second via electrically coupling the second conductor and the third gate together, the second via being between the second conductor and the third gate;
a third via electrically coupling the third conductor and the second gate together, the third via being between the third conductor and the second gate; and
a fourth via electrically coupling the fourth conductor and the fourth gate together, the fourth via being between the fourth conductor and the fourth gate.

5. The memory cell of claim 4, wherein
the first word line further comprises:
a fifth conductor extending in the second direction, being coupled to the first conductor and the second conductor, overlapping the first conductor and the second conductor, and being on a third metal layer different from the first metal layer and the second metal layer; and
the second word line comprises:
a sixth conductor extending in the second direction, being coupled to the third conductor and the fourth conductor, being overlapped by the third conductor and the fourth conductor, and being on a fourth metal layer different from the first metal layer, the second metal layer and the third metal layer.

6. The memory cell of claim 1, wherein the second word line is configured to supply a supply voltage as the second word line signal.

7. The memory cell of claim 1, wherein the first word line is configured to supply a reference supply voltage as the first word line signal.

8. The memory cell of claim 1, further comprising:
a first bit line extending in the first direction, being configured to receive a first bit line signal, being on the front-side of the substrate on the first metal layer, and being coupled to the first transistor; and
a second bit line extending in the first direction, being configured to receive a second bit line signal, being on the second metal layer, and being coupled to the third transistor.

9. The memory cell of claim 1, further comprising:
a bit line extending in the first direction, being configured to receive a bit line signal, being on the front-side of the substrate on the first metal layer, and being coupled to the first transistor; and
a bit line bar extending in the first direction, being configured to receive a bit line bar signal, being on the second metal layer, and being coupled to the third transistor.

10. A memory cell array comprising:
a first memory cell, the first memory cell comprising:
a first transistor stack on a substrate, the first transistor stack comprising:
a first transistor of a first type, and being on a first level; and a second transistor of a second type different from the first type, and the second transistor being on a second level different from the first level;

a second memory cell adjacent to the first memory cell, the second memory cell comprising:
  a second transistor stack on the substrate, the second transistor stack comprising:
    a third transistor of the first type, and being on the first level; and
    a fourth transistor of the second type, and being on the second level; and
  a first word line extending in a first direction, being configured to supply a first word line signal to one of the first transistor or the second transistor, the first word line being on a first metal layer or a second metal layer different from the first metal layer, the first word line being coupled to the one of the first transistor or the second transistor, the first metal layer being above a front-side of the substrate, and the second metal layer being below a back-side of the substrate opposite from the front-side of the substrate,
  wherein the one of the first transistor or the second transistor is a first pass-gate transistor, and another of the first transistor or the second transistor is a first dummy transistor.

11. The memory cell array of claim 10, further comprising:
  a second word line extending in the first direction, being configured to supply a second word line signal to one of the third transistor or the fourth transistor, the second word line being on the first metal layer or the second metal layer, and being coupled to the one of the third transistor or the fourth transistor.

12. The memory cell array of claim 11, wherein the one of the third transistor or the fourth transistor is a second pass-gate transistor, and another of the third transistor or the fourth transistor is a second dummy transistor.

13. The memory cell array of claim 11, wherein
  the first word line and the second word line are both on the first metal layer or the second metal layer; and
  the first word line signal is different from the second word line signal.

14. The memory cell array of claim 11, wherein
  the first word line and the second word line are both on the first metal layer or the second metal layer; and
  the first word line signal is the second word line signal.

15. The memory cell array of claim 11, wherein
  the first word line is on the first metal layer;
  the second word line is on the second metal layer; and
  the first word line signal is different from the second word line signal.

16. The memory cell array of claim 11, wherein
  the first word line is on the first metal layer;
  the second word line is on the second metal layer; and
  the first word line signal is the second word line signal.

17. The memory cell array of claim 11, further comprising:

a third memory cell adjacent to the second memory cell, the third memory cell comprising:
  a third transistor stack on the substrate, the third transistor stack comprising:
    a fifth transistor of the first type, and being on the first level; and
    a sixth transistor of the second type, and being on the second level; and
  a third word line extending in the first direction, being configured to supply a third word line signal to one of the fifth transistor or the sixth transistor, the third word line being on the first metal layer or the second metal layer, and being coupled to the one of the fifth transistor or the sixth transistor.

18. The memory cell array of claim 17, wherein the one of the fifth transistor or the sixth transistor is a second pass-gate transistor, and another of the fifth transistor or the sixth transistor is a third dummy transistor.

19. The memory cell array of claim 17, wherein
  the second memory cell is between the first memory cell and the third memory cell;
  the first memory cell and the third memory cell are configured to share the first word line with each other; and
  the first word line signal is the third word line signal.

20. A method of fabricating an integrated circuit, the method comprising:
  fabricating a first set of transistors and a second set of transistors in a front-side of a substrate, the first set of transistors being stacked above the second set of transistors;
  fabricating a first set of vias on the front-side of the substrate, the first set of vias being electrically coupled to at least the first set of transistors;
  depositing a first conductive material on the front-side of the substrate on a first metal level thereby forming a first set of conductors, the first set of conductors being electrically coupled to at least the first set of transistors by the first set of vias, the first set of transistors being configured to receive a first word line signal or a reference supply voltage from at least a first conductor of the first set of conductors from the front-side;
  performing thinning on a back-side of the substrate opposite from the front-side;
  fabricating a second set of vias on the back-side of the thinned substrate, the second set of vias being electrically coupled to at least the second set of transistors; and
  depositing a second conductive material on the back-side of the thinned substrate on a second metal level thereby forming a second set of conductors, the second set of conductors being electrically coupled to at least the second set of transistors by the second set of vias, the second set of transistors being configured to receive a second word line signal or a supply voltage from at least a first conductor of the second set of conductors from the back-side.

* * * * *